United States Patent
Sakuishi et al.

(10) Patent No.: US 11,669,181 B2
(45) Date of Patent: Jun. 6, 2023

(54) DISPLAY DEVICE AND ELECTRONIC DEVICE

(71) Applicant: Semiconductor Energy Laboratory Co., Ltd., Kanagawa-ken (JP)

(72) Inventors: Tatsuya Sakuishi, Kanagawa (JP); Tomoya Aoyama, Kanagawa (JP); Akihiro Chida, Kanagawa (JP); Daiki Nakamura, Kanagawa (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 17/546,330

(22) Filed: Dec. 9, 2021

(65) Prior Publication Data

US 2022/0100306 A1 Mar. 31, 2022

Related U.S. Application Data

(63) Continuation of application No. 16/700,037, filed on Dec. 2, 2019, now Pat. No. 11,199,920, which is a
(Continued)

(30) Foreign Application Priority Data

Apr. 25, 2014 (JP) .................................. 2014-091849
May 2, 2014 (JP) .................................. 2014-095018

(51) Int. Cl.
*G06F 3/041* (2006.01)
*G02F 1/1333* (2006.01)
(Continued)

(52) U.S. Cl.
CPC ........ *G06F 3/0412* (2013.01); *G02F 1/13338* (2013.01); *G02F 1/133305* (2013.01);
(Continued)

(58) Field of Classification Search
CPC ............. H01L 27/1225; H01L 27/1214; H01L 27/3244; H01L 27/3225; H01L 27/323;
(Continued)

(56) References Cited

U.S. PATENT DOCUMENTS 5,844,506 A 12/1998 Binstead
6,137,427 A 10/2000 Binstead
(Continued)

FOREIGN PATENT DOCUMENTS

CN 001575049 A 2/2005
CN 101539819 A 9/2009
(Continued)

OTHER PUBLICATIONS

Taiwanese Office Action (Application No. 109105030) dated Aug. 31, 2021.
(Continued)

*Primary Examiner* — Dismery Mercedes
(74) *Attorney, Agent, or Firm* — Husch Blackwell LLP

(57) ABSTRACT

A display device with high design flexibility is provided. The display device includes a display element, a touch sensor, and a transistor between two flexible substrates. An external electrode that supplies a signal to the display element and an external electrode that supplies a signal to the touch sensor are connected from the same surface of one of the substrates.

14 Claims, 49 Drawing Sheets

Related U.S. Application Data continuation of application No. 15/711,120, filed on Sep. 21, 2017, now Pat. No. 10,496,203, which is a continuation of application No. 14/692,121, filed on Apr. 21, 2015, now Pat. No. 9,772,706.

(51) Int. Cl.

| | | |
|---|---|---|
| *H01L 27/32* | (2006.01) | |
| *H01L 27/12* | (2006.01) | |
| *H01L 51/00* | (2006.01) | |
| *H01L 33/62* | (2010.01) | |
| *G06F 3/044* | (2006.01) | |
| *G02F 1/1362* | (2006.01) | |
| *G02F 1/1345* | (2006.01) | |

(52) U.S. Cl.
CPC ........ *G06F 3/0445* (2019.05); *H01L 27/1214* (2013.01); *H01L 27/323* (2013.01); *H01L 27/3276* (2013.01); *H01L 33/62* (2013.01); *H01L 51/0097* (2013.01); *G02F 1/13458* (2013.01); *G02F 1/13629* (2021.01); *G06F 2203/04103* (2013.01); *H01L 2221/101* (2013.01); *H01L 2224/83851* (2013.01); *H01L 2227/326* (2013.01); *H01L 2251/5338* (2013.01)

(58) Field of Classification Search
CPC .............. H01L 27/3262; H01L 27/3276; H01L 27/3248; H01L 27/3251; H01L 2251/5338; H01L 51/0097; H01L 51/5253; H01L 41/047; H01L 23/5385; H01L 23/5387; H01L 23/538; H01L 23/5226; H01L 23/522; G02F 1/13338; G02F 1/133305; G02F 1/136286; G02F 1/13452; G02F 1/13458; G02F 1/133345; G02F 1/1333; H05K 2201/10128; G06F 3/0412; G06F 2203/04103; G06F 2203/04107
See application file for complete search history.

(56) References Cited

U.S. PATENT DOCUMENTS

| | | | |
|---|---|---|---|
| 6,242,758 B1 | 6/2001 | Yamazaki et al. | |
| 6,465,280 B1 | 10/2002 | Martin et al. | |
| RE38,466 E | 3/2004 | Inoue et al. | |
| 6,764,879 B2 | 7/2004 | Nagao et al. | |
| 7,129,523 B2 | 10/2006 | Yamazaki et al. | |
| 7,342,354 B2 | 3/2008 | Utsunomiya et al. | |
| RE40,867 E | 8/2009 | Binstead | |
| 8,164,099 B2 | 4/2012 | Yamazaki et al. | |
| 8,222,666 B2 | 7/2012 | Hatano et al. | |
| 8,284,369 B2 | 10/2012 | Chida et al. | |
| 8,367,440 B2 | 2/2013 | Takayama et al. | |
| 8,368,067 B2 | 2/2013 | Uchiyama et al. | |
| 8,415,208 B2 | 4/2013 | Takayama et al. | |
| 8,450,769 B2 | 5/2013 | Hatano et al. | |
| 8,570,300 B2 | 10/2013 | Ikeda et al. | |
| 8,624,849 B2 | 1/2014 | Chang et al. | |
| 8,629,842 B2 | 1/2014 | Jang | |
| 8,664,662 B2 | 3/2014 | Ono et al. | |
| 8,730,186 B2 | 5/2014 | Tamura et al. | |
| 8,830,195 B2 | 9/2014 | Eom et al. | |
| 8,928,597 B2 | 1/2015 | Jang | |
| 8,956,891 B2 | 2/2015 | Chida | |
| 9,041,869 B2 | 5/2015 | Kim et al. | |
| 9,082,678 B2 | 7/2015 | Yamazaki et al. | |
| 9,130,181 B2 | 9/2015 | Choi et al. | |
| 9,196,662 B2 | 11/2015 | Choi et al. | |
| 9,196,813 B2 | 11/2015 | Chida | |
| 9,202,987 B2 | 12/2015 | Takayama et al. | |
| 9,226,347 B2* | 12/2015 | Weber | H01L 27/3276 |
| 9,262,030 B2 | 2/2016 | Aoki et al. | |
| 9,268,358 B2 | 2/2016 | Kim et al. | |
| 9,316,857 B2 | 4/2016 | Yamazaki et al. | |
| 9,342,176 B2 | 5/2016 | Kim et al. | |
| 9,406,725 B2 | 8/2016 | Yamazaki et al. | |
| 9,431,618 B2 | 8/2016 | Kawata et al. | |
| 9,495,031 B2 | 11/2016 | Omoto | |
| 9,501,165 B2 | 11/2016 | Kim et al. | |
| 9,502,434 B2 | 11/2016 | Tanaka et al. | |
| 9,519,370 B2* | 12/2016 | Nam | G06F 3/0412 |
| 9,576,982 B2 | 2/2017 | Yamazaki et al. | |
| 9,608,004 B2 | 3/2017 | Takayama et al. | |
| 9,743,518 B2 | 8/2017 | Eom et al. | |
| 9,772,706 B2 | 9/2017 | Sakuishi et al. | |
| 9,772,709 B2 | 9/2017 | Kim et al. | |
| 9,791,991 B2 | 10/2017 | Miyazaki et al. | |
| 9,812,517 B2 | 11/2017 | Ito et al. | |
| 9,893,126 B2 | 2/2018 | Jang | |
| 9,960,213 B2 | 5/2018 | Senda et al. | |
| 10,008,630 B2 | 6/2018 | Yamazaki et al. | |
| 10,032,833 B2 | 7/2018 | Yamazaki et al. | |
| 10,043,835 B2 | 8/2018 | Saeki | |
| 10,204,535 B2 | 2/2019 | Yamazaki | |
| 10,317,716 B2 | 6/2019 | Rho | |
| 10,516,007 B2 | 12/2019 | Yamazaki et al. | |
| 10,586,816 B2 | 3/2020 | Takayama et al. | |
| 10,818,737 B2 | 10/2020 | Yamazaki et al. | |
| 10,936,132 B2 | 3/2021 | Jang | |
| 2001/0040645 A1 | 11/2001 | Yamazaki | |
| 2001/0043046 A1 | 11/2001 | Fukunaga | |
| 2002/0063525 A1 | 5/2002 | Choi et al. | |
| 2003/0034497 A1* | 2/2003 | Yamazaki | H01L 51/529 257/86 |
| 2003/0129790 A1 | 7/2003 | Yamazaki et al. | |
| 2004/0245924 A1 | 12/2004 | Utsunomiya et al. | |
| 2005/0110023 A1 | 5/2005 | Lee et al. | |
| 2008/0224599 A1 | 9/2008 | Kim | |
| 2009/0108728 A1 | 4/2009 | Ushimaru et al. | |
| 2009/0114915 A1 | 5/2009 | Toriumi | |
| 2009/0237365 A1 | 9/2009 | Choi et al. | |
| 2009/0239320 A1 | 9/2009 | Takayama et al. | |
| 2010/0008068 A1 | 1/2010 | Kim et al. | |
| 2010/0045919 A1* | 2/2010 | Chida | H01L 27/124 438/30 |
| 2010/0096633 A1 | 4/2010 | Hatano et al. | |
| 2010/0110041 A1 | 5/2010 | Jang | |
| 2010/0148209 A1* | 6/2010 | Hatano | H01L 27/3262 257/E33.053 |
| 2010/0149128 A1 | 6/2010 | No et al. | |
| 2010/0300862 A1 | 12/2010 | Tamura et al. | |
| 2011/0279763 A1 | 11/2011 | Cho et al. | |
| 2012/0044171 A1 | 2/2012 | Lee et al. | |
| 2012/0075237 A1 | 3/2012 | Ikeda et al. | |
| 2012/0153293 A1 | 6/2012 | Koyama et al. | |
| 2012/0206680 A1 | 8/2012 | Onishi | |
| 2012/0249401 A1 | 10/2012 | Omoto | |
| 2012/0320290 A1 | 12/2012 | Hida et al. | |
| 2013/0057501 A1* | 3/2013 | Nagata | G06F 3/0443 345/173 |
| 2013/0157422 A1 | 6/2013 | Yamazaki | |
| 2013/0194550 A1 | 8/2013 | Tanigawa et al. | |
| 2013/0214324 A1 | 8/2013 | Takayama et al. | |
| 2013/0240855 A1 | 9/2013 | Chida et al. | |
| 2014/0043546 A1* | 2/2014 | Yamazaki | G02F 1/13338 349/12 |
| 2014/0062916 A1 | 3/2014 | Hong et al. | |
| 2014/0063364 A1 | 3/2014 | Hirakata | |
| 2014/0070350 A1* | 3/2014 | Kim | H01L 31/0232 438/70 |
| 2014/0071360 A1 | 3/2014 | Chang et al. | |
| 2014/0184057 A1* | 7/2014 | Kim | H05B 33/145 313/504 |
| 2014/0240637 A1 | 8/2014 | Onishi | |
| 2014/0264425 A1 | 9/2014 | Chida | |
| 2014/0273317 A1 | 9/2014 | Chida | |
| 2015/0069362 A1 | 3/2015 | Ito | |

(56) References Cited

U.S. PATENT DOCUMENTS

| | | | |
|---|---|---|---|
| 2015/0097810 A1* | 4/2015 | Aoki | G02F 1/13338 345/174 |
| 2015/0185942 A1* | 7/2015 | Kim | H01L 27/323 345/173 |
| 2015/0250038 A1 | 9/2015 | Sakuishi et al. | |
| 2015/0263314 A1 | 9/2015 | Sakuishi et al. | |
| 2017/0162608 A1 | 6/2017 | Yamazaki et al. | |
| 2017/0364726 A1* | 12/2017 | Buchan | G06V 40/1306 |
| 2018/0166508 A1 | 6/2018 | Jang | |
| 2020/0083300 A1 | 3/2020 | Yamazaki et al. | |
| 2020/0312920 A1 | 10/2020 | Yamazaki et al. | |
| 2021/0202542 A1 | 7/2021 | Yamazaki et al. | |

FOREIGN PATENT DOCUMENTS

| | | |
|---|---|---|
| CN | 101626017 A | 1/2010 |
| CN | 102419486 A | 4/2012 |
| CN | 102738198 A | 10/2012 |
| CN | 102881710 A | 1/2013 |
| CN | 103383991 A | 11/2013 |
| CN | 203433234 U | 2/2014 |
| CN | 103681737 A | 3/2014 |
| EP | 1 298 803 A2 | 4/2003 |
| EP | 1 480 272 A2 | 11/2004 |
| EP | 2 103 987 A1 | 9/2009 |
| EP | 2 144 146 A1 | 1/2010 |
| EP | 2 148 264 A2 | 1/2010 |
| EP | 2 521 117 A | 11/2012 |
| EP | 2 547 180 A2 | 1/2013 |
| EP | 2 575 018 A1 | 4/2013 |
| EP | 2 704 196 A1 | 3/2014 |
| JP | 08-332649 A | 12/1996 |
| JP | 09-511086 | 11/1997 |
| JP | 2000-150143 A | 5/2000 |
| JP | 2002-040468 A | 2/2002 |
| JP | 2003-124274 A | 4/2003 |
| JP | 2003-174153 A | 6/2003 |
| JP | 2003-196023 A | 7/2003 |
| JP | 2004-349152 A | 12/2004 |
| JP | 2009-109770 A | 5/2009 |
| JP | 2009-123106 A | 6/2009 |
| JP | 2010-073683 A | 4/2010 |
| JP | 2010-140919 A | 6/2010 |
| JP | 2011-128481 A | 6/2011 |
| JP | 2012-068981 A | 4/2012 |
| JP | 2012-156140 A | 8/2012 |
| JP | 2012-208263 A | 10/2012 |
| JP | 2013-140635 A | 7/2013 |
| JP | 2013-251255 A | 12/2013 |
| JP | 2014-032960 A | 2/2014 |
| JP | 2014-056564 A | 3/2014 |
| JP | 2014-059553 A | 4/2014 |
| KR | 10-0627097 B1 | 9/2006 |
| KR | 2009-0100639 A | 9/2009 |
| KR | 2010-0010019 A | 1/2010 |
| KR | 10-0939929 B1 | 2/2010 |
| KR | 2010-0022938 A | 3/2010 |
| KR | 2013-0124201 A | 11/2013 |
| KR | 2014-0009024 A | 1/2014 |
| KR | 2014-0031110 A | 3/2014 |
| KR | 2014-0034979 A | 3/2014 |
| TW | 200427362 | 12/2004 |
| TW | 200941311 | 10/2009 |
| TW | 201214231 | 4/2012 |
| TW | 201329593 | 7/2013 |
| TW | 201351631 | 12/2013 |
| WO | WO 1995/027334 A1 | 10/1995 |
| WO | WO 2011/104934 A1 | 9/2011 |
| WO | WO 2013/046280 A1 | 4/2013 |

OTHER PUBLICATIONS

Chinese Office Action (Application No. 201911133781.0) dated Feb. 15, 2023.

\* cited by examiner

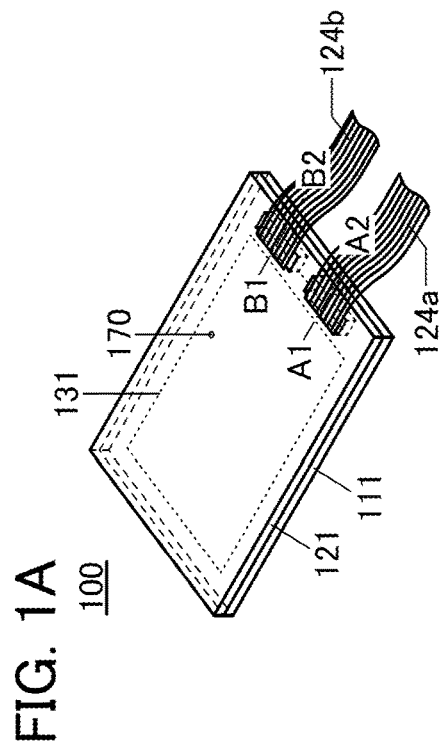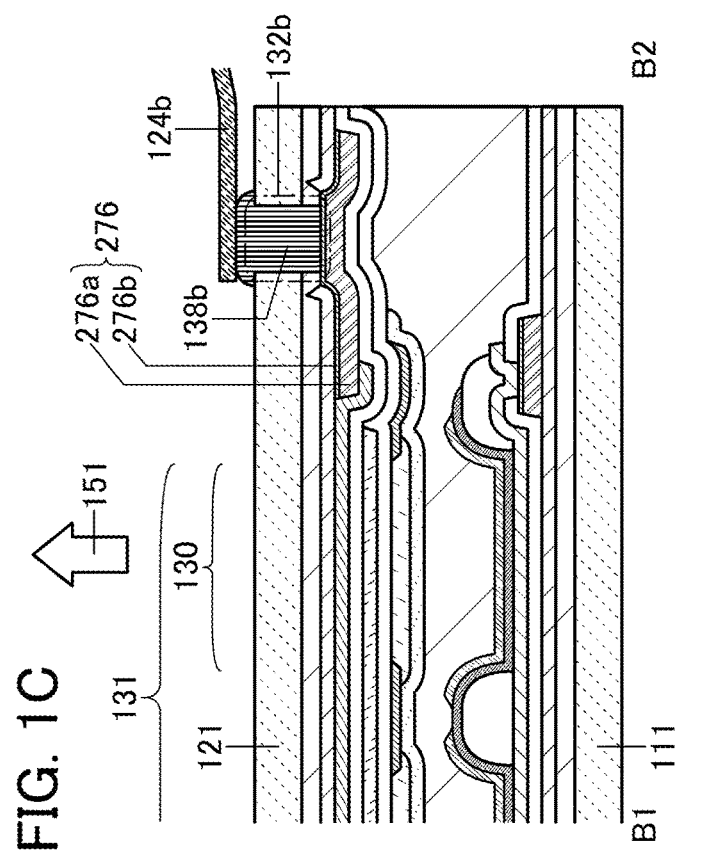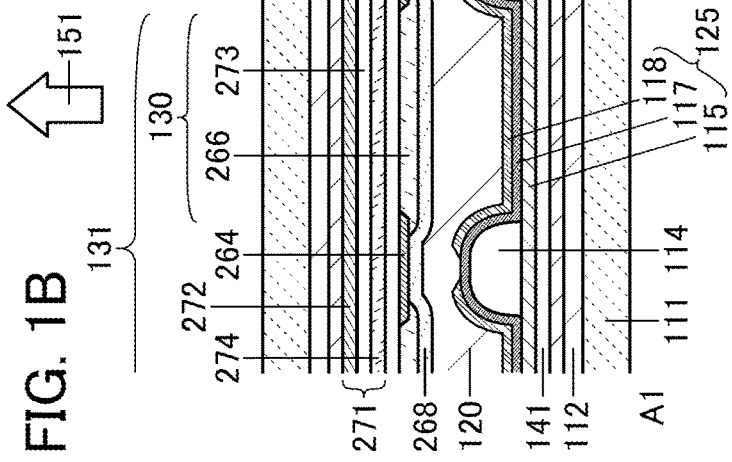

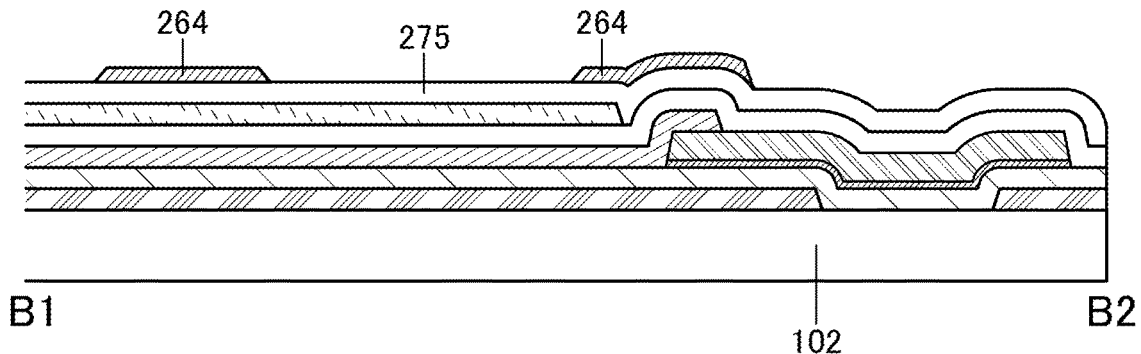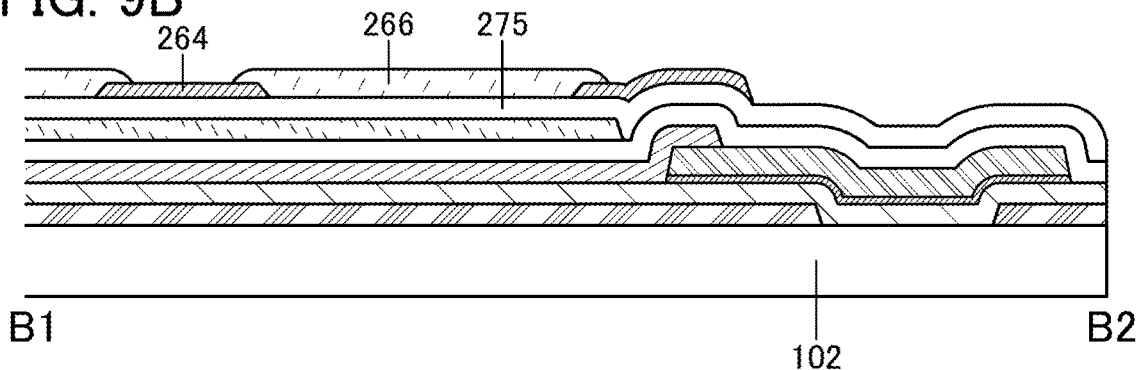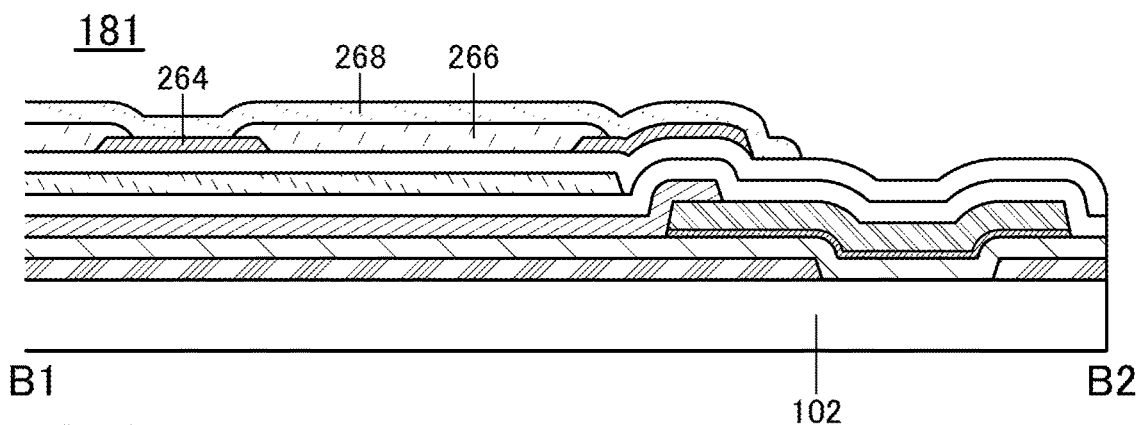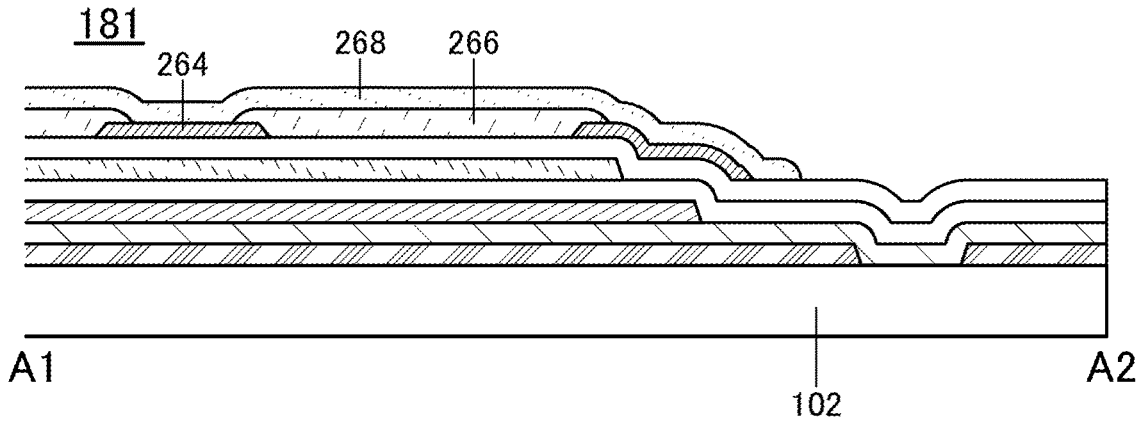

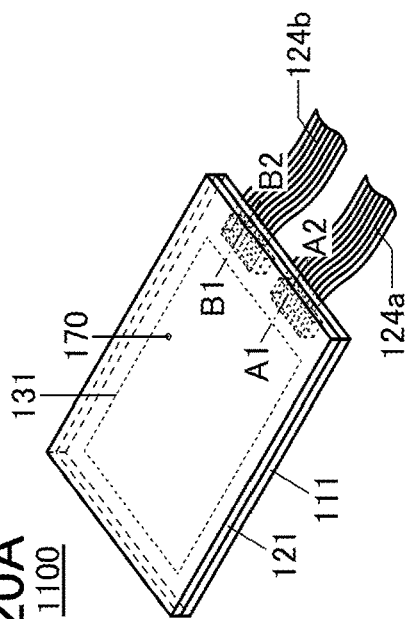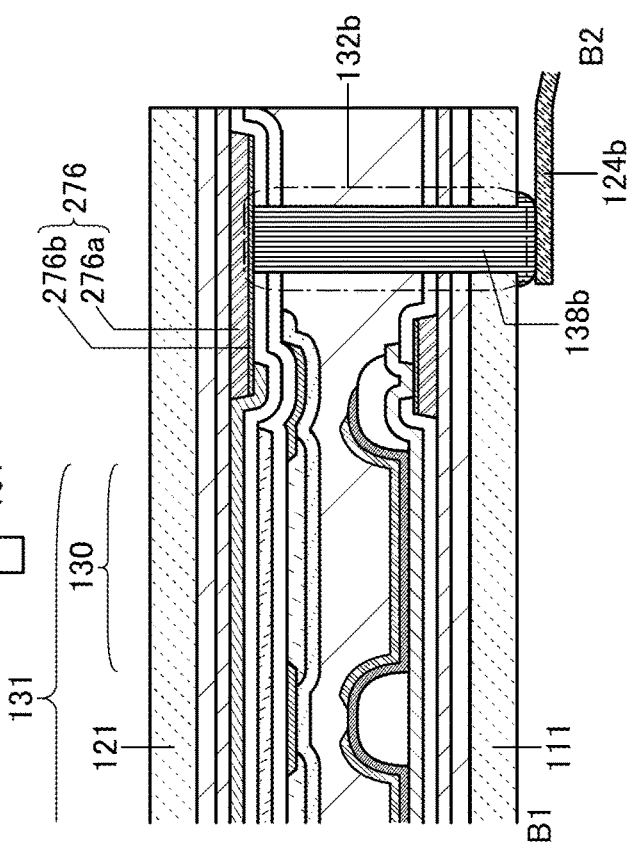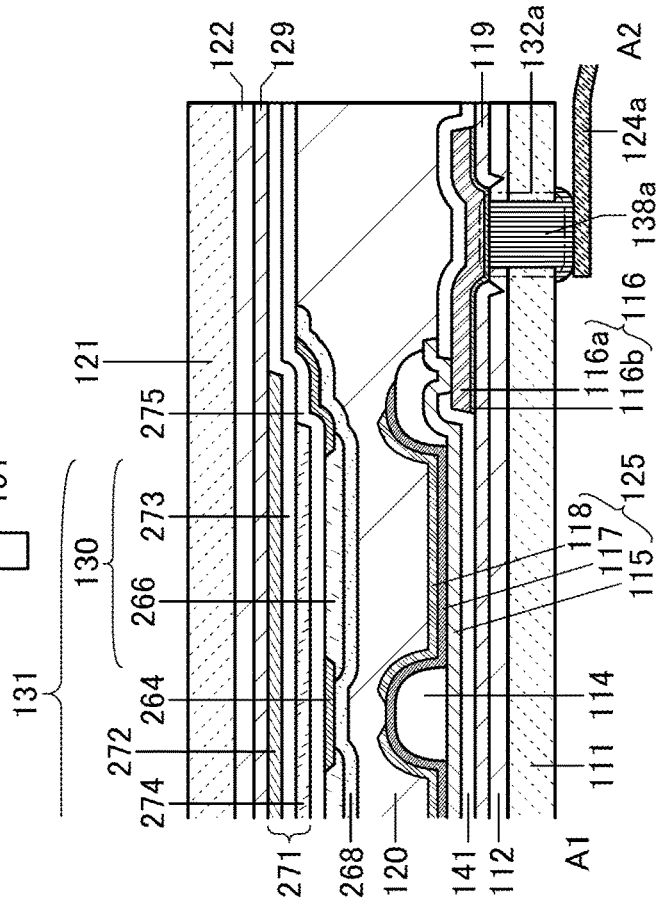

FIG. 38A1
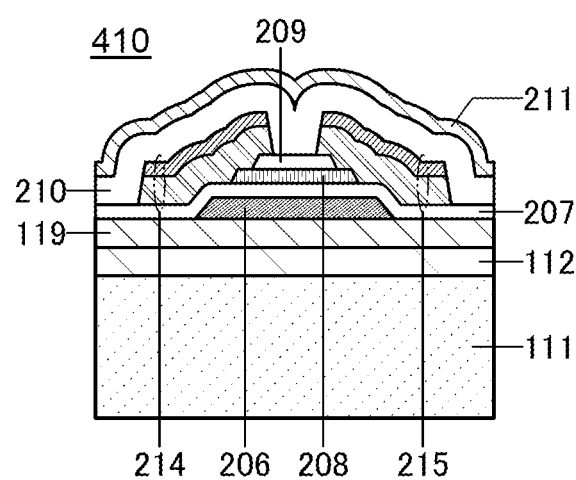
FIG. 38A2
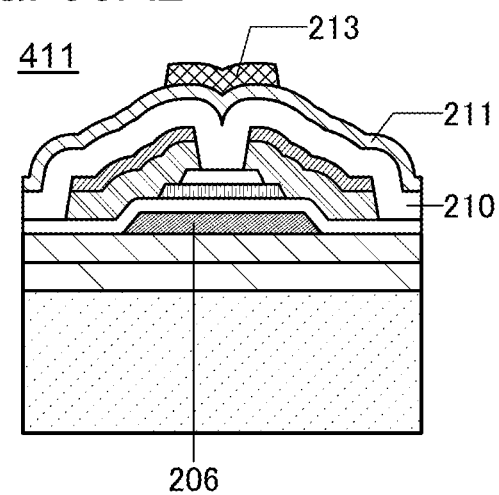
FIG. 38B1
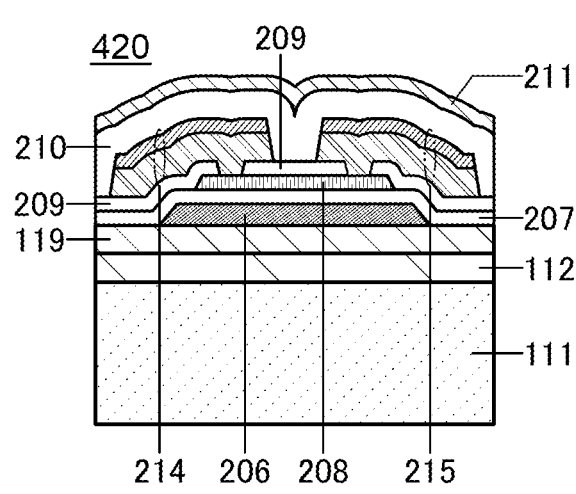
FIG. 38B2
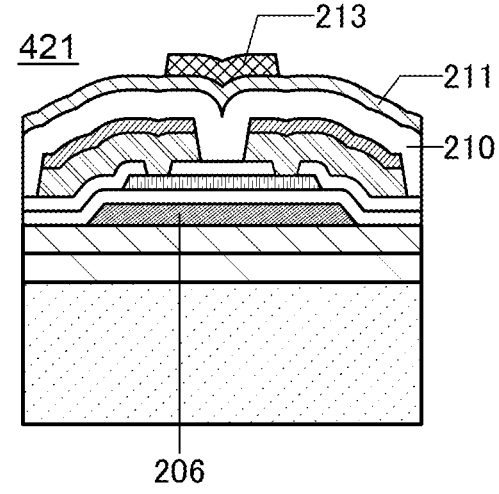

FIG. 39A1
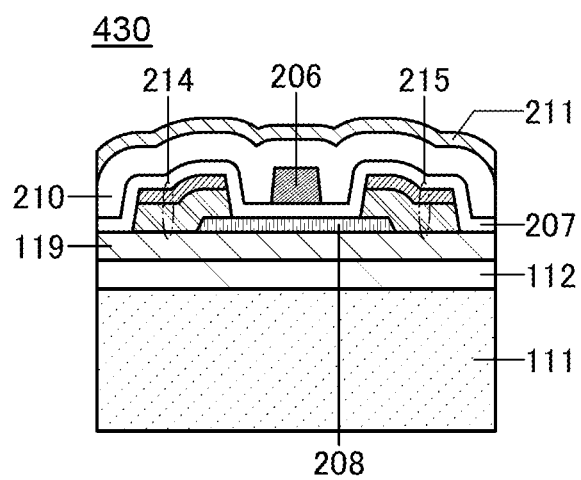
FIG. 39A2
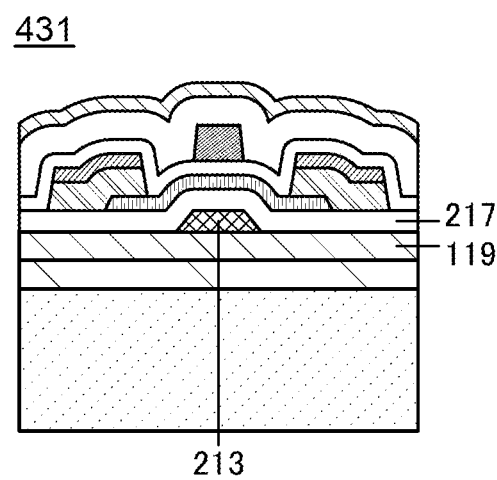
FIG. 39A3
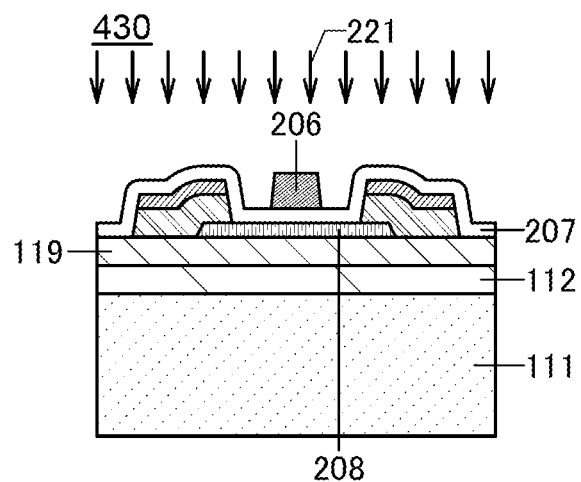
FIG. 39B1
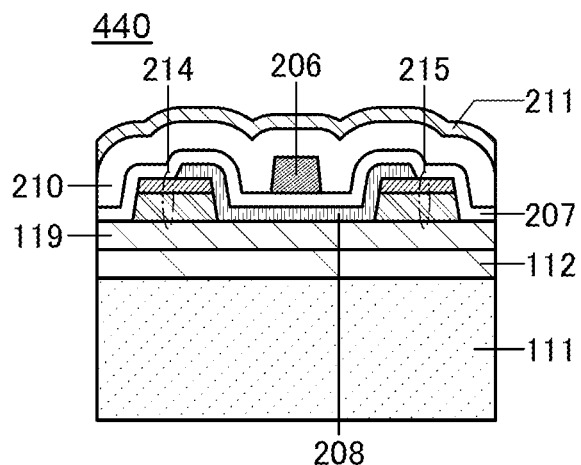
FIG. 39B2
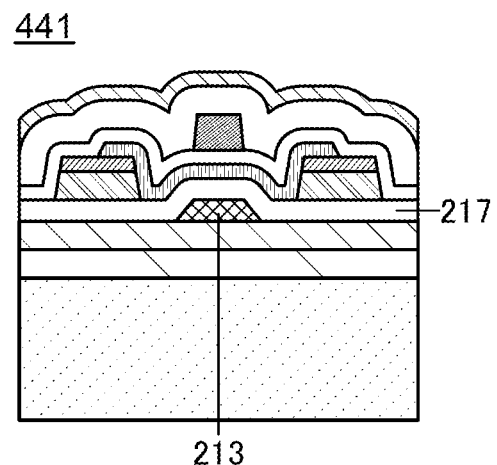

FIG. 40C
450
FIG. 40A
450
FIG. 40B
450
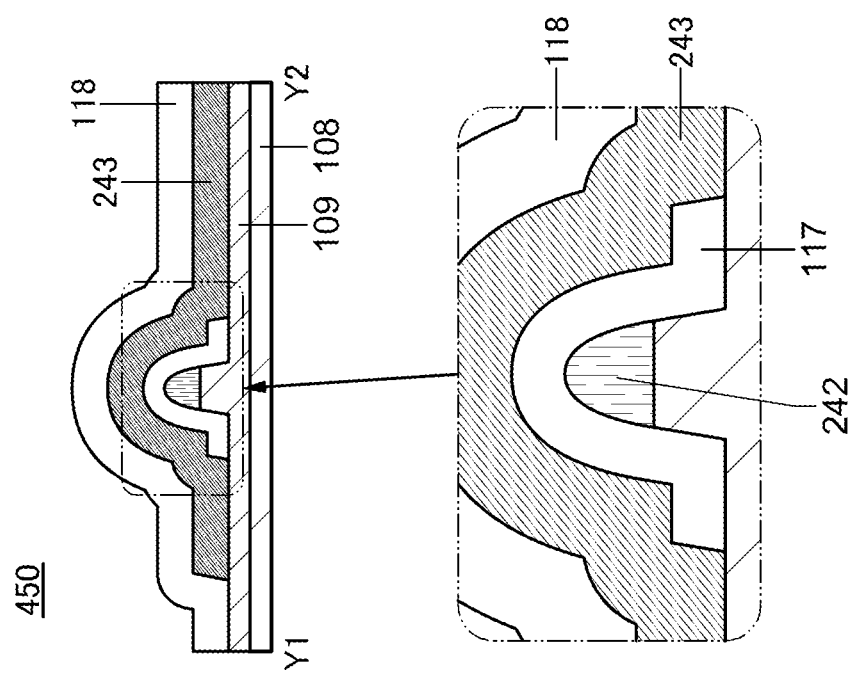
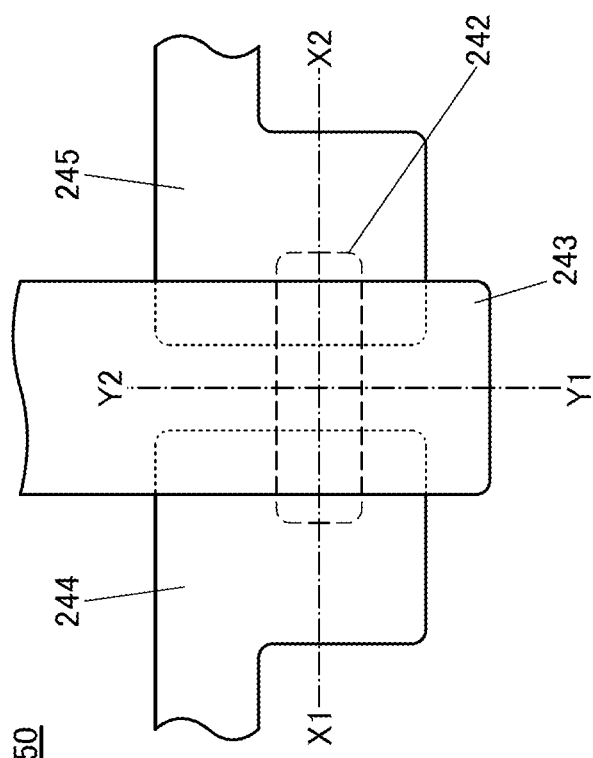
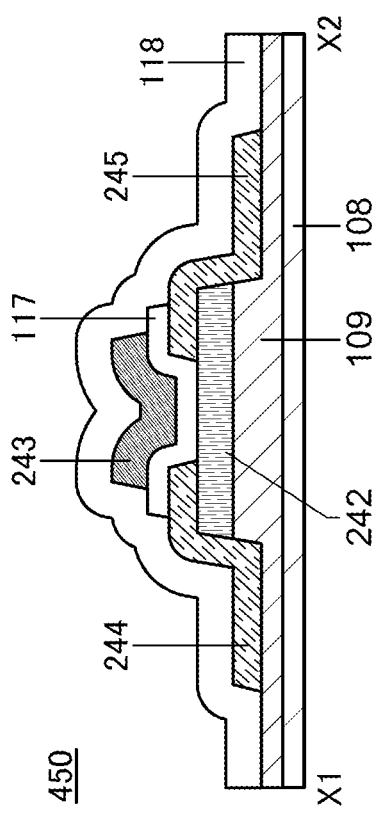

FIG. 42A
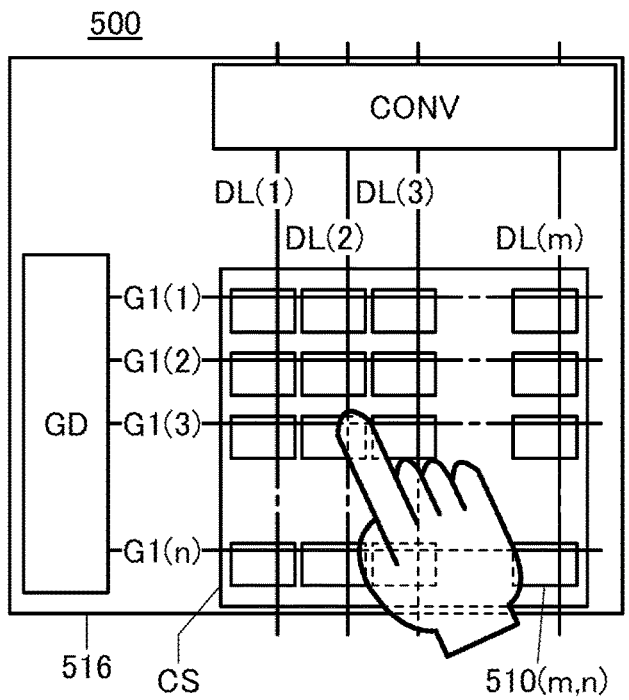
FIG. 42B
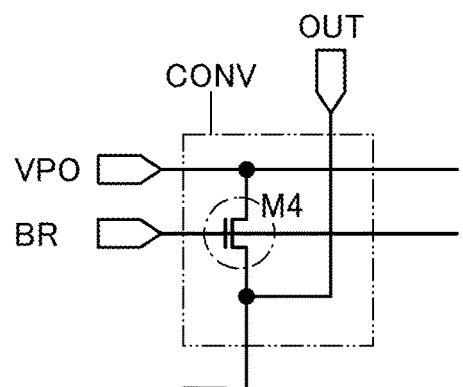
FIG. 42C
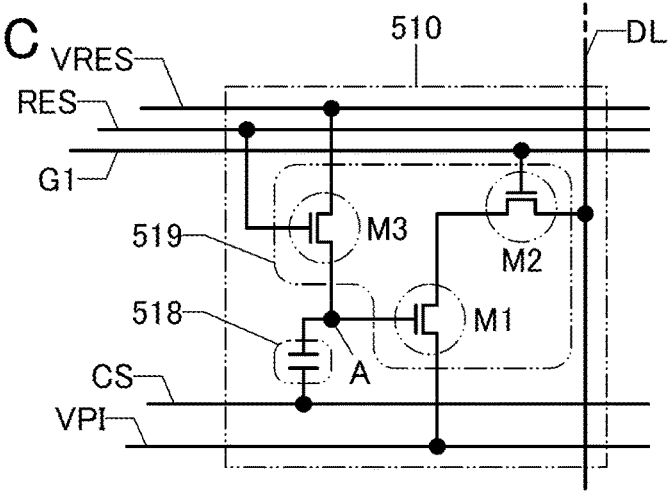
FIG. 42D1
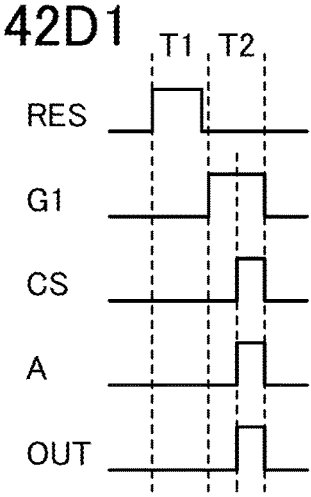
FIG. 42D2
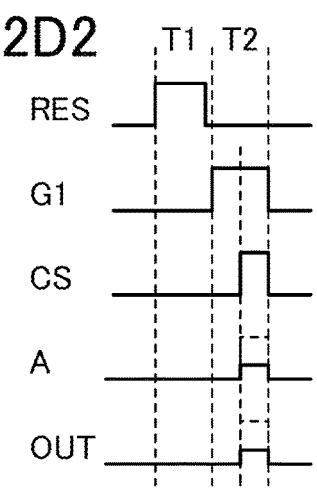

DISPLAY DEVICE AND ELECTRONIC DEVICE

This application is a continuation of copending U.S. application Ser. No. 16/700,037, filed on Dec. 2, 2019 which is a continuation of U.S. application Ser. No. 15/711,120, filed on Sep. 21, 2017 (U.S. Pat. No. 10,496,203 issued Dec. 3, 2019) which is a continuation of U.S. application Ser. No. 14/692,121, filed on Apr. 21, 2015 (U.S. Pat. No. 9,772,706 issued Sep. 26, 2017) which are all incorporated herein by reference.

BACKGROUND OF THE INVENTION

1. Field of the Invention

One embodiment of the present invention relates to a display device. One embodiment of the present invention also relates to a method of manufacturing the display device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. One embodiment of the present invention relates to a memory device, a processor, a driving method thereof, or a manufacturing method thereof.

Note that in this specification and the like, a semiconductor device generally means a device that can function by utilizing semiconductor characteristics. Thus, a semiconductor element such as a transistor or a diode and a semiconductor circuit are semiconductor devices. A display device, a light-emitting device, a lighting device, an electro-optical device, an electronic device, and the like may include a semiconductor element or a semiconductor circuit. Therefore, a display device, a light-emitting device, a lighting device, an electro-optical device, an electronic device, and the like include a semiconductor device in some cases.

2. Description of the Related Art

In recent years, research and development have been extensively conducted on liquid crystal elements as a display element used in a display region of a display device. In addition, research and development have been extensively conducted on light-emitting elements utilizing electroluminescence (EL). As a basic structure of these light-emitting elements, a layer containing a light-emitting substance is provided between a pair of electrodes. Voltage is applied to this light-emitting element to obtain light emission from the light-emitting substance.

Light-emitting elements are a self-luminous element; thus, a display device using the light-emitting elements has, in particular, advantages such as high visibility, no necessity of a backlight, and low power consumption. The display device using the light-emitting elements also has advantages in that it can be manufactured to be thin and lightweight and has high response speed.

A display device including the display elements can have flexibility; therefore, the use of a flexible substrate for the display device has been proposed.

As a method of manufacturing a display device using a flexible substrate, a technique has been developed in which a semiconductor element such as a thin film transistor is manufactured over a substrate such as a glass substrate or a quartz substrate, for example, the semiconductor element is fixed to another substrate (e.g., a flexible substrate) by using an organic resin, and then the semiconductor element is transferred from the glass substrate or the quartz substrate to the other substrate (Patent Document 1).

In some cases, over a light-emitting element that has been formed over a flexible substrate, another flexible substrate is provided in order to protect a surface of the light-emitting element or prevent entry of moisture or impurities from the outside.

Display devices are expected to be applied to a variety of uses and become diversified. For example, a smartphone and a tablet terminal with a touch panel are being developed as portable information terminals.

REFERENCE

Patent Document

[Patent Document 1] Japanese Published Patent Application No. 2003-174153

SUMMARY OF THE INVENTION

In order to supply a signal or electric power to a display device using a flexible substrate, it is necessary that part of the flexible substrate be removed by a laser beam or an edged tool to expose an electrode so that an external electrode such as a flexible printed circuit (FPC) is connected to the electrode.

However, a method in which part of a flexible substrate is removed by a laser beam or with an edged tool has a problem in that an electrode included in a display device is damaged easily and the reliability and manufacturing yield of the display device are reduced easily. In addition, a display region and an electrode need to be provided with a sufficient space therebetween in order to prevent damage to the display region due to the above-described method; for this reason, signal attenuation, electric power attenuation, or the like due to an increase in wiring resistance is caused easily.

An object of one embodiment of the present invention is to provide a method of manufacturing a display device, which does not easily damage an electrode. Another object of one embodiment of the present invention is to provide a method of manufacturing a display device, which does not easily damage a display region. Another object of one embodiment of the present invention is to provide a highly reliable display device and a method of manufacturing the display device. Another object of one embodiment of the present invention is to provide a display device with high design flexibility and a method of manufacturing the display device.

Another object of one embodiment of the present invention is to provide a display device, electronic device, or the like having high visibility. Another object of one embodiment of the present invention is to provide a display device, electronic device, or the like having high display quality. Another object of one embodiment of the present invention is to provide a display device, electronic device, or the like having high reliability. Another object of one embodiment of the present invention is to provide a display device, electronic device, or the like that is unlikely to be broken. Another object of one embodiment of the present invention is to provide a display device, electronic device, or the like with low power consumption. Another object of one embodiment of the present invention is to provide a display device, electronic device, or the like with high productivity.

Another object of one embodiment of the present invention is to provide a novel display device, electronic device, or the like.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a display device including a display element and a touch sensor between two flexible substrates. In the display device, an external electrode that supplies a signal to the display element and an external electrode that supplies a signal to the touch sensor are connected from the same surface of one of the substrates.

One embodiment of the present invention is a display device including a first substrate, a second substrate, a display element, a touch sensor, a first electrode, and a second electrode. The first substrate and the second substrate overlap with each other with the display element, the touch sensor, the first electrode, and the second electrode positioned therebetween. The first electrode supplies a signal to the display element. The second electrode supplies a signal to the touch sensor. The first electrode and the second electrode are electrically connected to an external electrode through an opening in the second substrate.

An FPC can be used as the external electrode, for example. The external electrode includes a plurality of electrodes. The first electrode can be electrically connected to some electrodes included in the external electrode. The second electrode can be electrically connected to other electrodes included in the external electrode. When the same potential or signal is supplied to the first electrode and the second electrode, the first electrode and the second electrode can be electrically connected to an electrode included in the external electrode.

Another embodiment of the present invention is a display device including a first substrate, a second substrate, a display element, a touch sensor, a first electrode, and a second electrode. The first substrate and the second substrate overlap with each other with the display element, the touch sensor, the first electrode, and the second electrode positioned therebetween. The first electrode supplies a signal to the display element. The second electrode supplies a signal to the touch sensor. The first electrode is electrically connected to a first external electrode through a first opening in the second substrate. The second electrode is electrically connected to a second external electrode through a second opening in the second substrate.

Another embodiment of the present invention is a display device including a first substrate, a second substrate, a display element, a touch sensor, a transistor, a first electrode, and a second electrode. The first substrate and the second substrate overlap with each other with the display element, the touch sensor, the transistor, the first electrode, and the second electrode positioned therebetween. The first electrode supplies a signal to the transistor. The transistor supplies a signal to the display element. The second electrode supplies a signal to the touch sensor. The first electrode and the second electrode are electrically connected to an external electrode through an opening in the second substrate.

Another embodiment of the present invention is a display device including a first substrate, a second substrate, a display element, a touch sensor, a transistor, a first electrode, and a second electrode. The first substrate and the second substrate overlap with each other with the display element, the touch sensor, the first electrode, and the second electrode positioned therebetween. The first electrode supplies a signal to the transistor. The transistor supplies a signal to the display element. The second electrode supplies a signal to the touch sensor. The first electrode is electrically connected to a first external electrode through a first opening in the second substrate. The second electrode is electrically connected to a second external electrode through a second opening in the second substrate.

One embodiment of the present invention can provide a method of manufacturing a display device that does not easily damage an electrode. Another embodiment of the present invention can provide a method of manufacturing a display device that does not easily damage a display region. Another embodiment of the present invention can provide a highly reliable display device and a manufacturing method thereof. Another embodiment of the present invention can provide a display device with high design flexibility and a manufacturing method thereof.

One embodiment of the present invention provides a display device, electronic device, or the like having high visibility. One embodiment of the present invention provides a display device, electronic device, or the like having high display quality. One embodiment of the present invention provides a display device, electronic device, or the like having high reliability. One embodiment of the present invention provides a display device, electronic device, or the like that is unlikely to be broken. One embodiment of the present invention provides a display device, electronic device, or the like with low power consumption. One embodiment of the present invention provides a display device, electronic device, or the like with high productivity. One embodiment of the present invention provides a novel display device, electronic device, or the like.

Note that the description of these effects does not disturb the existence of other effects. One embodiment of the present invention does not necessarily have all of these effects. Other effects will be apparent from and can be derived from the description of the specification, the drawings, the claims, and the like.

BRIEF DESCRIPTION OF THE DRAWINGS

FIGS. 1A to 1C are a perspective view and cross-sectional views illustrating one embodiment of the present invention.

FIGS. 9A to 9D illustrate a manufacturing process of one embodiment of the present invention.

FIGS. 20A to 20C are a perspective view and cross-sectional views illustrating one embodiment of the present invention.

FIGS. 38A1, 38A2, 38B1, and 38B2 are cross-sectional views each illustrating one embodiment of a transistor.

FIGS. 39A1, 39A2, 39A3, 39B1, and 39B2 are cross-sectional views each illustrating one embodiment of a transistor.

FIGS. 40A to 40C are a top view and cross-sectional views illustrating one embodiment of a transistor.

FIGS. 42A, 42B, 42C, 42D1, and 42D2 illustrate a structure example and an example of a driving method of a touch sensor.

DETAILED DESCRIPTION OF THE INVENTION

Figure 2A:
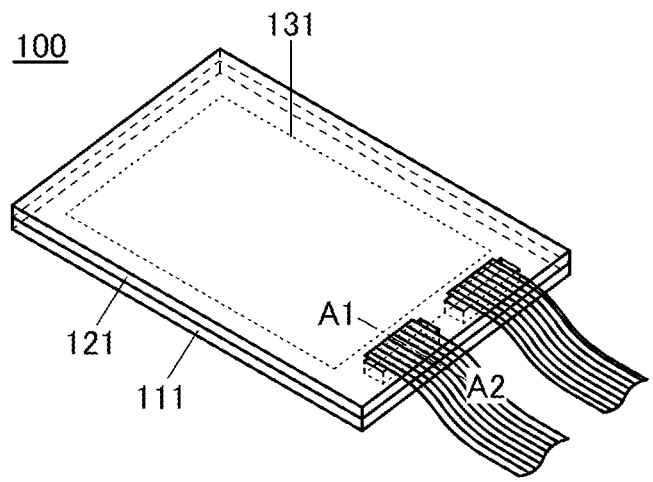
FIGS. 2A and 2B are a perspective view and a cross-sectional view illustrating one embodiment of the present invention.

Embodiments will be described in detail with reference to the accompanying drawings. Note that the present invention is not limited to the description below, and it is understood easily by those skilled in the art that various changes and modifications can be made without departing from the spirit and scope of the present invention. Therefore, the present invention should not be construed as being limited to the description in the following embodiments. In the structures of the present invention to be described below, the same portions or portions having similar functions are denoted by the same reference numerals in different drawings, and explanation thereof will not be repeated.

The position, size, range, and the like of each component illustrated in the drawings and the like are not accurately represented in some cases to facilitate understanding of the invention. Therefore, the disclosed invention is not necessarily limited to the position, the size, range, and the like disclosed in the drawings and the like. For example, in the actual manufacturing process, a resist mask or the like might be unintentionally reduced in size by treatment such as etching, which might not be illustrated for easy understanding.

Especially in a top view (also referred to as a plan view), a perspective view, or the like, some components might not be illustrated for easy understanding.

In this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, it is difficult to define which is a source or a drain. Accordingly, the terms "source" and "drain" can be switched in this specification.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "electrically connected" is used in this specification, there is a case in which no physical connection is made and a wiring is just extended in an actual circuit.

In this specification, a term "parallel" indicates that the angle formed between two straight lines is greater than or equal to −10° and less than or equal to 10°, and accordingly also includes the case where the angle is greater than or equal to −5° and less than or equal to 5°. A term "perpendicular" indicates that the angle formed between two straight lines is greater than or equal to 80° and less than or equal to 100°, and accordingly also includes the case where the angle is greater than or equal to 85° and less than or equal to 95°.

In this specification, in the case where an etching step is performed after a lithography process, a resist mask formed in the lithography process is removed after the etching step, unless otherwise specified.

A voltage usually refers to a potential difference between a given potential and a reference potential (e.g., a source potential or a ground potential (a GND potential)). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. Moreover, a term with an ordinal number in this specification and the like might not be provided with any ordinal number in a claim.

Note that in this specification, the channel length refers to, for example, a distance, observed in a top view of a transistor, between a source (a source region or a source electrode) and a drain (a drain region or a drain electrode) in a region where a semiconductor (or a portion where a current flows in a semiconductor when the transistor is on) and a gate electrode overlap with each other or a region where a channel is formed. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a gate electrode covering a side surface of a semiconductor, an effective channel width is greater than an apparent channel width, and its influence cannot be ignored in some cases. For example, in a miniaturized transistor having a gate electrode covering a side surface of a semiconductor, the proportion of a channel region formed in a side surface of a semiconductor is higher than the proportion of a channel region formed in a top surface of a semiconductor in some cases. In that case, an effective channel width is greater than an apparent channel width.

In such a case, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, an apparent channel width is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that a channel length, a channel width, an effective channel width, an apparent channel width, a surrounded channel width, and the like can be determined by analyzing a cross-sectional TEM image and the like.

Note that in the case where electric field mobility, a current value per channel width, and the like of a transistor are calculated, a surrounded channel width might be used for the calculation. In that case, a value might be different from one calculated by using an effective channel width.

Embodiment 1

A structure and a manufacturing method of a display device 100 of one embodiment of the present invention are described with reference to FIGS. 1A to 1C, FIGS. 2A and 2B, FIGS. 3A and 3B, FIGS. 4A to 4E, FIGS. 5A to 5C, FIGS. 6A and 6B, FIGS. 7A to 7D, FIGS. 8A to 8D, FIGS. 9A to 9D, FIGS. 10A to 10C, FIGS. 11A and 11B, FIGS. 12A and 12B, FIGS. 13A and 13B, FIGS. 14A and 14B, FIGS. 15A and 15B, FIGS. 16A and 16B, FIGS. 17A and 17B, FIGS. 18A and 18B, and FIGS. 19A to 19C. Note that the display device 100 disclosed in this specification is a display device in which a light-emitting element is used as a display element. As the display device 100 of one embodiment of the present invention, a display device having a top-emission structure is described as an example. Note that the display device 100 can be a display device having a bottom-emission structure or a dual-emission structure.

<Structure of Display Device>

A structure example of the display device 100 of one embodiment of the present invention is described with reference to FIGS. 1A to 1C, FIGS. 2A and 2B, and FIGS. 3A and 3B. FIG. 1A is a perspective view of the display device 100. FIG. 1B is a cross-sectional view taken along the dashed-dotted line A1-A2 in FIG. 1A. FIG. 1C is a cross-sectional view taken along the dashed-dotted line B1-B2 in FIG. 1A. The display device 100 described in this embodiment includes a display region 131. The display region 131 includes a plurality of pixels 130. One pixel 130 includes at least one light-emitting element 125.

The display device 100 described in this embodiment includes a light-emitting element 125 including an electrode 115, an EL layer 117, and an electrode 118, a partition 114, and an electrode 116. The display device 100 further includes an insulating layer 141 over the electrode 116, and the electrode 115 and the electrode 116 are electrically connected to each other in an opening provided in the insulating layer 141. The partition 114 is provided over the electrode 115, the EL layer 117 is provided over the electrode 115 and the partition 114, and the electrode 118 is provided over the EL layer 117.

The display device 100 described in this embodiment includes a substrate 121 over the light-emitting element 125 with the bonding layer 120 positioned therebetween. The substrate 121 includes a touch sensor 271 that includes an electrode 272, an insulating layer 273, and an electrode 274; an electrode 276; an insulating layer 275; a light-blocking layer 264; a coloring layer (also referred to as a color filter) 266; and an overcoat layer 268. Between the substrate 121 and these components, a bonding layer 122 and an insulating layer 129 are provided. In this embodiment, a capacitive touch sensor is described as an example of the touch sensor 271.

Since the display device 100 described in this embodiment has a top-emission structure, light 151 emitted from the light-emitting element 125 is extracted from the substrate 121 side. The light 151 (e.g., white light) emitted from the EL layer 117 is partly absorbed when transmitted through the coloring layer 266 and converted into light with a specific color. In other words, the coloring layer 266 transmits light with a specific wavelength range. The coloring layer 266 can function as an optical filter layer for converting the light 151 into light of a different color.

Although a stacked-layer structure of an electrode 116a and an electrode 116b is described as the electrode 116 in this embodiment, the electrode 116 may have a single-layer structure or a stacked-layer structure of three or more layers. Although a stacked-layer structure of an electrode 276a and an electrode 276b is described as the electrode 276 in this embodiment, the electrode 276 may have a single-layer structure or a stacked-layer structure of three or more layers.

The display device 100 described in this embodiment includes an opening 132a that penetrates the substrate 121, the bonding layer 122, the insulating layer 129, the bonding layer 120, the insulating layer 273, the insulating layer 275, and the insulating layer 141 and that overlaps with the electrode 116. The display device 100 further includes an opening 132b that penetrates the substrate 121, the bonding layer 122, and the insulating layer 129 and that overlaps with the electrode 276.

In the opening 132a, an external electrode 124a and the electrode 116 are electrically connected to each other through an anisotropic conductive connection layer 138a. In the opening 132b, an external electrode 124b and the electrode 276 are electrically connected to each other through an anisotropic conductive connection layer 138b.

Figure 2B:
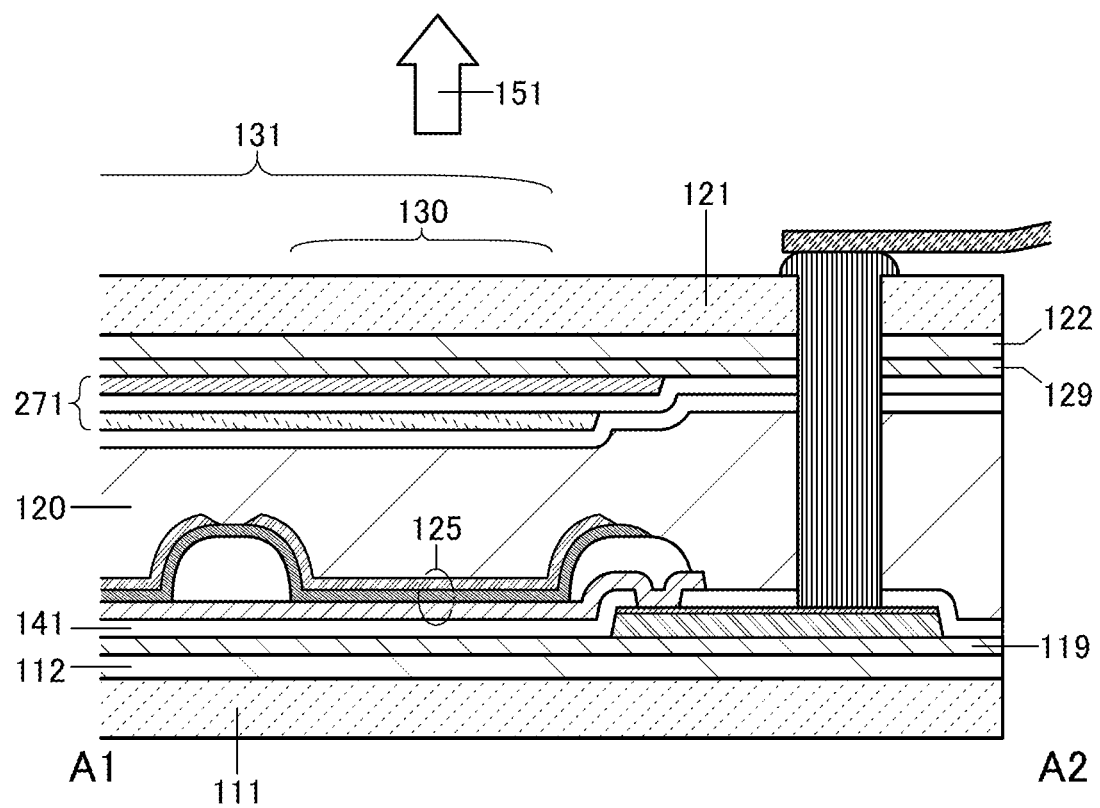

Note that as illustrated in FIGS. 2A and 2B, it is possible not to provide the light-blocking layer 264, the coloring layer 266, and the overcoat layer 268 in the display device 100. FIG. 2A is a perspective view of the display device 100 in which the light-blocking layer 264, the coloring layer 266, and the overcoat layer 268 are not provided, and FIG. 2B is a cross-sectional view taken along the dashed-dotted line A1-A2 in FIG. 2A.

In particular, in the case where the EL layer 117 is provided by what is called side-by-side patterning in which the colors of the lights 151 emitted from different pixels are different, the coloring layer 266 may be provided or is not necessarily provided.

When at least one or all of the light-blocking layer 264, the coloring layer 266, and the overcoat layer 268 are not provided, the display device 100 can achieve a reduction in manufacturing cost, yield improvement, or the like. Moreover, the light 151 can be emitted efficiently when the coloring layer 266 is not provided; therefore, luminance can be improved or power consumption can be reduced, for example.

On the other hand, when the light-blocking layer 264, the coloring layer 266, and the overcoat layer 268 are provided, reflection of external light is suppressed and thus a contrast ratio, color reproducibility, or the like can be improved.

Figure 3A:
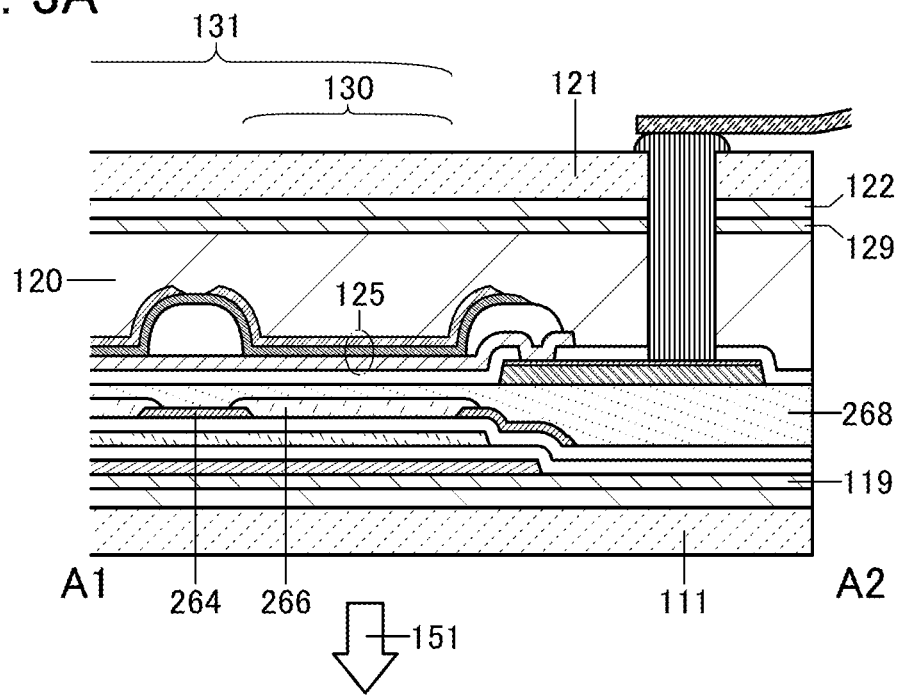
FIGS. 3A and 3B are cross-sectional views each illustrating one embodiment of the present invention.

Note that in the case where the display device 100 has a bottom-emission structure, the touch sensor 271, the light-blocking layer 264, the coloring layer 266, and the overcoat layer 268 may be provided on the substrate 111 side (see FIG. 3A).

Figure 3B:
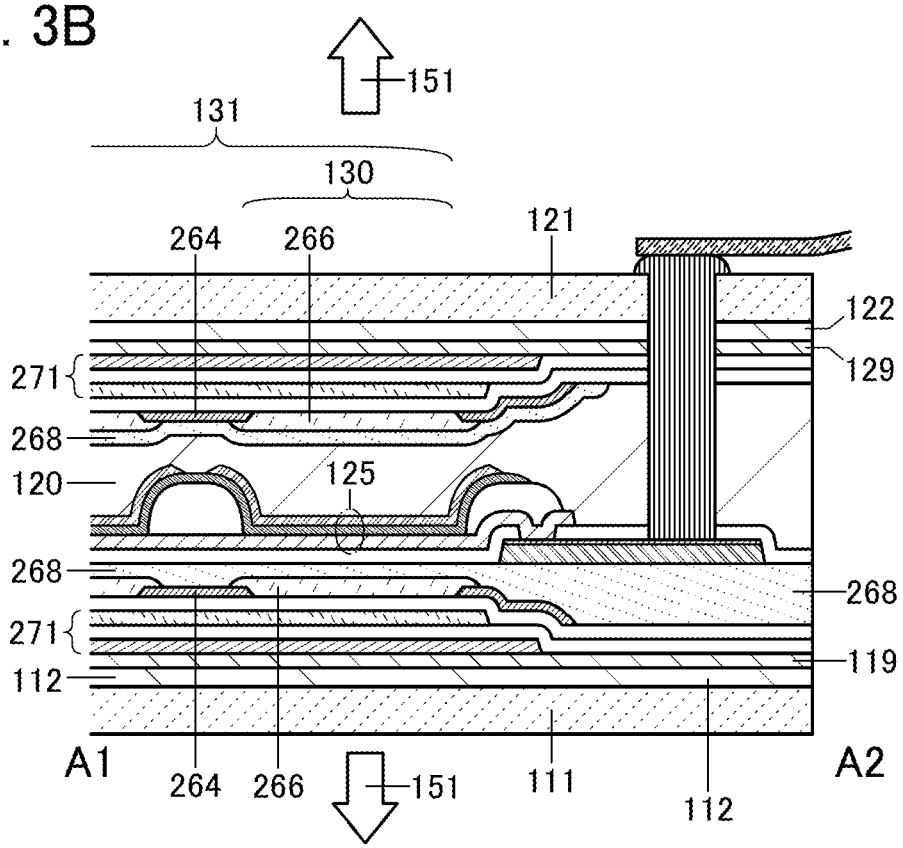

In the case where the display device 100 has a dual-emission structure, the touch sensor 271, the light-blocking layer 264, the coloring layer 266, and the overcoat layer 268 may be provided on either or both of the substrate 111 side and the substrate 121 side (see FIG. 3B). Alternatively, the touch sensor 271 and the coloring layer 266 may be provided on the different substrate sides.

A switching element having a function of supplying a signal to the light-emitting element 125 may be provided between the light-emitting element 125 and the electrode 116. For example, a transistor may be provided between the light-emitting element 125 and the electrode 116.

A transistor is a kind of semiconductor element and enables amplification of current and/or voltage, switching operation for controlling conduction or non-conduction, or the like. By providing a transistor between the light-emitting element 125 and the electrode 116, an increase in the area of the display region 131 and a higher-resolution display can be achieved easily. Note that a resistor, an inductor, a capacitor, a rectifier element, or the like, without limitation to a switching element such as a transistor, can be provided in the display region 131.

[Substrates 111 and 121]

An organic resin material, a glass material that is thin enough to have flexibility, a metal material that is thin enough to have flexibility (including an alloy material), or the like can be used for the substrate 111 and/or the substrate 121. In the case where the display device 100 has a bottom-emission structure or a dual-emission structure, a material having a light-transmitting property with respect to light emitted from the EL layer 117 is used for the substrate 111. In the case where the display device 100 is a top-emission display device or a dual-emission display device, a material that transmits light emitted from the EL layer 117 is used for the substrate 121.

Particularly, the organic resin material has a specific gravity smaller than that of the glass material or the metal material. Thus, when an organic resin material is used for the substrate 111 and/or the substrate 121, the weight of the display device can be reduced.

The substrate 111 and/or the substrate 121 is/are preferably formed using a material with high toughness. In that case, a display device with high impact resistance that is less likely to be broken can be provided. The organic resin material and the metal material have higher toughness than the glass material in many cases. When the organic resin material or the metal material is used as the substrate 111 and/or the substrate 121, a display device that is less likely to be broken can be provided as compared with the case of using the glass material.

The metal material has higher thermal conductivity than the organic resin material or the glass material and thus can easily conduct heat to the whole substrate. Accordingly, a local temperature rise in the display device can be suppressed. The thickness of the substrate 111 and/or the substrate 121 using the metal material is preferably greater than or equal to 10 μm and less than or equal to 200 μm, or further preferably greater than or equal to 20 μm and less than or equal to 50 μm.

Although there is no particular limitation on the metal material used for the substrate 111 and/or the substrate 121, for example, aluminum, copper, nickel, an alloy such as an aluminum alloy or stainless steel can be used.

When a material with high thermal emissivity is used for the substrate 111 and/or the substrate 121, the surface temperature of the display device can be prevented from rising, leading to prevention of breakage or a decrease in reliability of the display device. For example, the substrate may have a stacked-layer structure of a layer formed using the metal material (hereinafter referred to as a "metal layer") and a layer with high thermal emissivity (e.g., a metal oxide or a ceramic material).

A hard coat layer (e.g., a silicon nitride layer) by which a surface of the display device is protected from damage, a layer (e.g., an aramid resin layer) which can disperse pressure, or the like may be stacked with the substrate 111 and/or the substrate 121.

The substrate 111 and/or the substrate 121 may have a stacked-layer structure of a plurality of layers using the above-described materials. In the case of a structure including a layer formed using a glass material (hereinafter referred to as a "glass layer"), barrier properties of the display device against water and oxygen can be particularly improved and thus a reliable display device can be provided.

For example, a flexible substrate in which a glass layer, a bonding layer, and a layer formed using the organic resin material (hereinafter referred to as an "organic resin layer") are stacked from the side closer to the display element can be used. The thickness of the glass layer is greater than or equal to 20 μm and less than or equal to 200 μm, or preferably greater than or equal to 25 μm and less than or equal to 100 μm. With such a thickness, the glass layer can have both a high barrier property against water and oxygen and a high flexibility. The thickness of the organic resin layer is greater than or equal to 10 μm and less than or equal to 200 μm, or preferably greater than or equal to 20 μm and less than or equal to 50 μm. With such an organic resin layer provided on an outer side than the glass layer, breakage or a crack of the glass layer can be inhibited, resulting in increased mechanical strength of the display device. With the substrate using a composite layer of the glass layer and the organic resin layer, a highly reliable flexible display device can be provided.

As a material that has flexibility and transmits visible light, which can be used for the substrate 111 and the substrate 121, the following can be used: a poly(ethylene terephthalate) resin (PET), a poly(ethylene naphthalate) resin (PEN), a poly(ether sulfone) resin (PES), a polyacrylonitrile resin, an acrylic resin, a polyimide resin, a poly (methyl methacrylate) resin, a polycarbonate resin, a polyamide resin, a polycycloolefin resin, a polystyrene resin, a poly(amide imide) resin, a polypropylene resin, a polyester resin, a poly(vinyl halide) resin, an aramid resin, an epoxy resin, or the like. Alternatively, a mixture or a stack including any of these materials may be used. Note that the same material or different materials may be used for the substrate 111 and the substrate 121.

The thermal expansion coefficients of the substrate 121 and the substrate 111 are preferably less than or equal to 30 ppm/K, or further preferably less than or equal to 10 ppm/K. On surfaces of the substrate 121 and the substrate 111, a protective film having low water permeability may be formed; examples of the protective film include a film containing nitrogen and silicon such as a silicon nitride film or a silicon oxynitride film and a film containing nitrogen and aluminum such as an aluminum nitride film. Note that a structure in which a fibrous body is impregnated with an organic resin (also called prepreg) may be used as the substrate 121 and the substrate 111.

[Insulating Layers 119, 129, 141, 273, and 275]

The insulating layers 119, 129, 141, 273, and 275 can be formed to have a single-layer structure or a multi-layer structure using an oxide material such as aluminum oxide, magnesium oxide, silicon oxide, silicon oxynitride, gallium oxide, germanium oxide, yttrium oxide, zirconium oxide, lanthanum oxide, neodymium oxide, hafnium oxide, or tantalum oxide; a nitride material such as silicon nitride, silicon nitride oxide, aluminum nitride, or aluminum nitride oxide; or the like. The insulating layer 119 may have, for example, a two-layer structure of silicon oxide and silicon nitride or a five-layer structure in which materials selected from the above are combined. The insulating layers 119, 129, 141, 273, and 275 can be formed by a sputtering method, a CVD method, a thermal oxidation method, a coating method, a printing method, or the like.

The insulating layer 119 can prevent or reduce diffusion of an impurity element from the substrate 111, the bonding layer 112, or the like to the light-emitting element 125. The insulating layer 119 is preferably formed using an insulating film having low water permeability. For example, the water vapor permeability is lower than or equal to $1\times10^{-5}$ g/(m$^2$·day), preferably lower than or equal to $1\times10^{-6}$ g/(m$^2$·day), further preferably lower than or equal to $1\times10^{-7}$ g/(m$^2$·day), or still further preferably lower than or equal to $1\times10^{-8}$ g/(m$^2$·day).

Note that in this specification, a nitride oxide refers to a compound that contains more nitrogen than oxygen. An oxynitride refers to a compound that contains more oxygen than nitrogen. The content of each element can be measured by Rutherford backscattering spectrometry (RBS), for example.

[Electrodes 116 and 276]

The electrodes 116a and 276a can be formed using a conductive material. For example, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. A semiconductor typified by polycrystalline silicon containing an impurity element such as phosphorus, or silicide such as nickel silicide may also be used. There is no particular limitation on the formation method of the electrodes 116a and 276a, and a variety of formation methods such as an evaporation method, a CVD method, a sputtering method, and a spin coating method can be employed.

The electrodes 116a and 276a can also be formed using a conductive material containing oxygen, such as indium tin oxide (hereinafter, also referred to as ITO), indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, a conductive material containing nitrogen, such as titanium nitride, tantalum nitride, or tungsten nitride, can be used. It is also possible to use a stacked-layer structure formed using the above conductive material containing oxygen and a material containing the above metal element.

The electrodes 116a and 276a may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing one or more elements selected from titanium, tantalum, tungsten, molybdenum, chromium, neodymium, and scandium may be used as the electrode 116a and the electrode 276a.

The electrodes 116b and 276b can be formed using an element selected from tungsten, molybdenum, titanium, tantalum, niobium, nickel, cobalt, zirconium, ruthenium, rhodium, palladium, osmium, iridium, and silicon; an alloy containing any of the elements; or a compound containing any of the elements. The electrode 116b and 276b can also be formed to have a single-layer structure or a stacked-layer structure using any of the materials. Note that the crystalline structure of the electrodes 116b and 276b may be amorphous, microcrystalline, or polycrystalline. The peeling layer 113 can also be formed with a metal oxide such as aluminum oxide, gallium oxide, zinc oxide, titanium dioxide, indium oxide, indium tin oxide, indium zinc oxide, or an oxide including indium, gallium, and zinc (In—Ga—Zn—O, IGZO).

In the case where each of the electrodes 116b and 276b has a single-layer structure, each of the electrodes 116b and 276b is preferably formed using tungsten, molybdenum, or a material containing tungsten and molybdenum. Alternatively, each of the electrodes 116b and 276b is preferably formed using an oxide or oxynitride of tungsten, an oxide or oxynitride of molybdenum, or an oxide or oxynitride of a material containing tungsten and molybdenum.

[Electrode 115]

The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, and a layer having high reflectance (e.g., aluminum, an alloy containing aluminum, or silver) may be provided in contact with the layer.

For the conductive material that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. In addition, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used. An alloy of silver and copper is preferable because of its high heat resistance. Furthermore, a metal film or an alloy film may be stacked with a metal oxide film. For example, a metal film or an alloy film may be stacked with an aluminum alloy film, by which oxidation of the aluminum alloy film can be suppressed. Other examples of the metal film and the metal oxide film are titanium and titanium oxide, respectively. Alternatively, as described above, a light-transmitting conductive film and a film containing metal materials may be stacked. For example, a stack of silver and indium tin oxide, a stack of an alloy of silver and magnesium and ITO, or the like can be used.

The display device having a top-emission structure is described as an example in this embodiment. In the case of a display device having a bottom-emission structure or a dual emission structure, the electrode 115 may be formed using a light-transmitting conductive material.

As a light-transmitting conductive material, indium oxide, indium tin oxide, indium zinc oxide, zinc oxide, or zinc oxide to which gallium is added can be used, for example. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive layer. For example, a stack of ITO and an alloy of silver and magnesium is preferably used, in which case conductivity can be increased. Further alternatively, graphene or the like may be used.

[Partition 114]

The partition 114 is provided in order to prevent an electrical short circuit between the adjacent electrodes 118. In the case of using a metal mask for formation of the EL layer 117 described later, the partition 114 has a function of preventing the contact of metal mask with a region where the light-emitting element 125 is formed. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[EL Layer 117]

A structure of the EL layer 117 is described in Embodiment 7.

[Electrode 118]

The electrode 118 is used as a cathode in this embodiment, and thus the electrode 118 is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118. As the buffer layer, an oxide of an alkaline earth metal, a halide, a magnesium-silver, or the like can also be used.

In the case where light emitted from the EL layer 117 is extracted through the electrode 118, the electrode 118 preferably has a property of transmitting visible light.

[Electrodes 272 and 274]

The electrodes 272 and 274 are preferably formed with a light-transmitting conductive material.

[Bonding Layers 120, 112, and 122]

A light curable adhesive, a reaction curable adhesive, a thermosetting adhesive, or an anaerobic adhesive can be used as the bonding layer 120, the bonding layer 112, and the bonding layer 122. For example, an epoxy resin, an acrylic resin, a silicone resin, a phenol resin, an imide resin, a poly(vinyl chloride) (PVC) resin, a poly(vinyl butyral) (PVB) resin, or an ethylene-vinyl acetate (EVA) resin can be used. In particular, a material with low moisture permeability, such as an epoxy resin, is preferable. Alternatively, an adhesive sheet or the like may be used.

The bonding layer 120 may contain a drying agent. In particular, in the case of a display device having a top-emission structure or a dual-emission structure, a drying agent (a substance which adsorbs moisture by chemical adsorption (e.g., oxide of an alkaline earth metal such as calcium oxide or barium oxide) or a substance that adsorbs moisture by physical adsorption, such as zeolite or silica gel) having a size less than or equal to the wavelength of light emitted from the EL layer 117 or a filler (e.g., titanium oxide or zirconium) with a high refractive index is preferably mixed into the bonding layer 120, in which case the efficiency of extracting light emitted from the EL layer 117 negligibly decreases, impurity such as moisture is prevented from entering a display element, and the reliability of the display device is improved.

[Anisotropic Conductive Connection Layers 138a and 138b]

The anisotropic conductive connection layers 138a and 138b can be formed using any of various kinds of anisotropic conductive films (ACF), anisotropic conductive pastes (ACP), and the like.

The anisotropic conductive connection layer 138 is formed by curing a paste-form or sheet-form material that is obtained by mixing conductive particles to a thermosetting resin or a thermosetting and light curable resin. The anisotropic conductive connection layer 138 exhibits an anisotropic conductive property by light irradiation or thermocompression bonding. As the conductive particles used for the anisotropic conductive connection layer 138, for example, particles of a spherical organic resin coated with a thin-film metal such as Au, Ni, or Co can be used.

<Method of Manufacturing Display Device>

Next, an example of a method of manufacturing the display device 100 is described with reference to FIGS. 4A to 4E, FIGS. 5A to 5C, FIGS. 6A and 6B, FIGS. 7A to 7D, FIGS. 8A to 8D, FIGS. 9A to 9D, FIGS. 10A to 10C, FIGS. 11A and 11B, FIGS. 12A and 12B, FIGS. 13A and 13B, FIGS. 14A and 14B, FIGS. 15A and 15B, and FIGS. 16A and 16B. FIGS. 4A to 9D and FIGS. 11A to 16B are cross-sectional views taken along the dashed-dotted line A1-A2 or B1-B2 in FIG. 1A. First, a method of manufacturing an element substrate 171 is described.

[Formation of Peeling Layer 113]

Figure 4A:
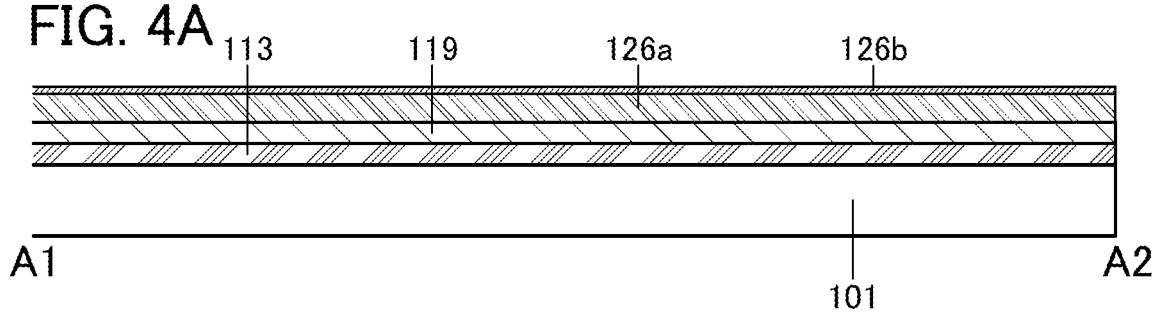
FIGS. 4A to 4E illustrate a manufacturing process of one embodiment of the present invention.
Figure 4B:
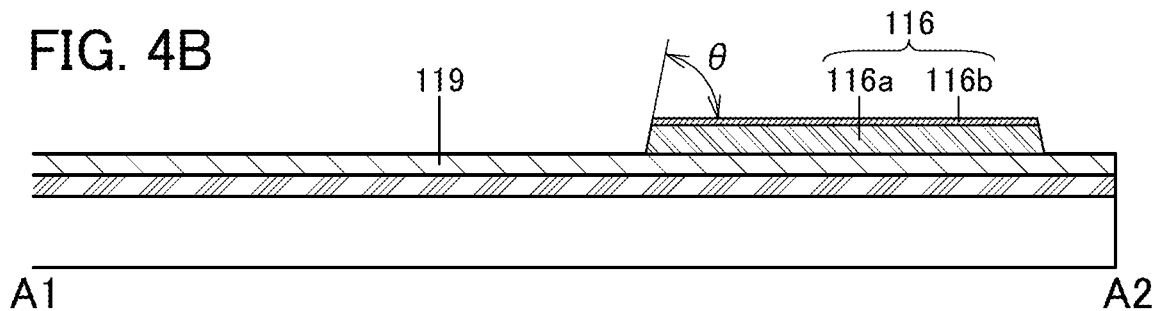

First, a peeling layer 113 is formed over the substrate 101 (see FIG. 4A). The substrate 101 may be exemplified by a semiconductor substrate (e.g., a single crystal substrate or a silicon substrate), an SOI substrate having heat resistance to the processing temperature in this embodiment, a glass substrate, a quartz substrate, a sapphire substrate, a ceramic substrate, a plastic substrate, a metal substrate, a stainless steel substrate, a substrate including stainless steel foil, a tungsten substrate, and a substrate including tungsten foil. As an example of a glass substrate, a barium borosilicate glass substrate, an aluminoborosilicate glass substrate, and soda lime glass substrate can be given.

The peeling layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The peeling layer 113 can also be formed to have a single-layer structure or a stacked-layer structure using any of the materials. Note that the crystalline structure of the peeling layer 113 may be amorphous, microcrystalline, or polycrystalline. The peeling layer 113 can also be formed using a metal oxide such as aluminum oxide, gallium oxide, zinc oxide, titanium dioxide, indium oxide, indium tin oxide, indium zinc oxide, or In—Ga—Zn—O (IGZO).

The peeling layer 113 can be formed by a sputtering method, a CVD method, a coating method, a printing method, or the like. Note that the coating method includes a spin coating method, a droplet discharge method, and a dispensing method.

In the case where the peeling layer 113 has a single-layer structure, the peeling layer 113 is preferably formed using tungsten, molybdenum, or a material containing tungsten and molybdenum. Alternatively, the peeling layer 113 is preferably formed using an oxide or oxynitride of tungsten, an oxide or oxynitride of molybdenum, or an oxide or oxynitride of a material containing tungsten and molybdenum.

In the case where the peeling layer 113 has a stacked-layer structure including, for example, a layer containing tungsten and a layer containing an oxide of tungsten, the layer containing an oxide of tungsten may be formed as follows: the layer containing tungsten is formed first and then an insulating oxide layer is formed in contact therewith, so that the layer containing an oxide of tungsten is formed at the interface between the layer containing tungsten and the insulating oxide layer. Alternatively, the layer containing an oxide of tungsten may be formed by performing thermal oxidation treatment, oxygen plasma treatment, treatment with an oxidizing solution such as ozone water, or the like on the surface of the layer containing tungsten. Moreover, an insulating layer may be provided between the substrate 101 and the peeling layer 113.

In this embodiment, aluminoborosilicate glass is used for the substrate 101. As the peeling layer 113, a tungsten film is formed over the substrate 101 by a sputtering method.

[Formation of Insulating Layer 119]

Next, the insulating layer 119 is formed over the peeling layer 113 (see FIG. 4A). The insulating layer 119 can prevent or reduce diffusion of an impurity element from the substrate 101 or the like. After the substrate 101 is replaced with the substrate 111, the insulating layer 119 can prevent or reduce diffusion of an impurity element from the substrate 111, the bonding layer 112, or the like to the light-emitting element 125. The thickness of the insulating layer 119 is preferably greater than or equal to 30 nm and less than or equal to 2 µm, further preferably greater than or equal to 50 nm and less than or equal to 1 µm, or still further preferably greater than or equal to 50 nm and less than or equal to 500 nm. In this embodiment, the insulating layer 119 is formed by stacking a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film by a plasma CVD method from the substrate 101 side.

Note that it is preferable to expose the surface of the peeling layer 113 to an atmosphere containing oxygen before the formation of the insulating layer 119.

As the gas used in the atmosphere containing oxygen, oxygen, dinitrogen monoxide, nitrogen dioxide, carbon dioxide, carbon monoxide, or the like can be used. A mixed gas of a gas containing oxygen and another gas may be used. For example, a mixed gas of a gas containing oxygen and a rare gas, for example, a mixed gas of carbon dioxide and argon may be used. Oxidizing the surface of the peeling layer 113 can facilitate peeling of the substrate 101 performed later.

[Formation of Electrode 116]

Next, a conductive layer 126a and a conductive layer 126b for forming the electrode 116 are formed over the insulating layer 119. First, as the conductive layer 126a, a three-layer metal film in which a layer of aluminum is provided between two layers of molybdenum is formed over the insulating layer 119 by a sputtering method. Subsequently, as the conductive layer 126b, a tungsten film is formed over the conductive layer 126a by a sputtering method (see FIG. 4A).

After that, a resist mask is formed over the conductive layer 126b, and the conductive layers 126a and 126b are etched into a desired shape using the resist mask. In the above-described manner, the electrode 116 (the electrodes 116a and 116b) is formed. The resist mask can be formed by a lithography method, a printing method, an inkjet method, or the like as appropriate. Formation of the resist mask by an inkjet method needs no photomask; thus, manufacturing cost can be reduced.

The etching of the conductive layers 126a and 126b may be performed by a dry etching method, a wet etching method, or both of them. After the etching treatment, the resist mask is removed (see FIG. 4B).

When the electrode 116 (including other electrodes and wirings formed using the same layer) has a taper-shaped end portion, the coverage with a layer that covers the side surfaces of the electrode 116 can be improved. Specifically, the end portion has a taper angle θ of 80° or less, preferably 60° or less, or further preferably 45° or less. Note that the "taper angle" refers to an inclination angle formed by a side surface and a bottom surface. A taper angle smaller than 90° is called forward tapered angle and a taper angle larger than or equal to 90° is called inverse tapered angle (see FIG. 4B).

Alternatively, the cross-sectional shape of the end portion of the electrode 116 has a plurality of steps, so that the coverage with the layer formed thereon can be improved. The above description is not limited to the electrode 116 and, when the end portion of each layer has a forward taper shape or a step-like shape in a cross section, a phenomenon that a layer formed to cover the end portion is cut (disconnection) at the end portion can be prevented, so that the coverage becomes favorable.

[Formation of Insulating Layer 141]

Figure 4C:
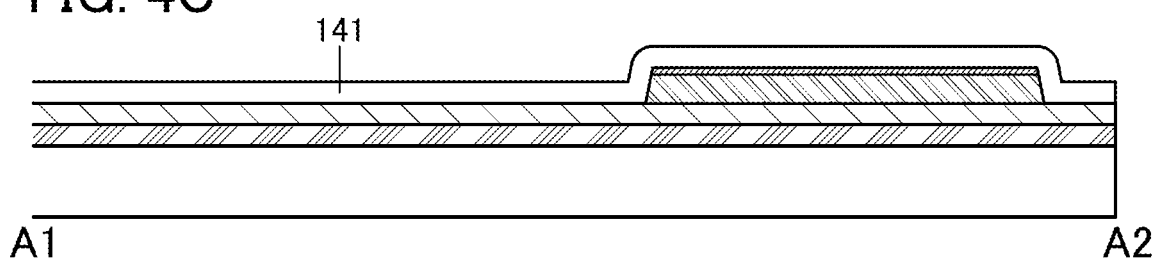

Next, an insulating layer 141 is formed over the electrode 116 (see FIG. 4C). In this embodiment, a silicon oxynitride film is formed by a plasma CVD method as the insulating layer 141. It is preferable to oxidize the surface of the electrode 116b prior to the formation of the insulating layer 141. For example, it is preferable to expose the surface of the electrode 116b to an atmosphere of a gas containing oxygen or an atmosphere of plasma containing oxygen before the formation of the insulating layer 141. Oxidizing the surface of the electrode 116b can facilitate formation of the opening 132a performed later.

In this embodiment, the sample is placed in a treatment chamber of a plasma CVD apparatus, and then dinitrogen monoxide is supplied to the treatment chamber and the plasma atmosphere is generated. After that, the sample surface is exposed to the plasma atmosphere. Subsequently, a silicon oxynitride film is formed on the sample surface.

Figure 4D:
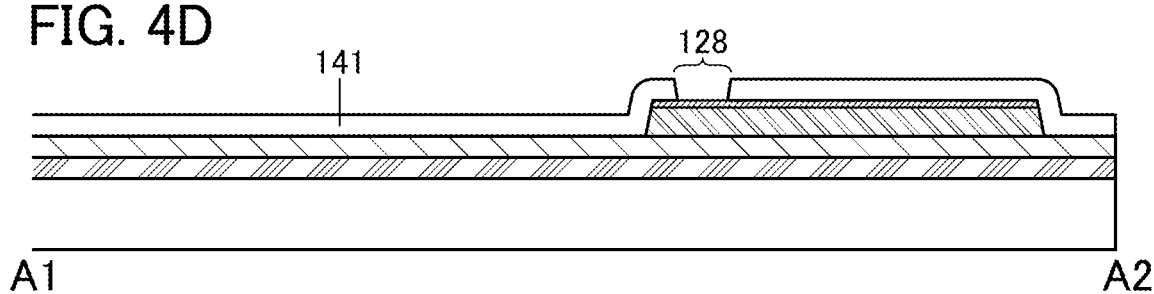

Next, a resist mask is formed over the insulating layer 141, and part of the insulating layer 141 overlapping with the electrode 116 is selectively removed using the resist mask, so that the insulating layer 141 having an opening 128 is formed (see FIG. 4D). The etching of the insulating layer 141 may be performed by a dry etching method, a wet etching method, or both of them. At this time, an oxide on the surface of the electrode 116b overlapping with the opening 128 is also removed.

[Formation of Electrode 115]

Figure 4E:
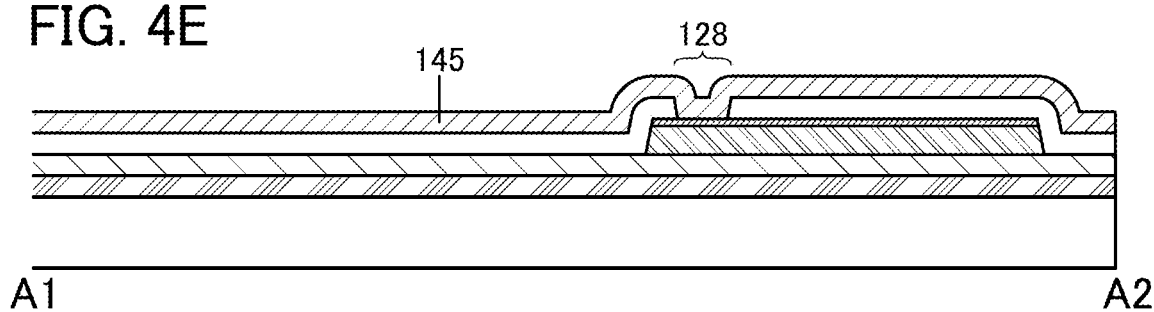

Next, a conductive layer 145 for forming the electrode 115 is formed over the insulating layer 141 (see FIG. 4E). The conductive layer 145 can be formed using a material and a method that are similar to those of the conductive layer 126a (electrode 116a).

Figure 5A:
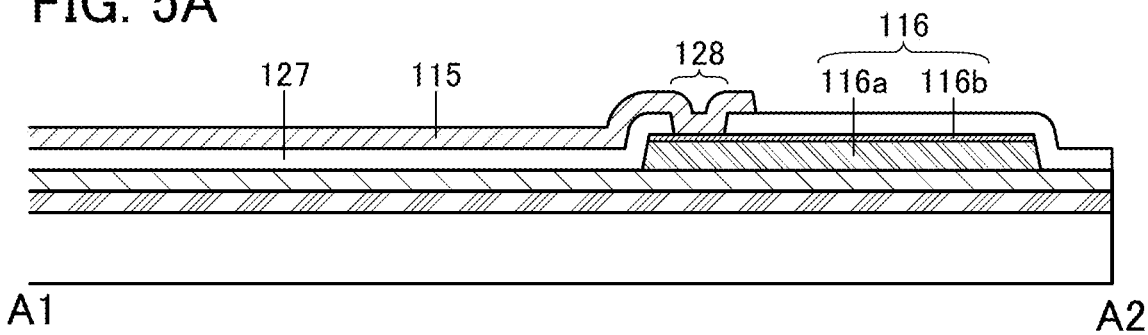
FIGS. 5A to 5C illustrate a manufacturing process of one embodiment of the present invention.

Next, a resist mask is formed over the conductive layer 145, and part of the conductive layer 145 is selectively removed using the resist mask, so that the electrode 115 is formed (see FIG. 5A). The etching of the conductive layer 145 may be performed by a dry etching method, a wet etching method, or both of them. In this embodiment, the conductive layer 145 (electrode 115) is formed using a material in which indium tin oxide is stacked over silver. The electrode 115 and the electrode 116 are electrically connected to each other through the opening 128.

[Formation of Partition 114]

Figure 5B:
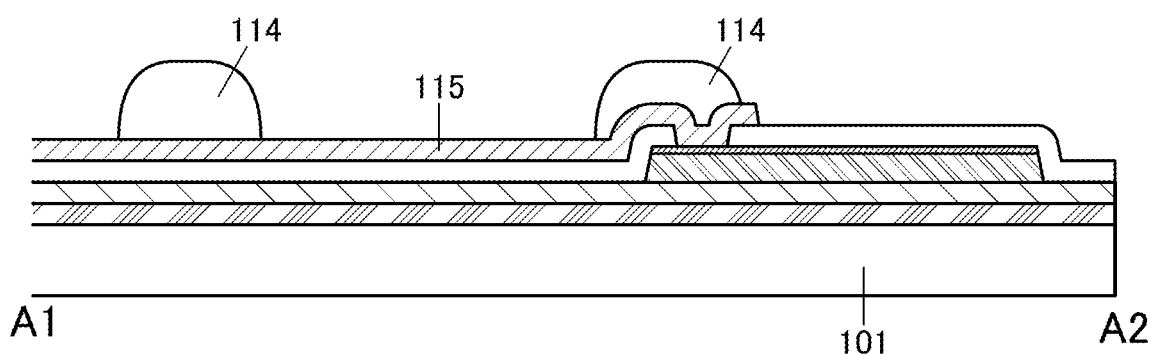

Next, the partition 114 is formed (see FIG. 5B). In this embodiment, the partition 114 is formed in such a manner that a photosensitive organic resin material is applied by a coating method and processed into a desired shape. In this embodiment, the partition 114 is formed using a photosensitive polyimide resin.

[Formation of EL Layer 117]

Figure 5C:
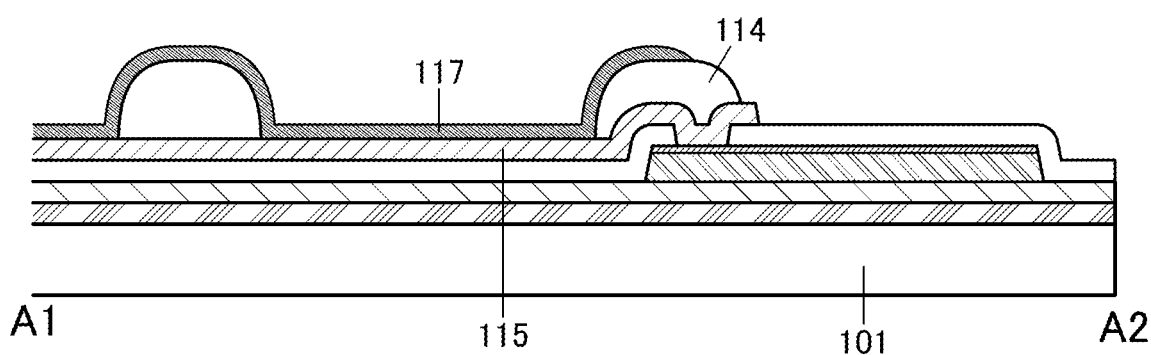

Next, the EL layer 117 is formed over the electrode 115 and the partition 114 (see FIG. 5C).

[Formation of Electrode 118]

Next, the electrode 118 is formed over the EL layer 117. In this embodiment, an alloy of magnesium and silver is used for the electrode 118. The electrode 118 can be formed by an evaporation method, a sputtering method, or the like (see FIG. 6A).

Figure 6A:
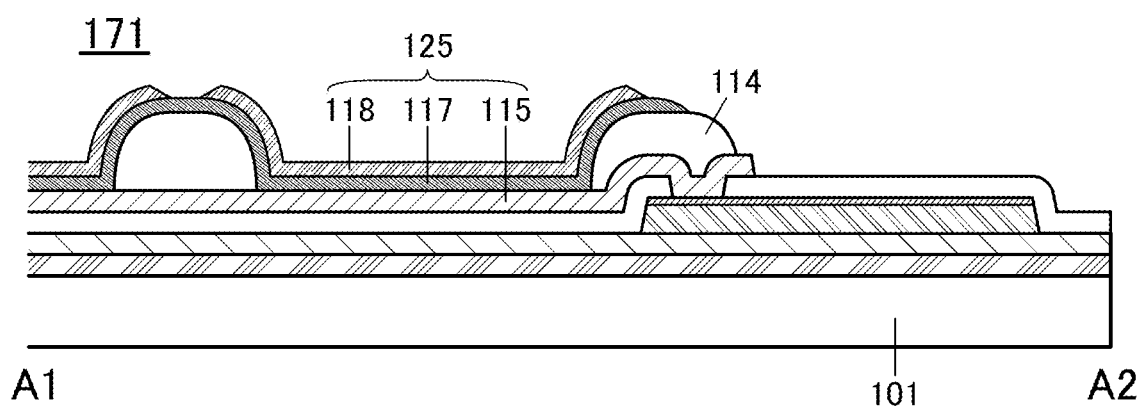
FIGS. 6A and 6B illustrate a manufacturing process of one embodiment of the present invention.
Figure 6B:
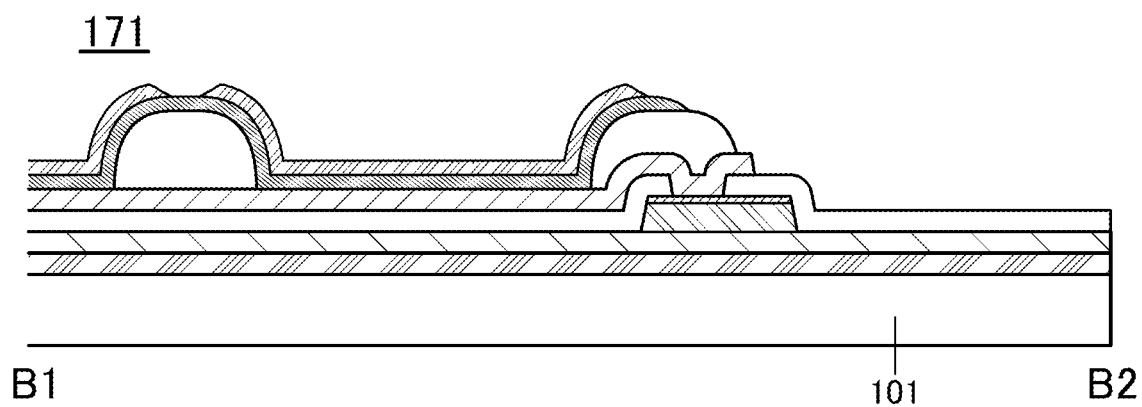

In this embodiment, a structure including the substrate 101 and the light-emitting element 125 provided over the substrate 101 is referred to as the element substrate 171. FIG. 6A is a cross-sectional view of the element substrate 171 taken along the dashed-dotted line A1-A2 in FIG. 1A. FIG. 6B is a cross-sectional view of the element substrate 171 taken along the dashed-dotted line B1-B2 in FIG. 1A.

Next, a method of forming a counter substrate that includes a color filter is described.

[Formation of Peeling Layer 123]

Figure 7A:
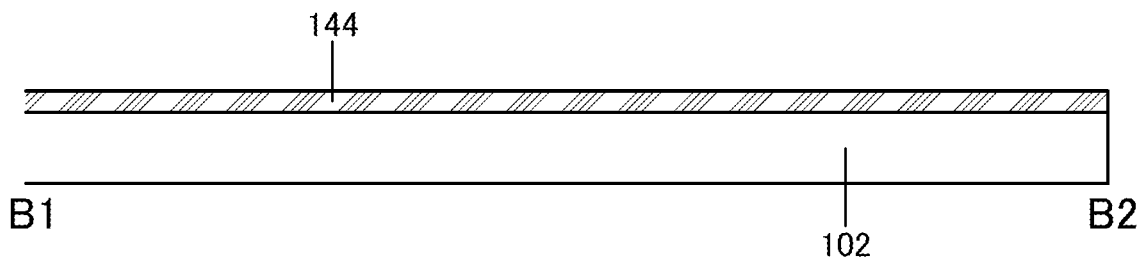
FIGS. 7A to 7D illustrate a manufacturing process of one embodiment of the present invention.
Figure 7B:
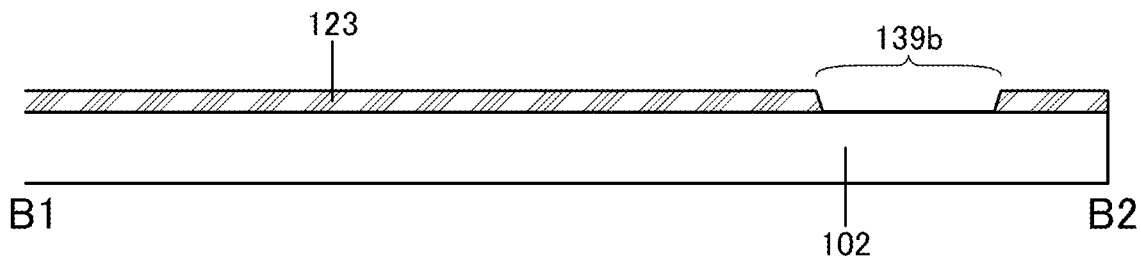

First, a peeling layer 144 is formed over the substrate 102 (see FIG. 7A). The substrate 102 can be formed using a material similar to that of the substrate 101. Note that the same material or different materials may be used for the substrate 101 and the substrate 102. The peeling layer 144 can be formed with the same material and method as those of the peeling layer 113. Moreover, an insulating layer may be provided between the substrate 102 and the peeling layer 144. In this embodiment, aluminoborosilicate glass is used for the substrate 102. As the peeling layer 144, a tungsten film is formed over the substrate 102 by a sputtering method.

Subsequently, a resist mask is formed over the peeling layer 144, and part of the peeling layer 144 is selectively removed using the resist mask, so that a peeling layer 123 having an opening 139a (not illustrated in FIGS. 7A to 7D) and an opening 139b is formed. The resist mask can be formed by a lithography method, a printing method, an inkjet method, or the like as appropriate. Formation of the resist mask by an inkjet method needs no photomask; thus, manufacturing cost can be reduced.

The etching of the peeling layer 144 may be performed by a dry etching method, a wet etching method, or both of them. After the etching treatment, the resist mask is removed (see FIG. 7B).

Note that it is preferable to expose the surface of the peeling layer 123 to an atmosphere containing oxygen or a plasma atmosphere containing oxygen after the formation of the peeling layer 123. Oxidizing the surface of the peeling layer 123 can facilitate peeling of the substrate 102 performed later.

[Formation of Insulating Layer 129]

Figure 7C:
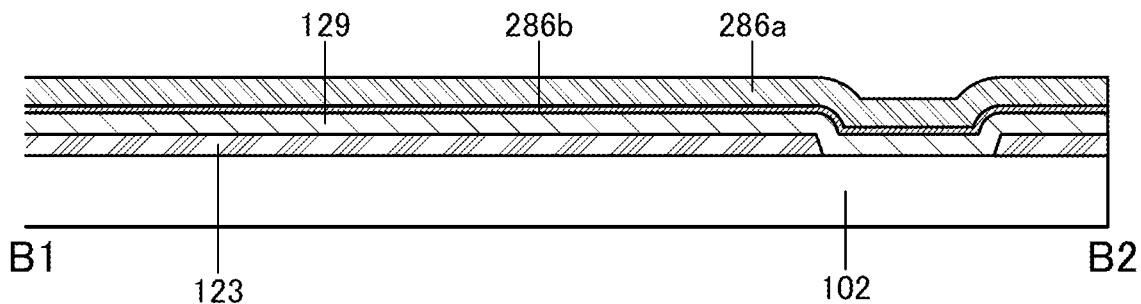
Figure 7D:
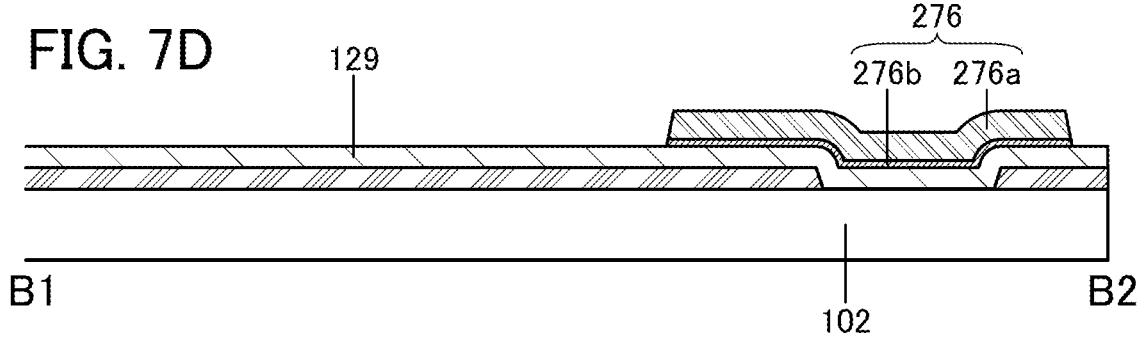
Figure 8A:
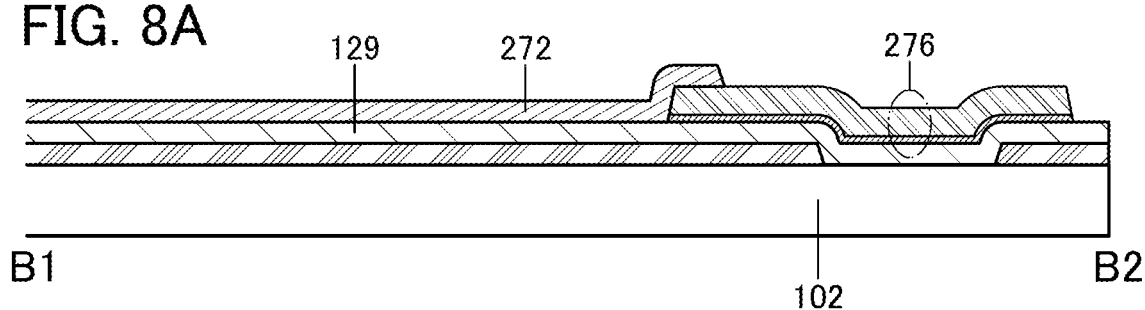
FIGS. 8A to 8D illustrate a manufacturing process of one embodiment of the present invention.
Figure 8B:
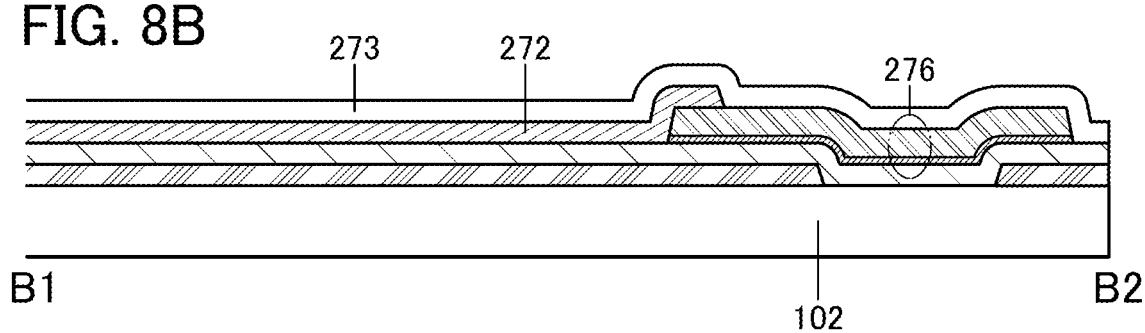
Figure 8C:
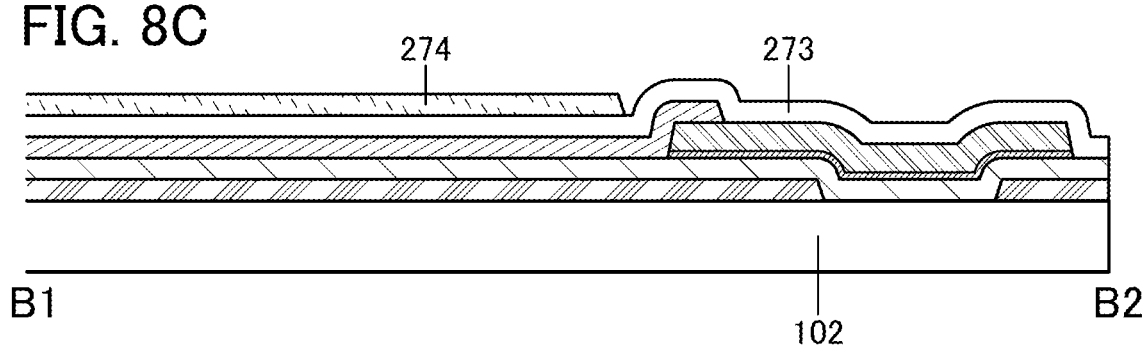
Figure 8D:
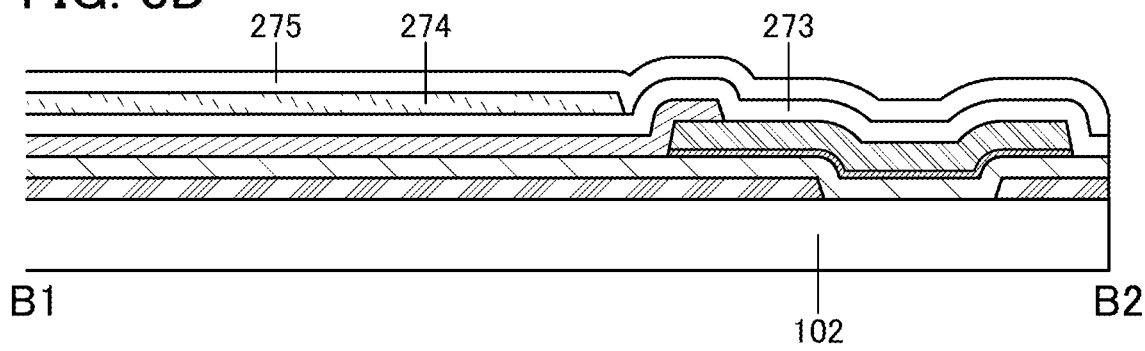

Next, the insulating layer 129 is formed over the peeling layer 123 (see FIG. 7C). The insulating layer 129 can be formed using a material and a method that are similar to those of the insulating layer 119. In this embodiment, the insulating layer 129 is formed by stacking a 200-nm-thick silicon oxynitride film, a 140-nm-thick silicon nitride oxide film, and a 100-nm-thick silicon oxynitride film by a plasma CVD method from the substrate 102 side.

[Formation of Electrode 276]

Next, conductive layers 286a and 286b for forming the electrode 276 over the insulating layer 129 are formed. The material and method of forming the conductive layer 126a can be used for the conductive layer 286a. The material and method of forming the conductive layer 126b can be used for the conductive layer 286b.

In this embodiment, a tungsten film is formed as the conductive layer 286b over the insulating layer 129 and openings 139b by a sputtering method. Next, three metal films (an aluminum film is sandwiched between two molybdenum films) are formed as the conductive layer 286a over the conductive layer 286b by a sputtering method (see FIG. 7C).

After that, a resist mask is formed over the conductive layer 286a, and the conductive layers 286a and 286b are etched into a desired shape using the resist mask. Thus, the electrode 276 (the electrodes 276a and 276b) can be formed. The resist mask can be formed by a lithography method, a printing method, an inkjet method, or the like as appropriate. Formation of the resist mask by an inkjet method needs no photomask; thus, manufacturing cost can be reduced.

The etching of the conductive layers 286a and 286b may be performed by a dry etching method, a wet etching method, or both of them. After the etching treatment, the resist mask is removed (see FIG. 7D).

[Formation of Electrode 272]

Next, the electrode 272 that is electrically connected to the electrode 276 is formed over the insulating layer 129. The electrode 272 can be formed by forming a light-transmitting conductive layer over the insulating layer 129 and the electrode 276 and selectively etching part of the conductive layer. The light-transmitting conductive film can be formed with, for example, the above-described light-transmitting conductive material. In this embodiment, indium tin oxide is used for the electrode 272 (see FIG. 8A).

[Formation of Insulating Layer 273]

Next, the insulating layer 273 is formed over the electrode 272 and the electrode 276. In this embodiment, a silicon oxynitride film is formed as the insulating layer 273 by a plasma CVD method (see FIG. 8B).

[Formation of Electrode 274]

Then, the electrode 274 is formed over the insulating layer 273. The electrode 274 can be formed by forming a light-transmitting conductive layer over the insulating layer 273 and selectively etching part of the conductive layer. In this embodiment, indium tin oxide is used for the electrode 274 (see FIG. 8C).

[Formation of Insulating Layer 275]

Next, the insulating layer 275 is formed over the electrode 274. In this embodiment, a silicon oxynitride film is formed by a plasma CVD method as the insulating layer 275 (see FIG. 8D). Note that the insulating layer 275 is not necessarily formed.

[Formation of Light-Blocking Layer 264]

Next, the light-blocking layer 264 is formed over the insulating layer 275 (see FIG. 9A). The light-blocking layer 264 has functions of blocking light emitted from an adjacent display element and suppressing color mixture between adjacent display elements. Moreover, the coloring layer 266 is provided such that its end portion overlaps with the end portion of the light-blocking layer 264, whereby light leakage can be reduced. The light-blocking layer 264 may have a single-layer structure or a layered structure of two or more layers. Examples of a material for the light-blocking layer 264 are a metal material including chromium, titanium, nickel, or the like; an oxide material including chromium, titanium, nickel, or the like; and a resin material including a metal material, a pigment, or dye.

The light-blocking layer 264 can be formed through a photolithography process. In the case where a high molecular material in which carbon black is dispersed is used for the light-blocking layer 264, the light-blocking layer 264 can be formed directly on the insulating layer 275 by an inkjet method.

[Formation of Coloring Layer 266]

Next, the coloring layer 266 is formed over the insulating layer 275 (see FIG. 9B). As described above, the coloring layer is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer 266 is formed in a desired position with any of various materials by a printing method, an inkjet method, or a photolithography method. At this time, the coloring layer 266 is preferably provided so as to partly overlap with the light-blocking layer 264 because light leakage can be reduced. Color display can be performed by providing the coloring layers 266 of different colors in different pixels.

[Formation of Overcoat Layer 268]

Next, the overcoat layer 268 is formed over the light-blocking layer 264 and the coloring layer 266 (see FIG. 9C).

As the overcoat layer 268, an organic insulating layer of an acrylic resin, an epoxy resin, polyimide, or the like can be used. With the overcoat layer 268, an impurity or the like contained in the coloring layer 266 can be prevented from diffusing into the light-emitting element 125 side, for example. Note that the overcoat layer 268 is not necessarily formed.

A light-transmitting conductive film may be formed as the overcoat layer 268. The light-transmitting conductive film is formed as the overcoat layer 268, the overcoat layer 268 can transmit light 151 emitted from the light-emitting element 125 and prevent transmission of ionized impurities.

The light-transmitting conductive film can be formed with, for example, the above-described light-transmitting conductive material. A metal film that is thin enough to have a light-transmitting property can also be used.

In this embodiment, a structure including the substrate 102 and the coloring layer 266 and the like provided over the substrate 102 is referred to as a counter substrate 181. Through the above steps, the counter substrate 181 can be formed. Note that the counter substrate 181 is not provided with the coloring layer 266 or the like in some cases when the coloring layer 266 is not needed. FIG. 9C is a cross-sectional view of the counter substrate 181 taken along the dashed-dotted line B1-B2 in FIG. 1A. FIG. 9D is a cross-sectional view of the counter substrate 181 taken along the dashed-dotted line A1-A2 in FIG. 1A.

[Example of Pixel Configuration]

Figure 10A:
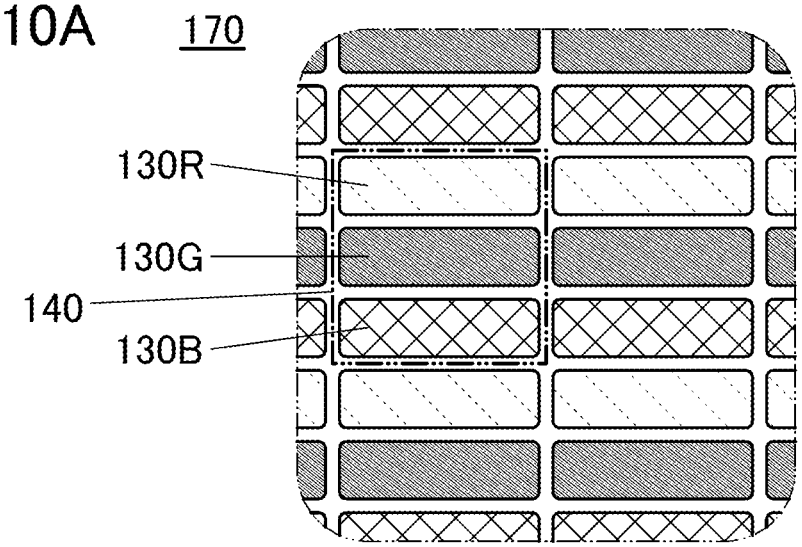
FIGS. 10A to 10C each illustrate an example of a pixel configuration of one embodiment of a display device.
Figure 10B:
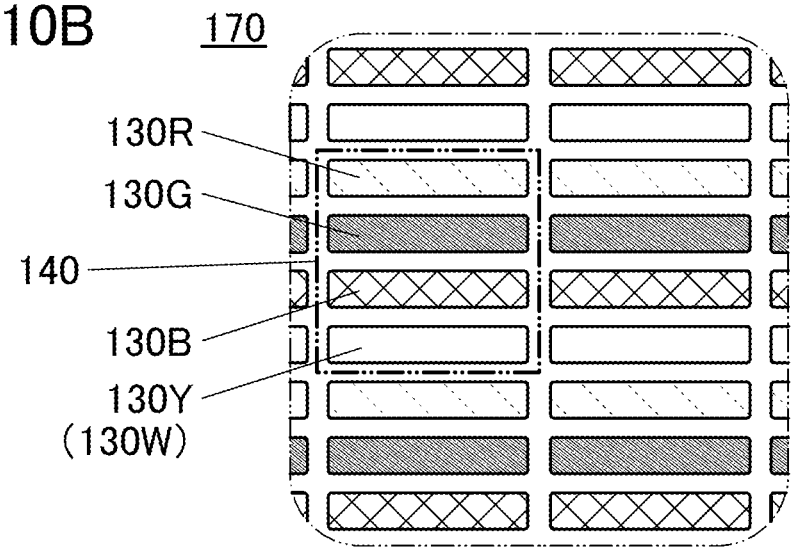
Figure 10C:
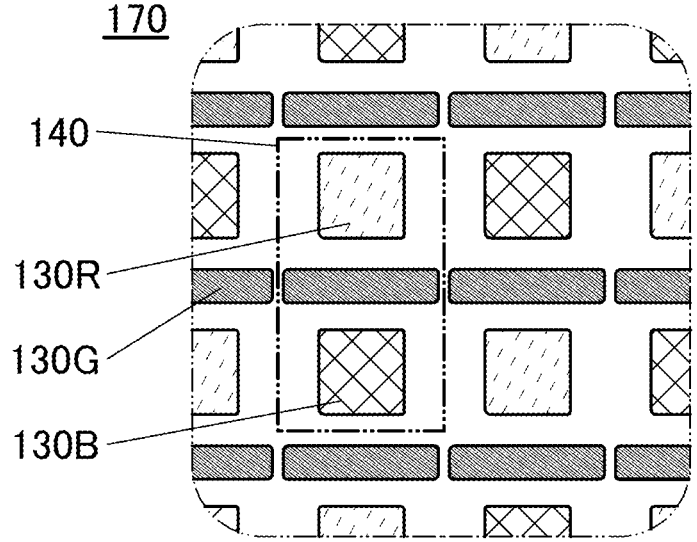

Here, examples of a pixel configuration for achieving color display are described with reference to FIGS. 10A to 10C. FIGS. 10A to 10C are enlarged plan views of a region 170 in the display region 131 of FIG. 1A.

As illustrated in FIG. 10A, for example, each pixel 130 may function as a subpixel and three pixels 130 may be collectively used as one pixel 140. The use of a red, a green, and a blue coloring layers as the coloring layers 266 for the three pixels 130 enables full-color display. In FIG. 10A, the pixel 130 emitting red light, the pixel 130 emitting green light, and the pixel 130 emitting blue light are illustrated as a pixel 130R, a pixel 130G, and a pixel 130B, respectively.

The colors of the coloring layers 266 may be a color other than red, green, and blue; for example, the colors of the coloring layer 266 may be yellow, cyan, magenta, or the like.

As illustrated in FIG. 10B, each pixel 130 may function as a subpixel and four pixels 130 may be collectively used as one pixel 140. For example, the coloring layers 266 corresponding to the four pixels 130 may be red, green, blue, and yellow. In FIG. 10B, the pixel 130 emitting red light, the pixel 130 emitting green light, the pixel 130 emitting blue light, and the pixel 130 emitting yellow light are illustrated as a pixel 130R, a pixel 130G, a pixel 130B, and a pixel 130Y, respectively. By increasing the number of subpixels (pixels 130) included in one pixel 140, the color reproducibility can be particularly improved. Thus, the display quality of the display device can be improved. With the pixel 130 emitting yellow light (pixel 130Y), the luminance of the display region can be increased. Accordingly, power consumption of the display device can be reduced.

Alternatively, the coloring layers 266 corresponding to the four pixels 130 may be red, green, blue, and white (see FIG. 10B). With the pixel 130 emitting white light (pixel 130W), the luminance of the display region can be increased. Accordingly, power consumption of the display device can be reduced.

Note that in the case where the pixel 130 emitting white light is provided, it is not necessary to provide the coloring layer 266 for the pixel 130W. Without a white coloring layer 266, there is no luminance reduction at the time of transmitting light through the coloring layer 266; thus, the luminance of the display region can be increased. Moreover, power consumption of the display device can be reduced. On the other hand, color temperature of white light can be changed with the white coloring layer 266. Thus, the display quality of the display device can be improved. Depending on the intended use of the display device, each pixel 130 may function as a subpixel and two pixels 130 may be collectively used as one pixel 140.

Note that the occupation areas or shapes of the pixels 130 may be the same or different. In addition, arrangement is not limited to stripe arrangement. For example, delta arrangement, Bayer arrangement, pentile arrangement, or the like can be used. FIG. 10C illustrates an example of pentile arrangement.

[Attachment of Element Substrate 171 and Counter Substrate 181]

Figure 11A:
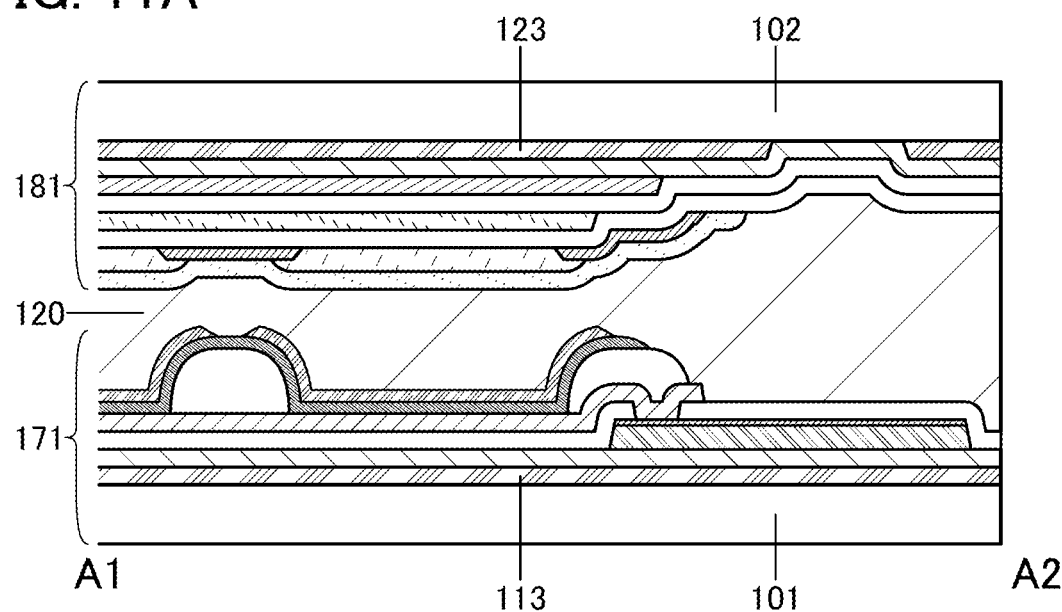
FIGS. 11A and 11B illustrate a manufacturing process of one embodiment of the present invention.
Figure 11B:
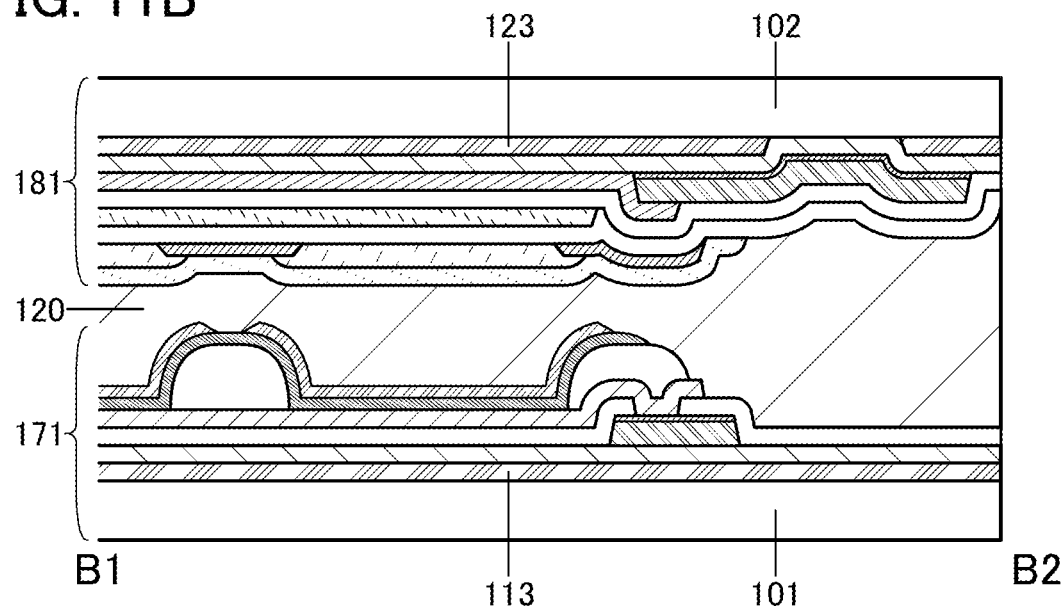

Next, the element substrate 171 and the counter substrate 181 are attached to each other with the bonding layer 120 positioned therebetween. At the attachment, the light-emitting element 125 on the element substrate 171 and the coloring layer 266 on the counter substrate 181 are disposed to face each other. FIG. 11A is a cross-sectional view taken along the dashed-dotted line A1-A2 in FIG. 1A. FIG. 11B is a cross-sectional view taken along the dashed-dotted line B1-B2 in FIG. 1A.

[Peeling of Substrate 101]

Figure 12A:
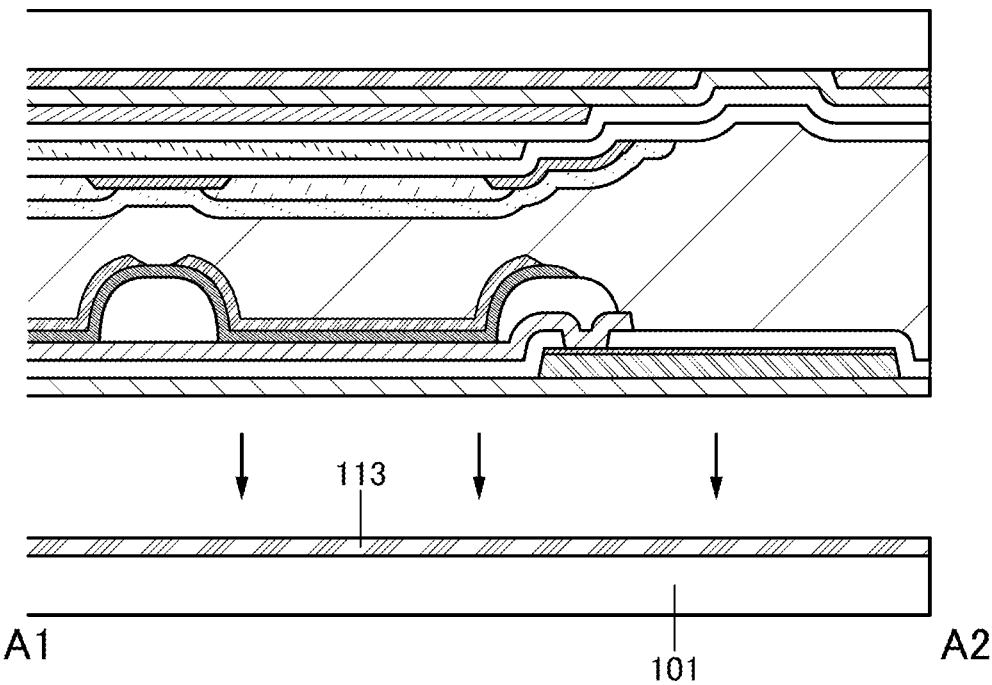
FIGS. 12A and 12B illustrate a manufacturing process of one embodiment of the present invention.
Figure 12B:
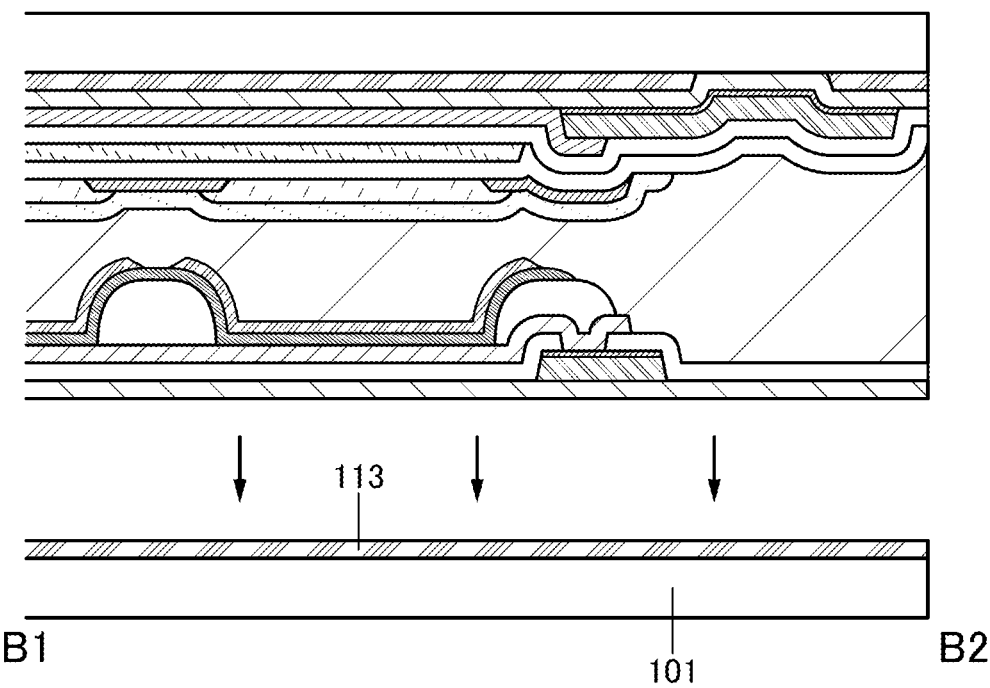

Next, the substrate 101 included in the element substrate 171 is peeled off from the insulating layer 119 together with the peeling layer 113 (see FIGS. 12A and 12B). As a peeling method, mechanical force (a peeling process with a human hand or a gripper, a separation process by rotation of a roller, ultrasonic waves, or the like) may be used. For example, a cut is made in the interface between the peeling layer 113 and the insulating layer 119 from the side surface of the element substrate 171 with a sharp edged tool, by laser beam irradiation, or the like, and water is injected into the cut. The interface between the peeling layer 113 and the insulating layer 119 absorbs water by capillarity action, so that the substrate 101 can be peeled off easily from the insulating layer 119 together with the peeling layer 113.

[Attachment of Substrate 111]

Figure 13A:
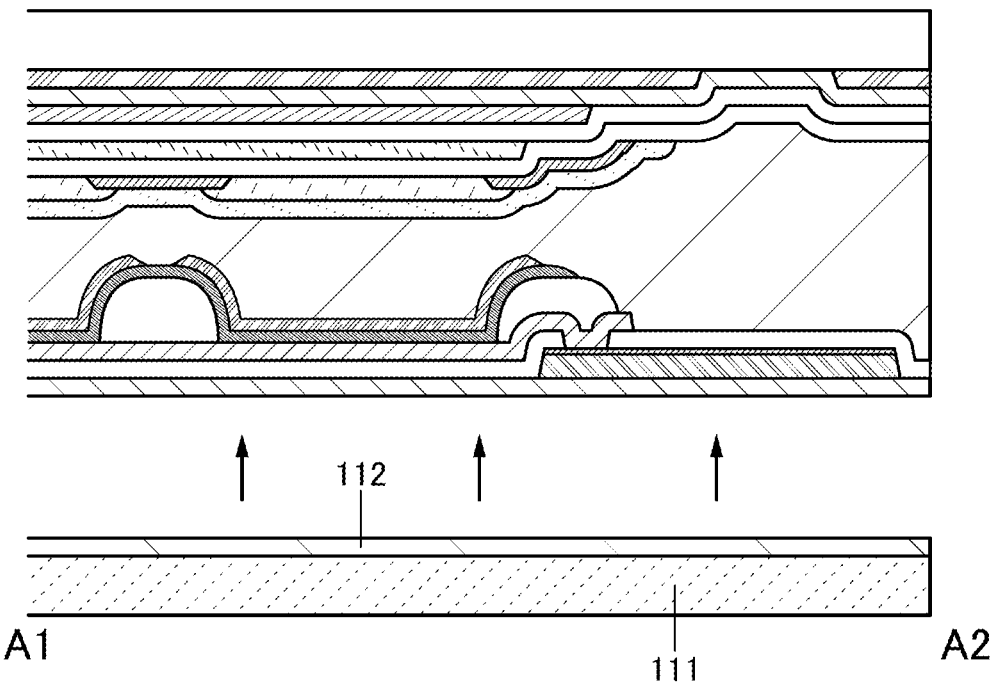
FIGS. 13A and 13B illustrate a manufacturing process of one embodiment of the present invention.
Figure 13B:
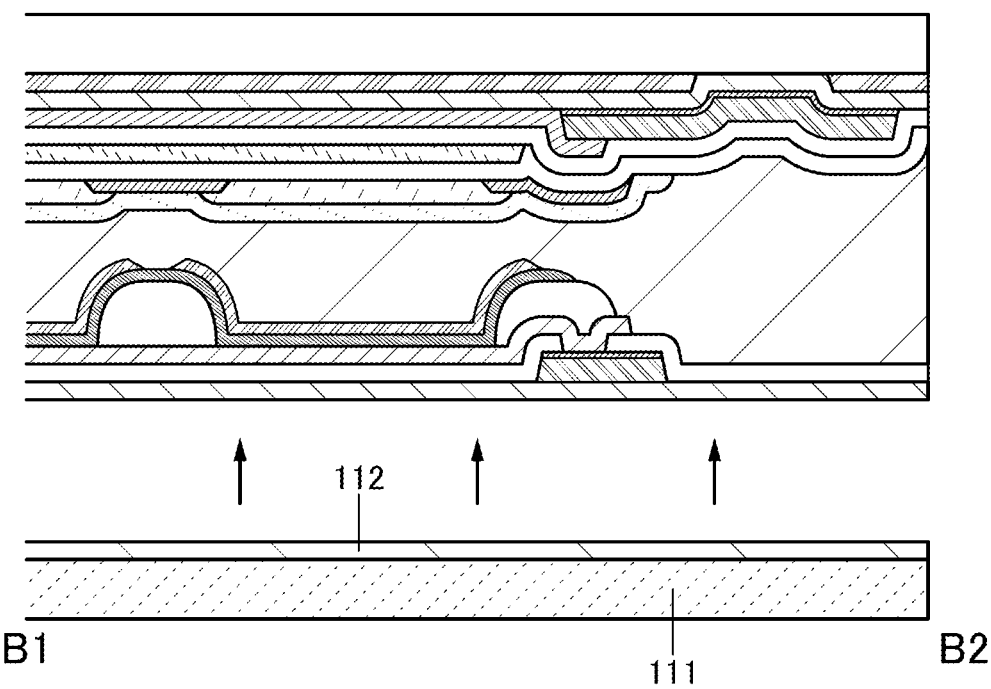

Next, the substrate 111 is attached to the insulating layer 119 with the bonding layer 112 provided therebetween (see FIGS. 13A and 13B).

[Peeling of Substrate 102]

Next, the substrate 102 included in the counter substrate 181 is peeled off from the insulating layer 129 together with the peeling layer 123.

Figure 14A:
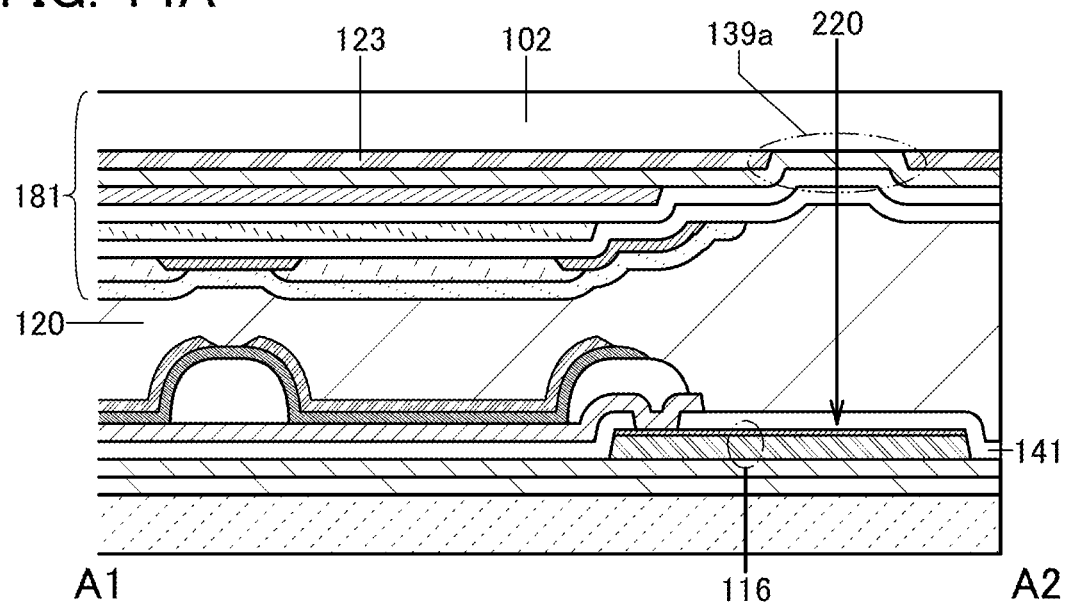
FIGS. 14A and 14B illustrate a manufacturing process of one embodiment of the present invention.
Figure 14B:
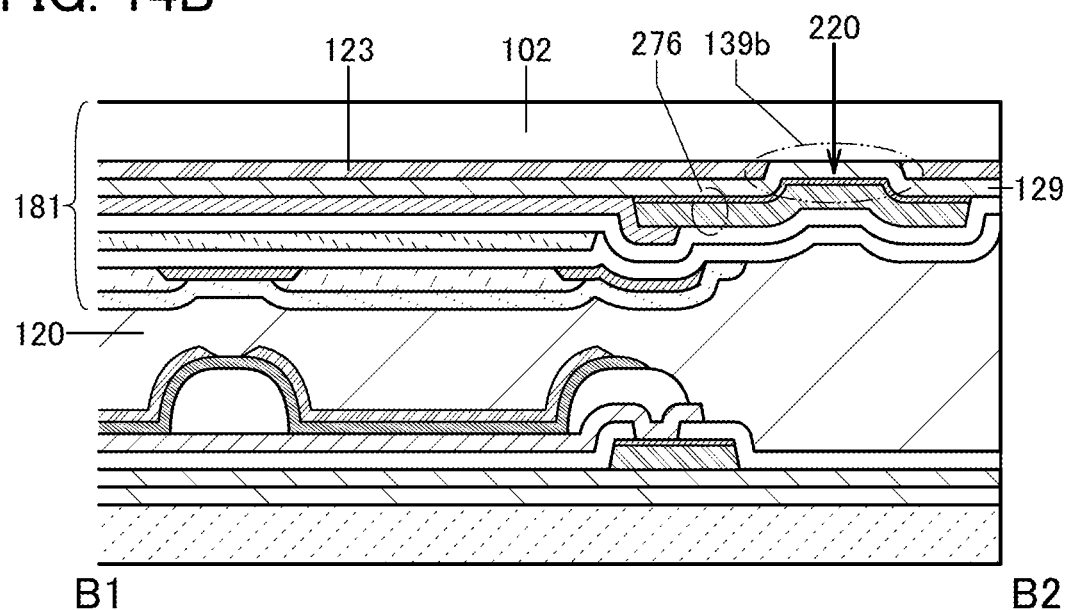

Note that before the substrate 102 is peeled off, at least part of the electrode 116 may be irradiated with light 220 through the opening 139a as illustrated in FIG. 14A. At least part of the electrode 276 may be irradiated with the light 220 through the opening 139b as illustrated in FIG. 14B. As the light 220, infrared light, visible light, or ultraviolet light emitted from a halogen lamp, a high pressure mercury lamp, or the like can be used. In addition, as the light 220, intense light such as a continuous wave laser beam or a pulsed laser beam can be used. In particular, the pulsed laser beam is preferable because pulsed laser beam with high energy can be emitted instantaneously. The wavelength of the light 220 is preferably 400 nm to 1.2 μm, further preferably 500 nm to 900 nm, or still further preferably 500 nm to 700 nm. In the case of the pulsed laser beam used as the light 220, the pulse width is preferably 1 ns (nanosecond) to 1 μs (microsecond), further preferably 5 ns to 500 ns, or still further preferably 5 ns to 100 ns. For example, a pulsed laser beam with the wavelength of 532 nm and the pulse width of 10 ns may be used.

By irradiation with the light 220, the temperature of the electrodes 116 and 276 rises, and adhesion between the electrode 116 and the insulating layer 141 is lowered because of thermal stress, emission of gas that remains in the layer, or the like. In addition, adhesion between the electrode 276 and the insulating layer 129 is lowered. As a result, the insulating layer 141 is easily peeled off from the electrode 116, and the insulating layer 129 is easily peeled off from the electrode 276.

Figure 15A:
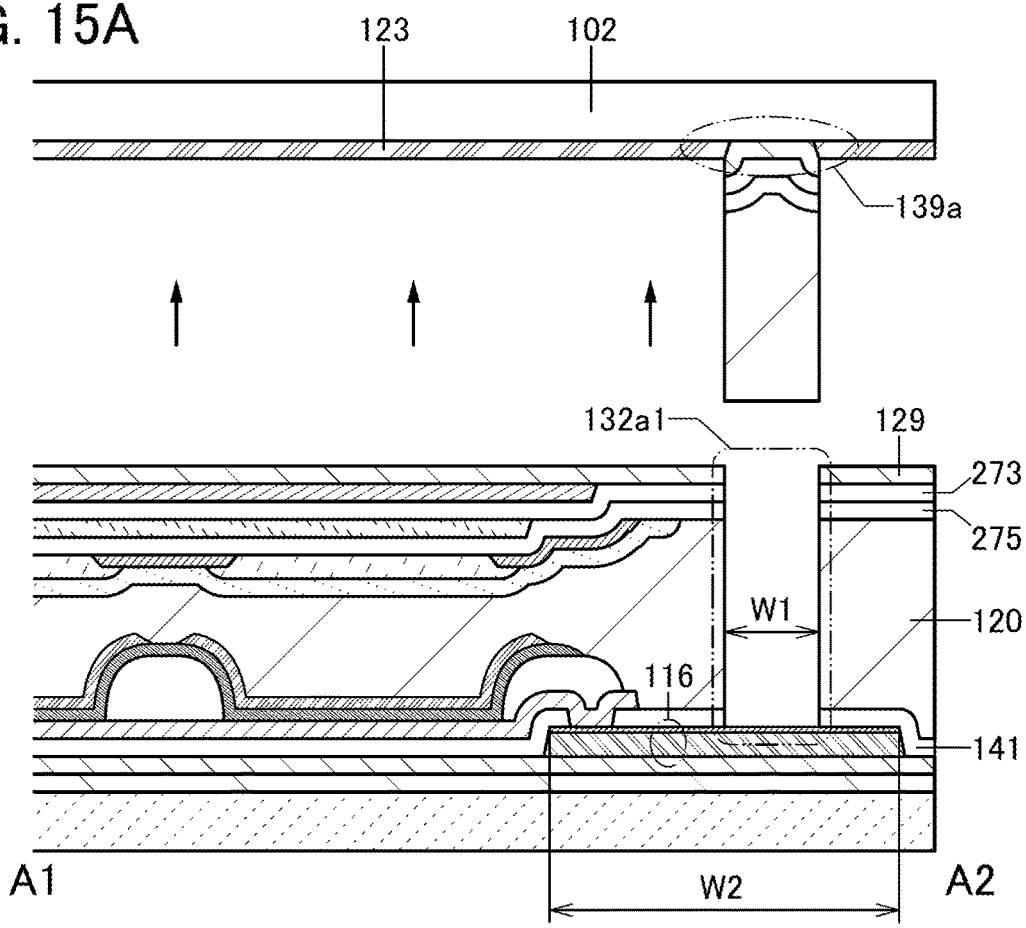
FIGS. 15A and 15B illustrate a manufacturing process of one embodiment of the present invention.
Figure 15B:
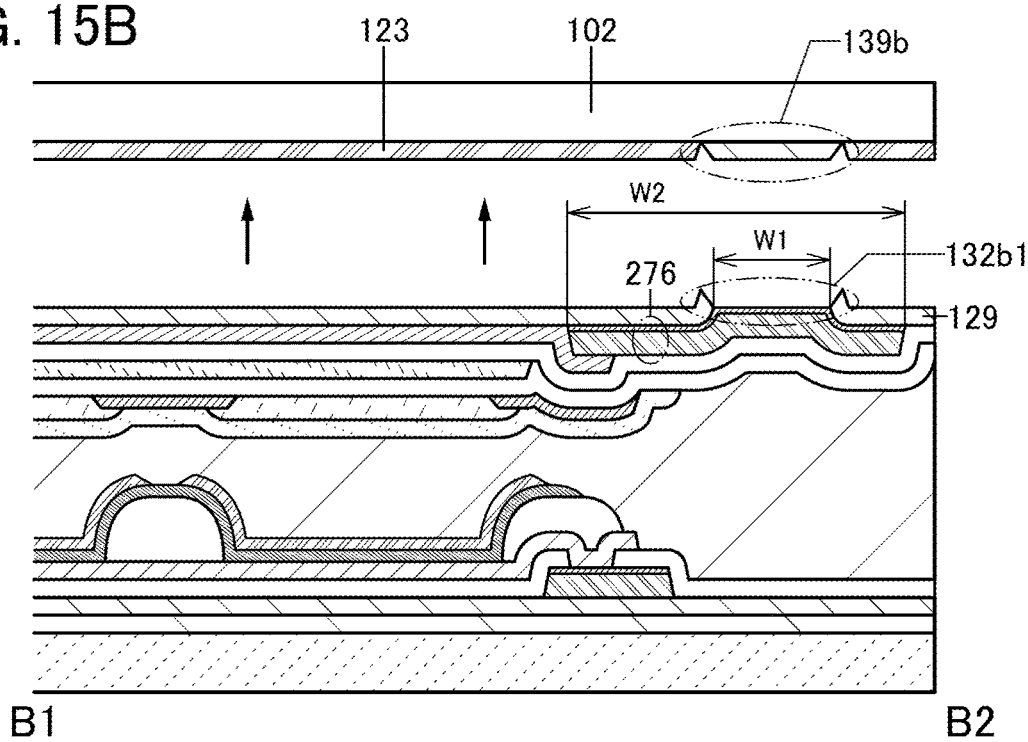

FIGS. 15A and 15B illustrate a state in which the substrate 102 included in the counter substrate 181, together with the peeling layer 123, is peeled off from the insulating layer 129. At this time, part of the insulating layer 129, part of the insulating layer 273, part of the insulating layer 275, part of the bonding layer 120, and part of the insulating layer 141, which are regions overlapping with the opening 139a, are removed to form an opening 132a1. The opening 132a1 is preferably formed inside the electrode 116 in the plan view. In other words, opening 132a1 is preferably formed on the inner side than the end portions of the electrode 116 in the cross-sectional view. That is, the width W1 of the opening 132a1 is preferably smaller than the width W2 of the surface of the electrode 116 (see FIG. 15A).

Part of the insulating layer 129, which is a region overlapping with the opening 139b, is also removed to form an opening 132b1. The opening 132b1 is preferably formed inside the electrode 276 in the plan view. In other words, opening 132b1 is preferably formed on the inner side than the end portions of the electrode 276 in the cross-sectional view. That is, the width W1 of the opening 132b1 is preferably smaller than the width W2 of the surface of the electrode 276 (see FIG. 15B).

At the step of peeling the substrate 102 together with the peeling layer 123, the opening 132a1 and the opening 132b1 can be formed at the same time. In one embodiment of the present invention, the steps of manufacturing the display device can be reduced, which increases the productivity of the display device.

[Attachment of Substrate 121]

Figure 16A:
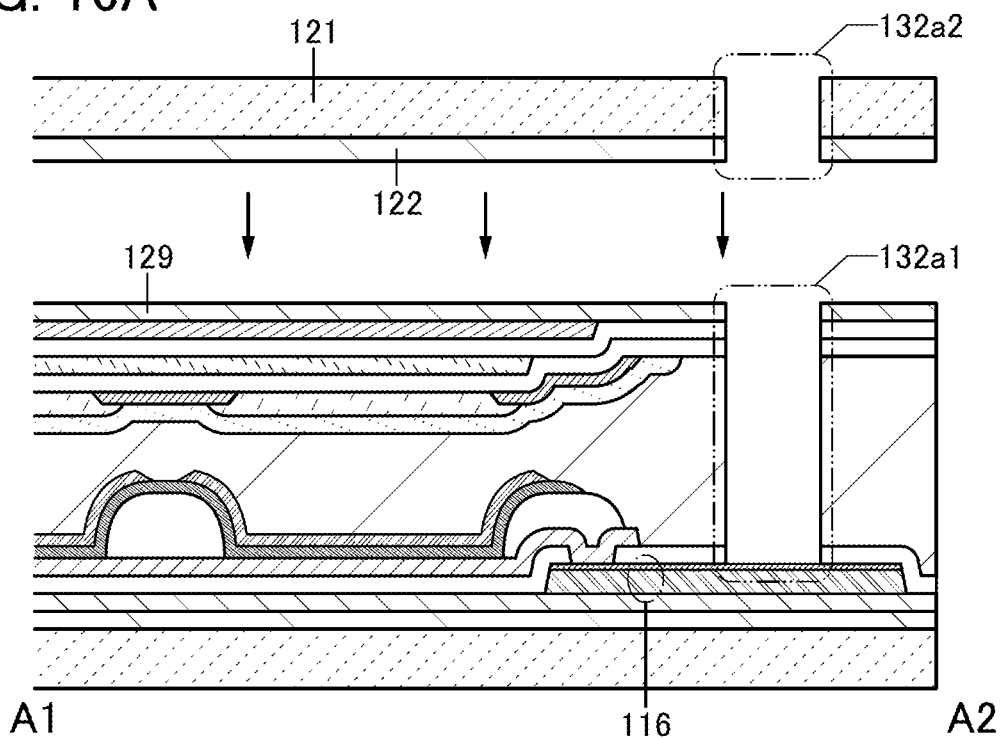
FIGS. 16A and 16B illustrate a manufacturing process of one embodiment of the present invention.
Figure 16B:
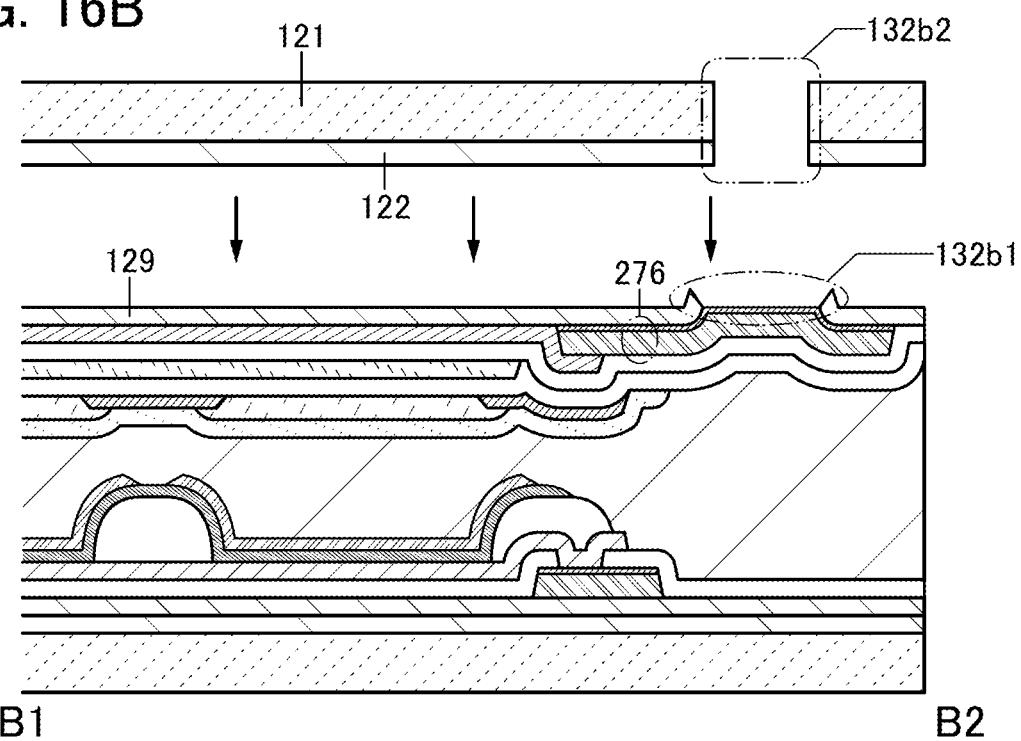

Next, the substrate 121 having an opening 132a2 and an opening 132b2 is attached to the insulating layer 129 with the bonding layer 122 provided therebetween (see FIGS. 16A and 16B). The substrate 121 and the insulating layer 129 are attached to each other so that the opening 132a1 overlaps with the opening 132a2 and the opening 132b1 overlaps with the opening 132b2. In this embodiment, the openings 132a1 and 132a2 are collectively referred to as an opening 132a, and the openings 132b1 and opening 132b2 are collectively referred to as an opening 132b. The surface of the electrode 116 is exposed from the opening 132a. The surface of the electrode 276 is exposed from the opening 132b.

Figure 17A:
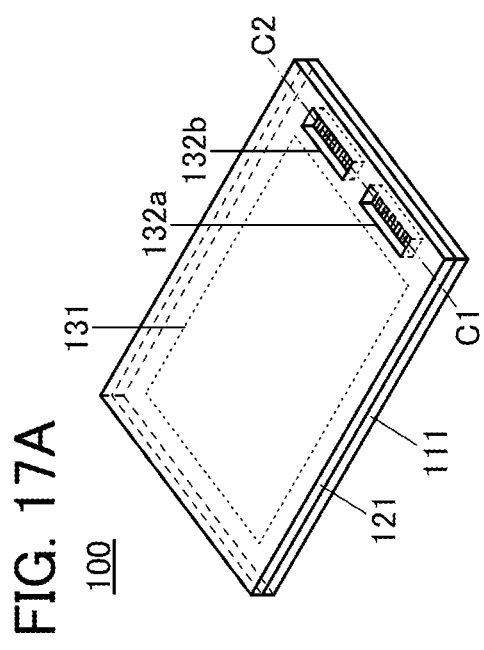
FIGS. 17A and 17B are a perspective view and a cross-sectional view illustrating one embodiment of the present invention.
Figure 17B:
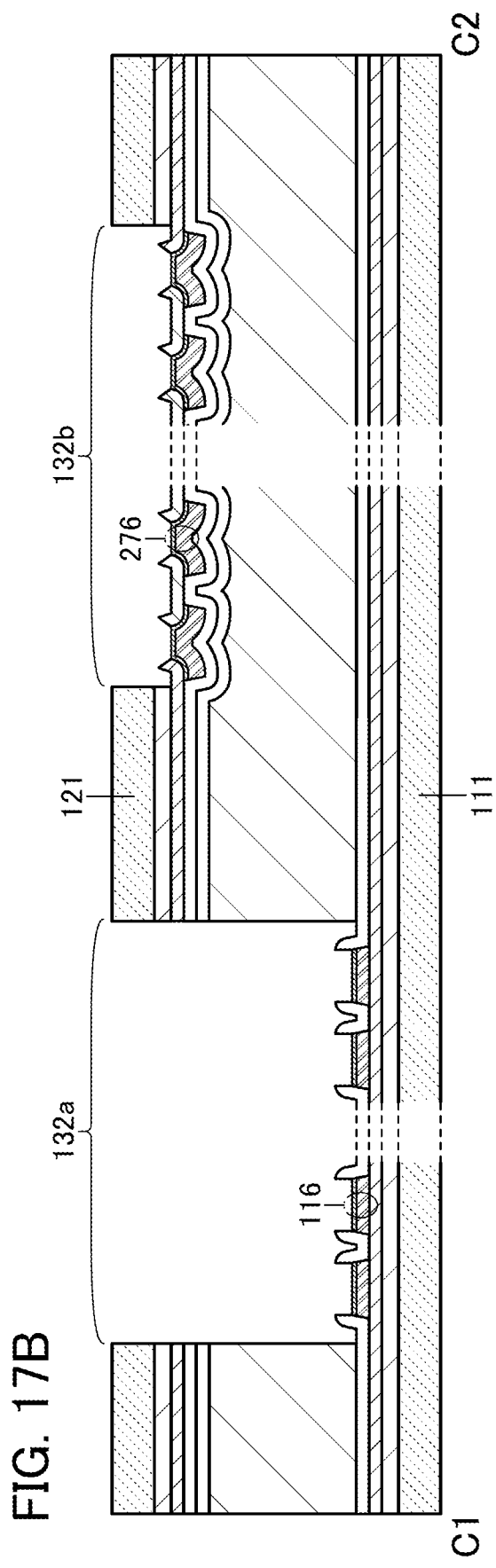

In the display device 100 of one embodiment of the present invention, the opening 132a may overlap with one or more electrodes 116, and the opening 132b may overlap with one or more electrodes 276. FIG. 17A is a perspective view of the display device 100 that includes two or more electrodes 116 that overlaps with the opening 132a and two or more electrodes 276 that overlaps with the opening 132b. Note that FIG. 17B is a cross-sectional view taken along the dashed-dotted line C1-C2 in FIG. 17A.

Figure 18A:
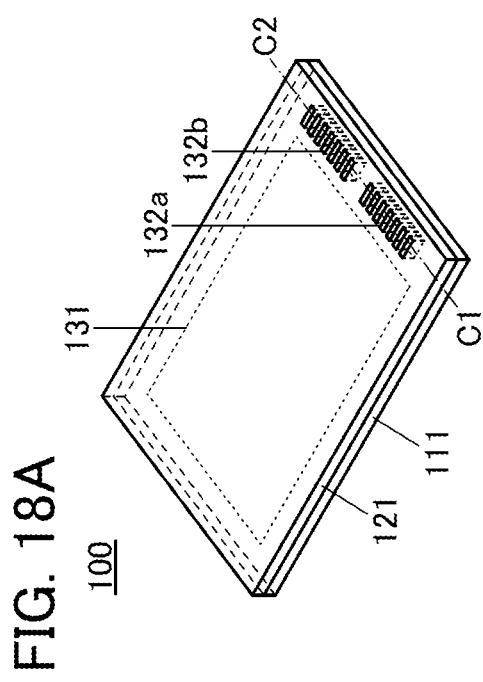
FIGS. 18A and 18B are a perspective view and a cross-sectional view illustrating one embodiment of the present invention.
Figure 18B:
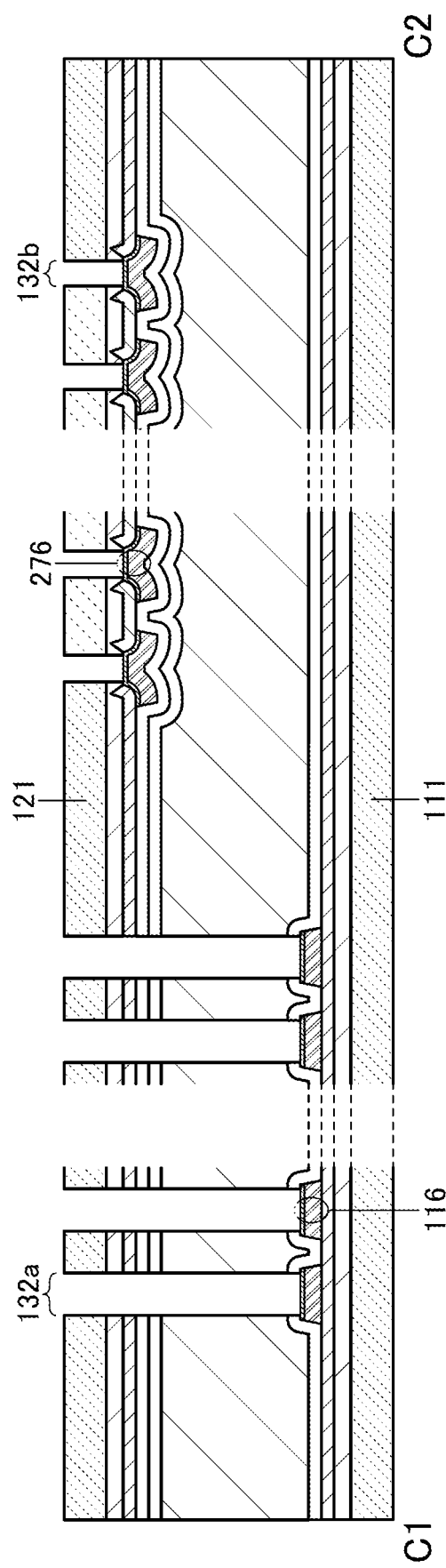

The display device 100 of one embodiment of the present invention may include the opening 132a with respect to each of the electrodes 116, and the opening 132b with respect to each of the electrodes 276. That is, the display device 100 of one embodiment of the present invention may include two or more openings 132a and two or more openings 132b. FIG. 18A is a perspective view of the display device 100 in which the opening 132a overlapping with the electrode 116 is provided in each electrode 116, and the opening 132b overlapping with the electrode 276 is provided in each electrode 276. Note that FIG. 18B is a cross-sectional view taken along the dashed-dotted line C1-C2 in FIG. 18A.

Figure 19A:
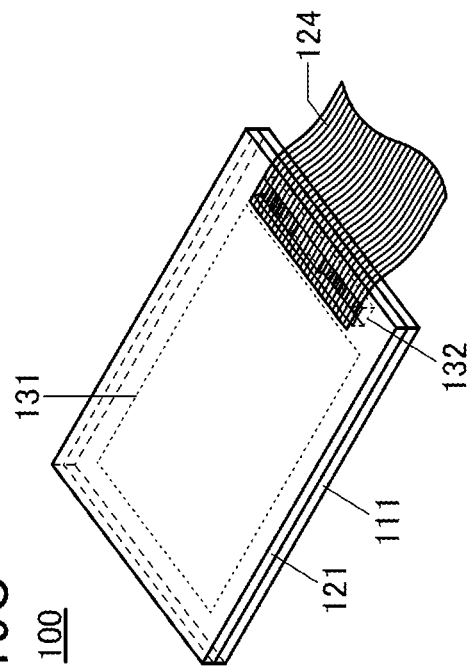
FIGS. 19A and 19C are perspective views and a cross-sectional view illustrating one embodiment of the present invention.
Figure 19C:
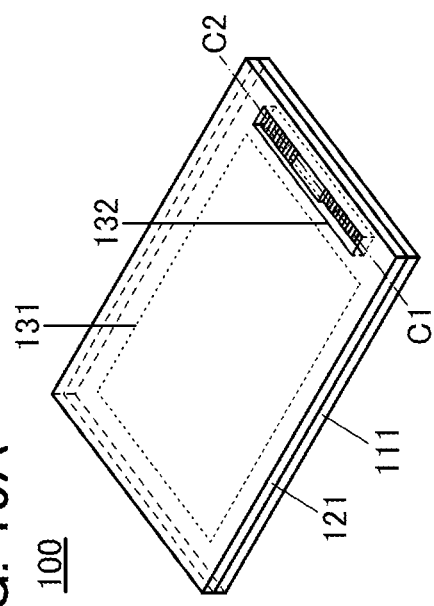
Figure 19B:
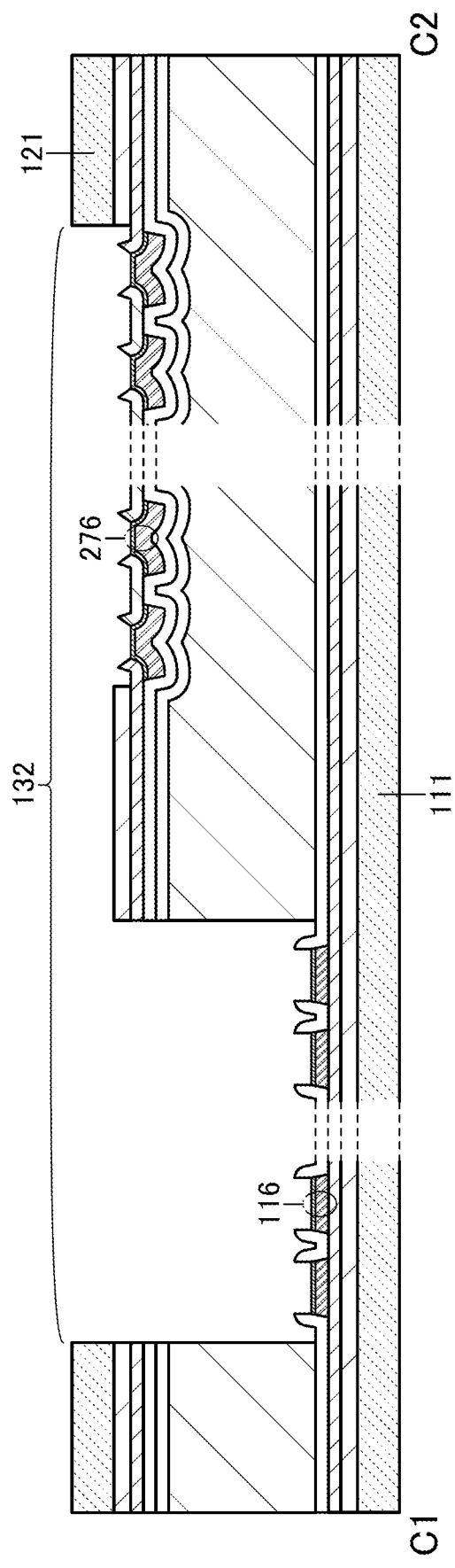

Alternatively, the display device 100 of one embodiment of the present invention may have a structure in which an opening 132 that overlaps with the electrodes 116 and the electrodes 276 is provided. FIG. 19A is a perspective view of the display device 100 in which the opening 132 that overlaps with the electrodes 116 and the electrodes 276 is provided. FIG. 19B is a cross-sectional view taken along the dashed-dotted line C1-C2 in FIG. 19A. FIG. 19C is a perspective view illustrating a state in which the external electrode 124 is electrically connected to the electrodes 116 and the electrodes 276 through the opening 132. Note that the external electrode 124 may be electrically connected to the electrode 116 and the electrode 276 through an anisotropic conductive layer.

The openings 132a and 132b are provided on the inner side than the end portion of the substrate 121 in a plan view, so that regions near the openings 132a and 132b can be supported by the substrate 111 and the substrate 121. Thus, the mechanical strength of a region where the external electrode 124 and the electrode 116 are connected to each other is unlikely to decrease, and unintentional deformation of the connected region can be reduced. Furthermore, since a wiring or the like near the opening 132a and/or the opening 132b is sandwiched by the substrate 111 and the substrate 121, the wiring or the like is unlikely to be affected by external shock or external deformation. Accordingly, damage to the wiring or the like can be prevented. Note that an effect of reducing the deformation of the connected region can be improved in the case where the opening 132a is provided for each electrode 116 as compared with the case where a plurality of electrodes 116 are provided in one opening 132a. According to one embodiment of the present invention, breakage of the display device 100 can be prevented, and the reliability of the display device 100 can be improved.

Moreover, in one embodiment of the present invention, part of the flexible substrate does not need to be removed by a laser beam or with an edged tool to expose the surfaces of the electrodes 116 and 276; thus, the electrodes 116 and 276, the display region 131 and the like are not damaged easily.

In addition, the opening 132a and the opening 132b can be formed at the same time, which increases the productivity of the display device.

Alternatively, one or more of layers each formed using a material having a specific function, such as an anti-reflection layer, a light diffusion layer, a microlens array, a prism sheet, a retardation plate, or a polarizing plate, (hereinafter referred to as "functional layers") may be provided on an outer side than the substrate 111 or the substrate 121 from which the light 151 is emitted. As the anti-reflection layer, for example, a circularly polarizing plate or the like can be used. With the functional layer, a display device having a higher display quality can be achieved. Moreover, power consumption of the display device can be reduced.

For the substrate 111 or the substrate 121, a material having a specific function may be used. For example, a circularly polarizing plate may be used as the substrate 111 or the substrate 121. Alternatively, for example, the substrate 111 or the substrate 121 may be formed using a retardation plate, and a polarizing plate may be provided so as to overlap with the substrate. As another example, the substrate 111 or the substrate 121 may be formed using a prism sheet, and a circularly polarizing plate may be provided so as to overlap with the substrate. With the use of the material having a specific function for the substrate 111 or the substrate 121, improvement of display quality and reduction of the manufacturing cost can be achieved.

[Formation of External Electrode]

Next, the anisotropic conductive connection layer 138a is formed in the opening 132a, and the external electrode 124a for inputting electric power or a signal to the display device 100 is formed over the anisotropic conductive connection layer 138a. Then, the anisotropic conductive connection layer 138b is formed in the opening 132b, and the external electrode 124b for inputting electric power or a signal to the display device 100 is formed over the anisotropic conductive connection layer 138b (see FIGS. 1A to 1C). By electrical connection between the external electrode 124a and the terminal electrode 116 through the anisotropic conductive connection layer 138a, electric power or a signal can be input to the display device 100. By electrical connection between the external electrode 124b and the terminal electrode 276 through the anisotropic conductive connection layer 138b, electric power or a signal can be input to the display device 100.

In one embodiment of the present invention, the electrode 116 and the electrode 276 can be exposed on the same surface side of the display device 100 (in this embodiment, on the substrate 121 side). This enables easy connections between the external electrode 124a and the electrode 116 and between the external electrode 124b and the electrode 276. For example, the connections can be performed at the same step. Thus, the manufacturing yield of the display device can be increased. Furthermore, the steps of manufacturing the display device can be reduced, which increases the productivity of the display device.

Note that FPCs can be used as the external electrodes 124a and 124b. Alternatively, a metal wire can be used as the external electrodes 124a and 124b. Although the anisotropic conductive connection layer may be used to connect the metal wire and the electrode 116 or the electrode 276, the connection can be made by a wire bonding method. Alternatively, the metal wire and the electrode 116 or the electrode 276 can be connected by a soldering method.

In one embodiment of the present invention, external electrodes such as the external electrode 124a and the external electrode 124b can be provided on one surface of the display device 100, whereby the design flexibility of the display device can be increased. Furthermore, the design flexibility of a semiconductor device including the display device 100 of one embodiment of the present invention can be increased.

This embodiment can be implemented in an appropriate combination with any of the structures described in the other embodiments.

Embodiment 2

In this embodiment, a display device 1100 having a structure different from the structure of the display device 100 described in the above embodiment is described. In this embodiment, a description is made of portions different from the display device 100 to avoid repetition of the same description.

The display device 1100 described in this embodiment is different from the display device 100 in connection portions of the external electrodes 124 (the external electrode 124a, external electrode 124b). Specifically, in the display device 100, the external electrode 124 is connected from the substrate 121 side, while in the display device 1100, the external electrode 124 is connected from the substrate 111 side. In addition, the stacking order of the electrode 116a and the electrode 116b in the display device 1100 is different from that in the display device 100. The stacking order of the electrode 276a and the electrode 276b in the display device 1100 is different from that in the display device 100.

<Structure of Display Device>

A structure example of the display device 1100 of one embodiment of the present invention is described with reference to FIGS. 20A to 20C, FIGS. 21A and 21B, FIGS. 22A and 22B, and FIGS. 23A to 23C. FIG. 20A is a perspective view of the display device 1100. FIG. 20B is a cross-sectional view taken along the dashed-dotted line A1-A2 in FIG. 20A. FIG. 20C is a cross-sectional view taken along the dashed-dotted line B1-B2 in FIG. 20A.

The display device 1100 described in this embodiment includes the opening 132a that penetrates the substrate 111, the bonding layer 112, and the insulating layer 119 and overlaps with the electrode 116. The display device 1100 further includes an opening 132b that penetrates the substrate 111, the bonding layer 112, the insulating layer 119, the insulating layer 141, the bonding layer 120, the insulating layer 275, and the insulating layer 273 and that overlaps with the electrode 276.

In the opening 132a, an external electrode 124a and the electrode 116 are electrically connected to each other through an anisotropic conductive connection layer 138a. In the opening 132b, an external electrode 124b and the electrode 276 are electrically connected to each other through an anisotropic conductive connection layer 138b.

As in the display device 100, a switching element having a function of supplying a signal to the light-emitting element 125 may be provided between the light-emitting element 125 and the electrode 116. For example, a transistor may be provided between the light-emitting element 125 and the electrode 116.

Figure 21A:
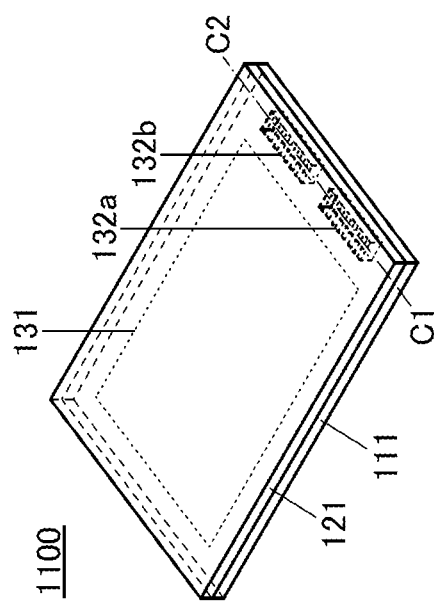
FIGS. 21A and 21B are a perspective view and a cross-sectional view illustrating one embodiment of the present invention.
Figure 21B:
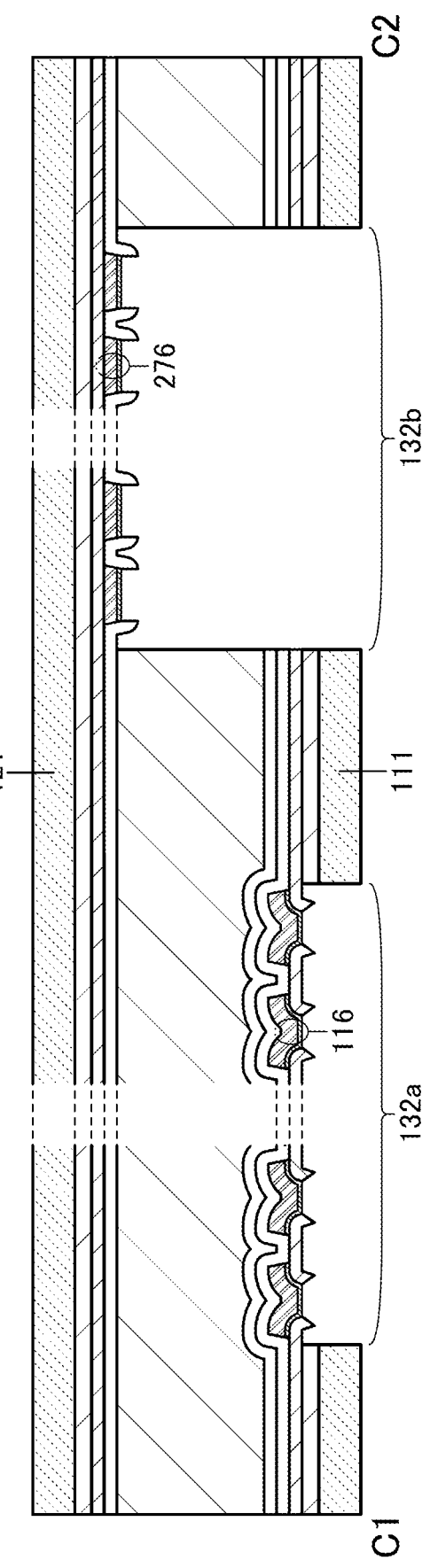

As in the display device 100, in the display device 1100 of one embodiment of the present invention, the opening 132a may overlap with one or more electrodes 116, and the opening 132b may overlap with one or more electrodes 276. FIG. 21A is a perspective view of the display device 1100 that includes two or more electrodes 116 that overlaps with the opening 132a and two or more electrodes 276 that overlaps with the opening 132b. Note that FIG. 21B is a cross-sectional view taken along the dashed-dotted line C1-C2 in FIG. 21A.

Figure 22A:
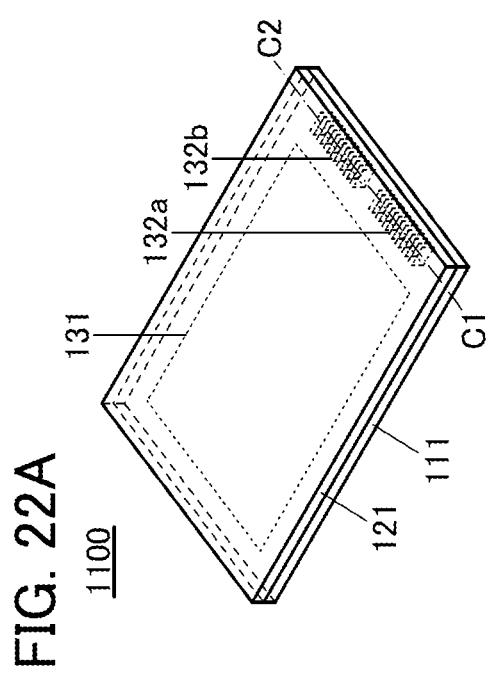
FIGS. 22A and 22B are a perspective view and a cross-sectional view illustrating one embodiment of the present invention.
Figure 22B:
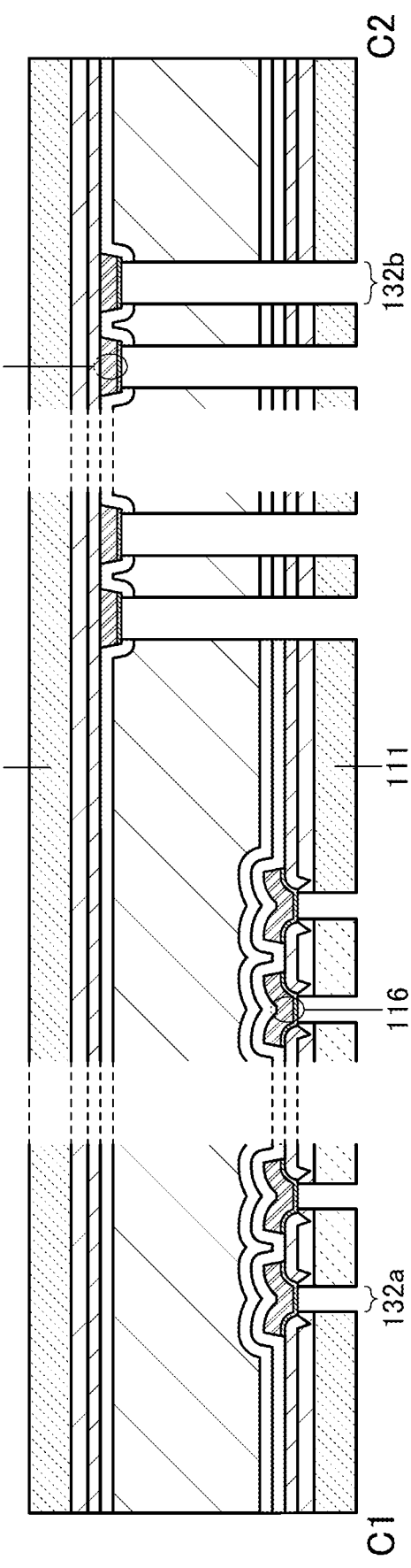

Like the display device 100, the display device 1100 of one embodiment of the present invention may include the opening 132a with respect to each of the electrodes 116, and the opening 132b with respect to each of the electrodes 276. That is, the display device 1100 of one embodiment of the present invention may include two or more openings 132a and two or more openings 132b. FIG. 22A is a perspective view of the display device 1100 in which the opening 132a overlapping with the electrode 116 is provided in each electrode 116, and the opening 132b overlapping with the electrode 276 is provided in each electrode 276. Note that FIG. 22B is a cross-sectional view taken along the dashed-dotted line C1-C2 in FIG. 22A.

Figure 23A:
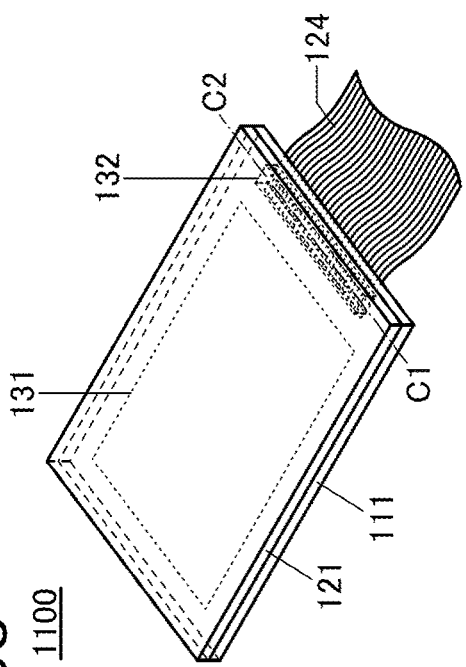
FIGS. 23A to 23C are perspective views and a cross-sectional view illustrating one embodiment of the present invention.
Figure 23C:
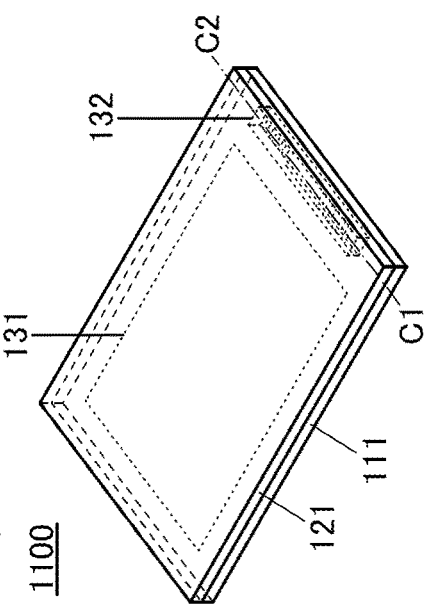
Figure 23B:
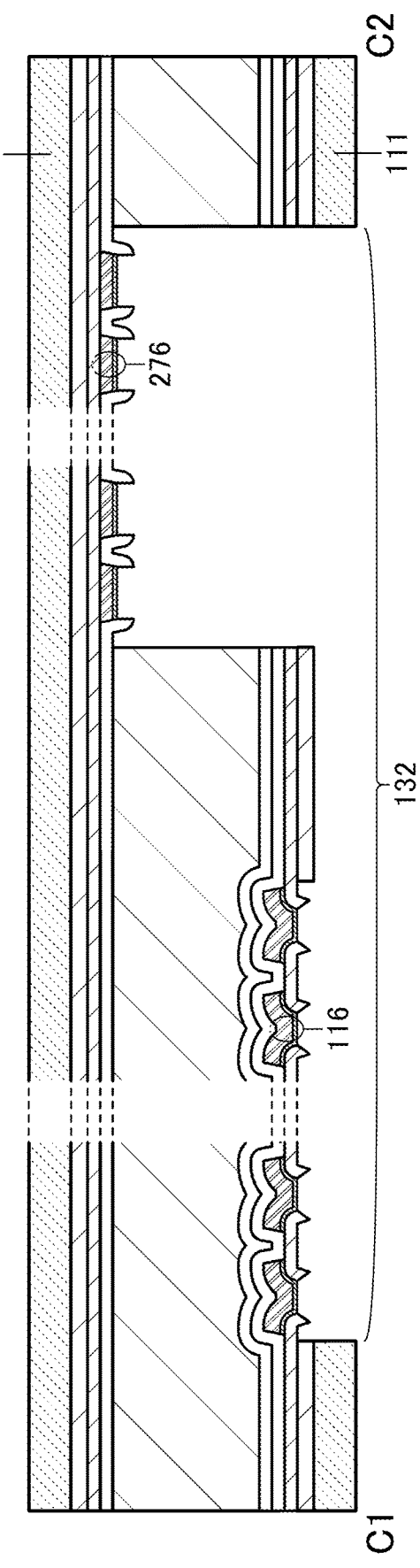

Like the display device 100, the display device 1100 of one embodiment of the present invention may have a structure in which an opening 132 that overlaps with the electrodes 116 and the electrodes 276 is provided. FIG. 23A is a perspective view of the display device 1100 in which the opening 132 that overlaps with the electrodes 116 and the electrodes 276 is provided. FIG. 23B is a cross-sectional view taken along the dashed-dotted line C1-C2 in FIG. 23A. FIG. 23C is a perspective view illustrating a state in which the external electrode 124 is electrically connected to the electrodes 116 and the electrodes 276 through the opening 132. Note that the external electrode 124 may be electrically connected to the electrode 116 and the electrode 276 through an anisotropic conductive layer.

<Method of Manufacturing Display Device>

Next, an example of a method of manufacturing the display device 1100 is described with reference to FIGS. 24A to 24D, FIGS. 25A to 25D, FIGS. 26A to 26D, and FIGS. 27A and 27B. FIGS. 24A to 27B are cross-sectional views taken along the dashed-dotted line A1-A2 or B1-B2 in FIGS. 20A to 20C. First, a method of manufacturing an element substrate 1171 is described.

[Formation of Peeling Layer 113]

Figure 24A:
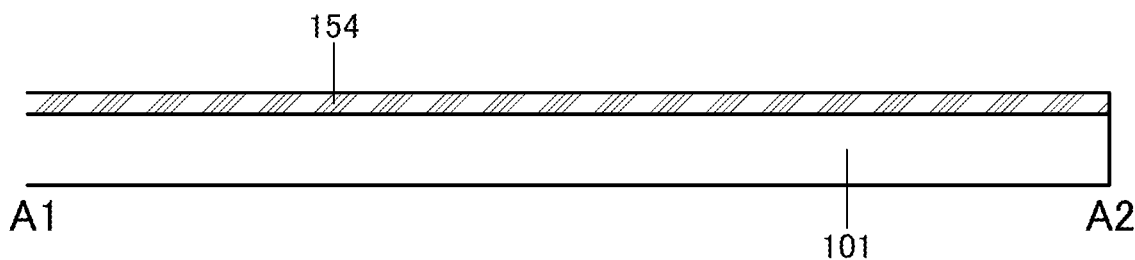
FIGS. 24A to 24D illustrate a manufacturing process of one embodiment of the present invention.
Figure 24B:
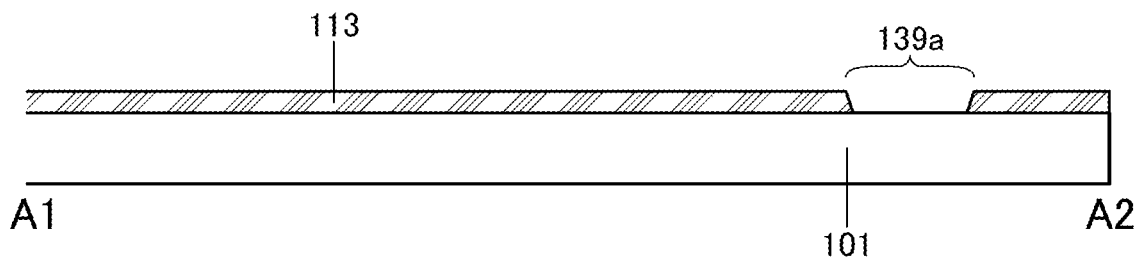

First, a peeling layer 154 is formed over the substrate 101 (see FIG. 24A). The peeling layer 154 can be formed with the same material and method as those of the peeling layer 113. Moreover, an insulating layer may be provided between the substrate 101 and the peeling layer 154.

Next, a resist mask is formed over the peeling layer 154, and part of the peeling layer 154 is selectively removed using the resist mask, whereby the peeling layer 113 having the opening 139a and the opening 139b (not illustrated in FIGS. 24A to 24D) is formed. The resist mask can be formed by a lithography method, a printing method, an inkjet method, or the like as appropriate. Formation of the resist mask by an inkjet method needs no photomask; thus, manufacturing cost can be reduced.

The etching of the peeling layer 154 may be performed by a dry etching method, a wet etching method, or both of them. After the etching treatment, the resist mask is removed (see FIG. 24B).

Note that it is preferable to expose the surface of the peeling layer 113 to an atmosphere containing oxygen or a plasma atmosphere containing oxygen after the formation of the peeling layer 113. Oxidizing the surface of the peeling layer 113 can facilitate peeling of the substrate 101 performed later.

[Formation of Insulating Layer 119]

Figure 24C:
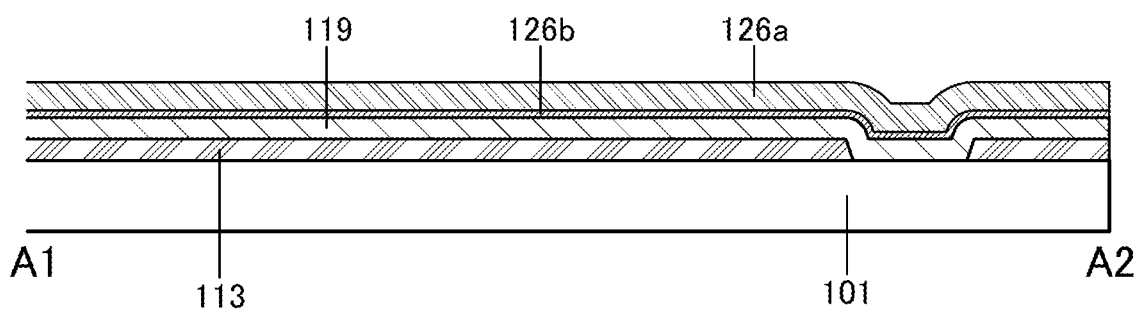
Figure 24D:
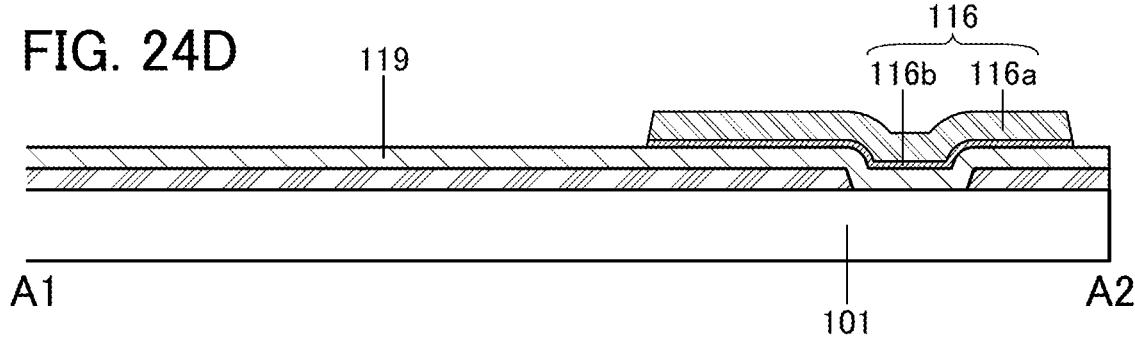

Next, the insulating layer 119 is formed over the peeling layer 113 (see FIG. 24C).

[Formation of Electrode 116]

Next, conductive layers 126b and 126a for forming the electrode 116 are formed over the insulating layer 119. First, a tungsten film is formed as the conductive layer 126b over the insulating layer 119 by a sputtering method. Next, three metal films (an aluminum film is sandwiched between two molybdenum films) are formed as the conductive layer 126a over the conductive layer 126b by a sputtering method (see FIG. 24C).

After that, a resist mask is formed over the conductive layer 126a, and the conductive layers 126b and 126a are etched into a desired shape using the resist mask. Thus, the electrode 116 (the electrodes 116b and 116a) can be formed (see FIG. 24D). The resist mask can be formed by a lithography method, a printing method, an inkjet method, or the like as appropriate. Formation of the resist mask by an inkjet method needs no photomask; thus, manufacturing cost can be reduced.

[Formation of Insulating Layer 141]

Figure 25A:
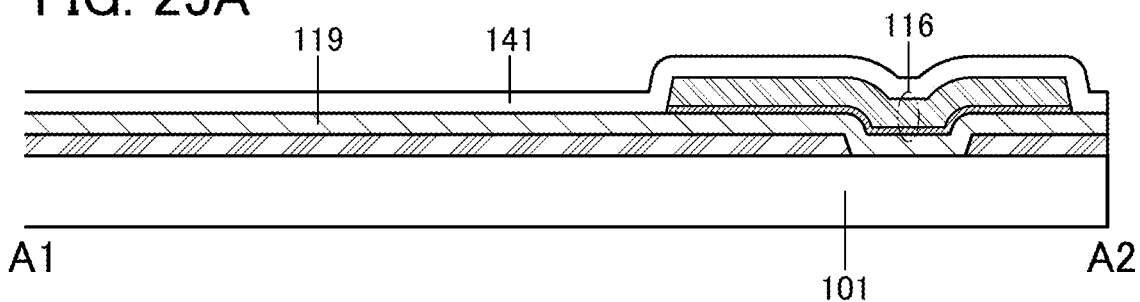
FIGS. 25A to 25D illustrate a manufacturing process of one embodiment of the present invention.
Figure 25B:
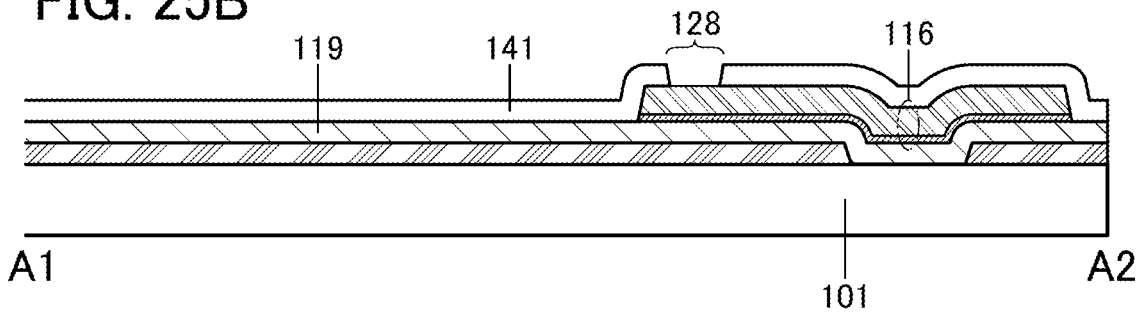

Next, the insulating layer 141 is formed over the electrode 116 (see FIG. 25A). Then, a resist mask is formed over the insulating layer 141, and part of the insulating layer 141 that overlaps with the electrode 116 is selectively removed using the resist mask, whereby the insulating layer 141 having the opening 128 is formed (see FIG. 25B).

Figure 25C:
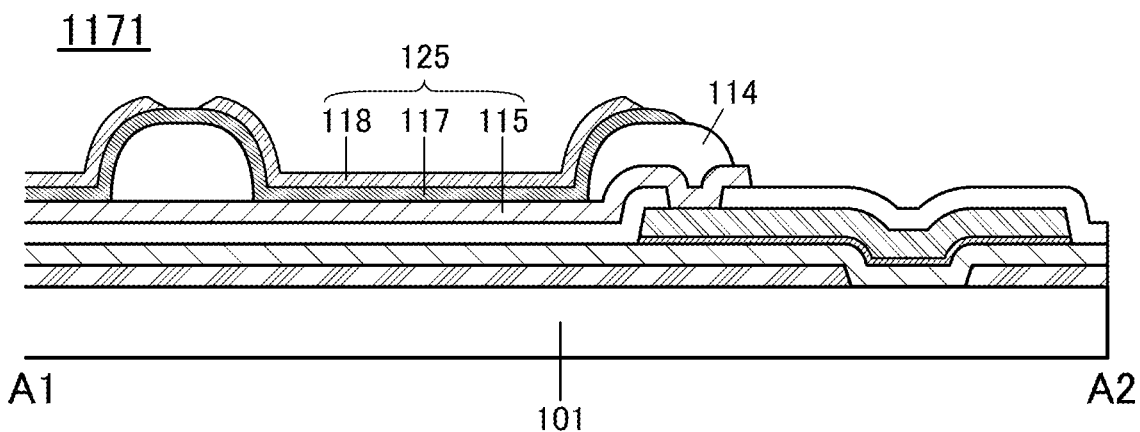
Figure 25D:
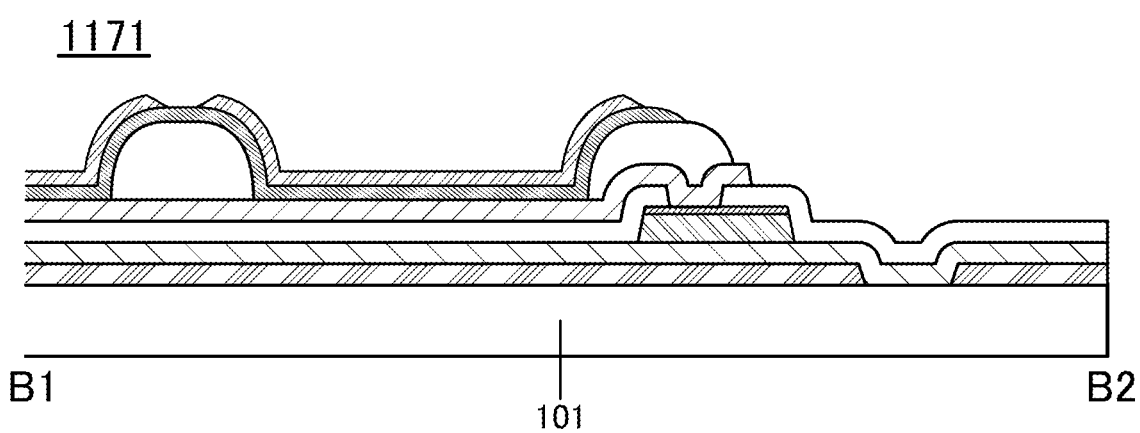

The following steps can be performed in a manner similar to those of the element substrate 171 described in the above embodiment. Thus, the element substrate 1171 can be formed. FIG. 25C is a cross-sectional view of the element substrate 1171 taken along the dashed-dotted line A1-A2 in FIG. 20A. FIG. 25D is a cross-sectional view of the element substrate 1171 taken along the dashed-dotted line B1-B2 in FIG. 20A.

Next, a method of forming a counter substrate 1181 is described.

[Formation of Peeling Layer 144]

Figure 26A:
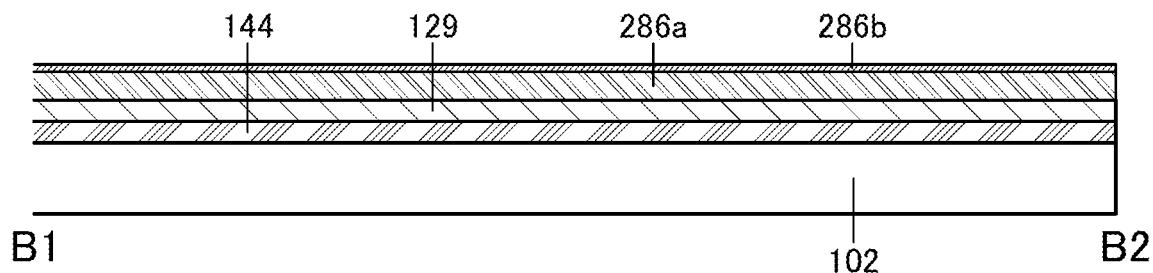
FIGS. 26A to 26D illustrate a manufacturing process of one embodiment of the present invention.
Figure 26B:
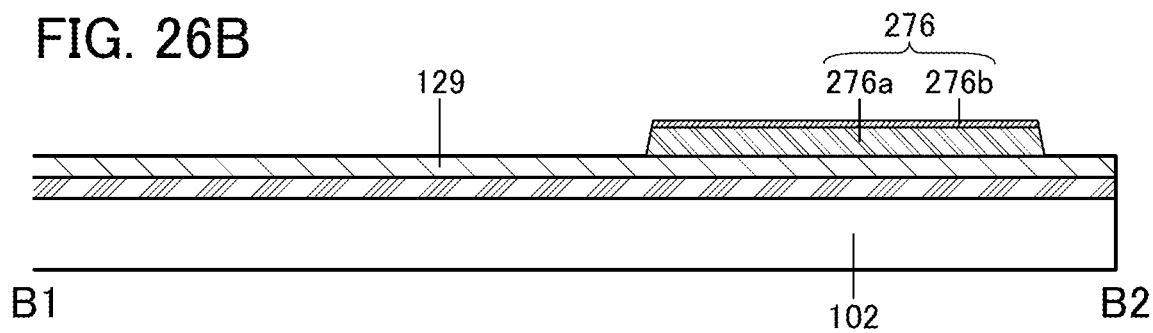
Figure 26C:
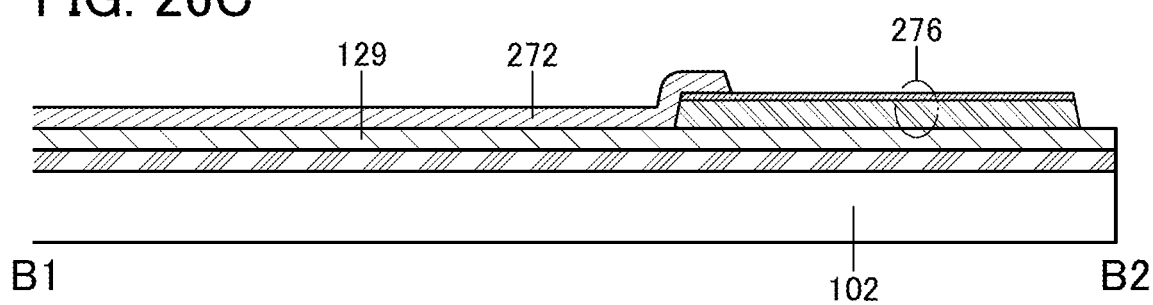

First, the peeling layer 144 is formed over the substrate 102 (see FIG. 26A). The peeling layer 144 can be formed with the same material and method as those of the peeling layer 113. Moreover, an insulating layer may be provided between the substrate 102 and the peeling layer 144.

Note that it is preferable to expose the surface of the peeling layer 144 to an atmosphere containing oxygen or a plasma atmosphere containing oxygen after the formation of the peeling layer 144. Oxidizing the surface of the peeling layer 144 can facilitate peeling of the substrate 102 performed later.

[Formation of Insulating Layer 129]

Next, the insulating layer 129 is formed over the peeling layer 144 (see FIG. 26A).

[Formation of Electrode 276]

Next, conductive layers 286a and 286b for forming the electrode 276 over the insulating layer 129 are formed. First, as the conductive layer 286a, a three-layer metal film in which an aluminum layer is provided between two molybdenum layers is formed over the insulating layer 129 by a sputtering method. Next, as the conductive layer 286b, a tungsten film is formed over the conductive layer 286a by a sputtering method (see FIG. 26A).

After that, a resist mask is formed over the conductive layer 286b, and the conductive layers 286a and 286b are etched into a desired shape using the resist mask. Thus, the electrode 276 (the electrodes 276a and 276b) can be formed. The resist mask can be formed by a lithography method, a printing method, an inkjet method, or the like as appropriate. Formation of the resist mask by an inkjet method needs no photomask; thus, manufacturing cost can be reduced (see FIG. 26B).

[Formation of Electrode 272]

Next, the electrode 272 that is electrically connected to the electrode 276 is formed over the insulating layer 129. The electrode 272 can be formed by forming a light-transmitting conductive layer over the insulating layer 129 and the electrode 276 and selectively etching part of the conductive layer (see FIG. 26C).

[Formation of Insulating Layer 273]

Figure 26D:
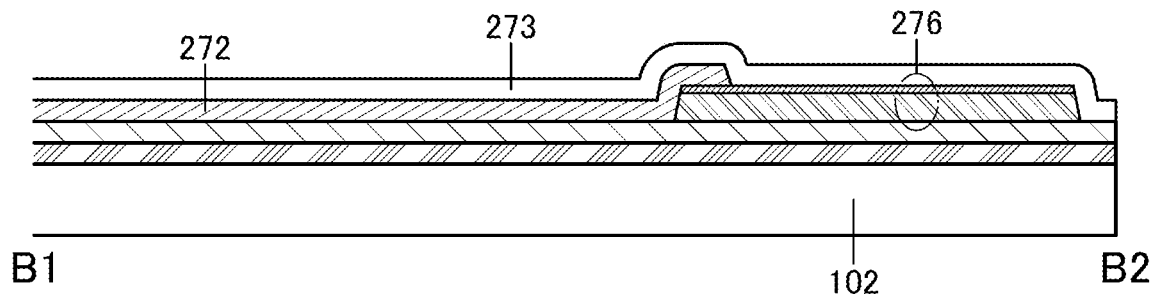

Next, the insulating layer 273 is formed over the electrode 272 and the electrode 276 (see FIG. 26D).

Figure 27A:
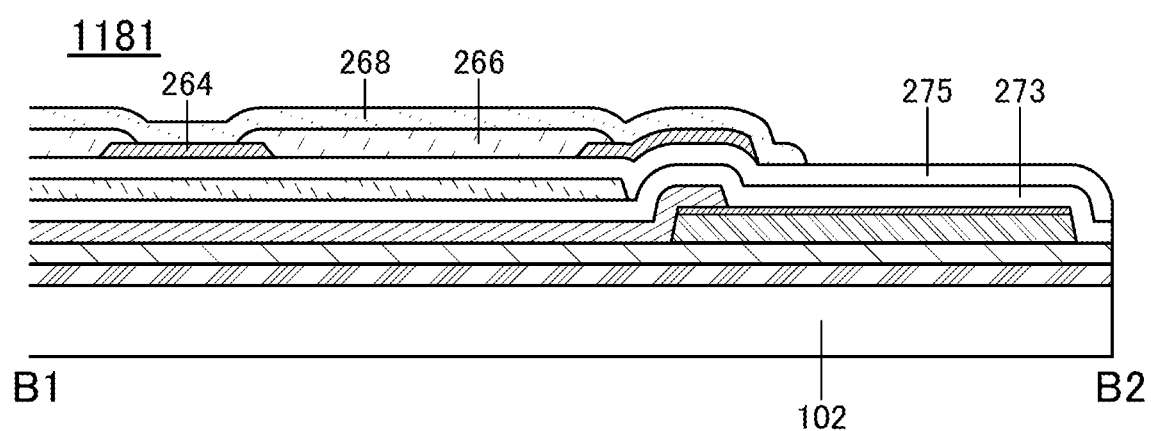
FIGS. 27A and 27B illustrate a manufacturing process of one embodiment of the present invention.
Figure 27B:
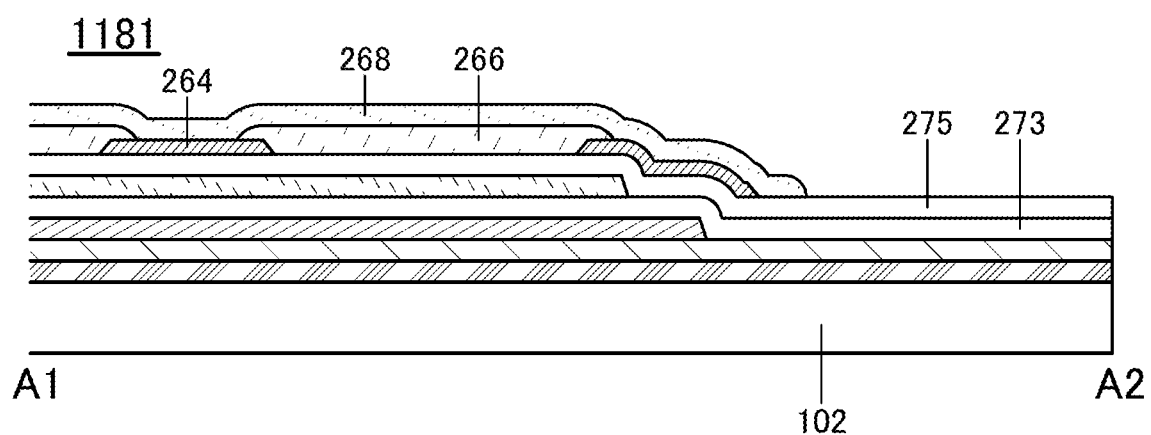

The following steps can be performed in a manner similar to those of the counter substrate 181 described in the above embodiment. Thus, the counter substrate 1181 can be formed. FIG. 27A is a cross-sectional view of the counter substrate 1181 taken along the dashed-dotted line B1-B2 in FIG. 20A. FIG. 27B is a cross-sectional view of the counter substrate 1181 taken along the dashed-dotted line A1-A2 in FIG. 20A.

[Attachment of Element Substrate 1171 and Counter Substrate 1181]

Figure 28A:
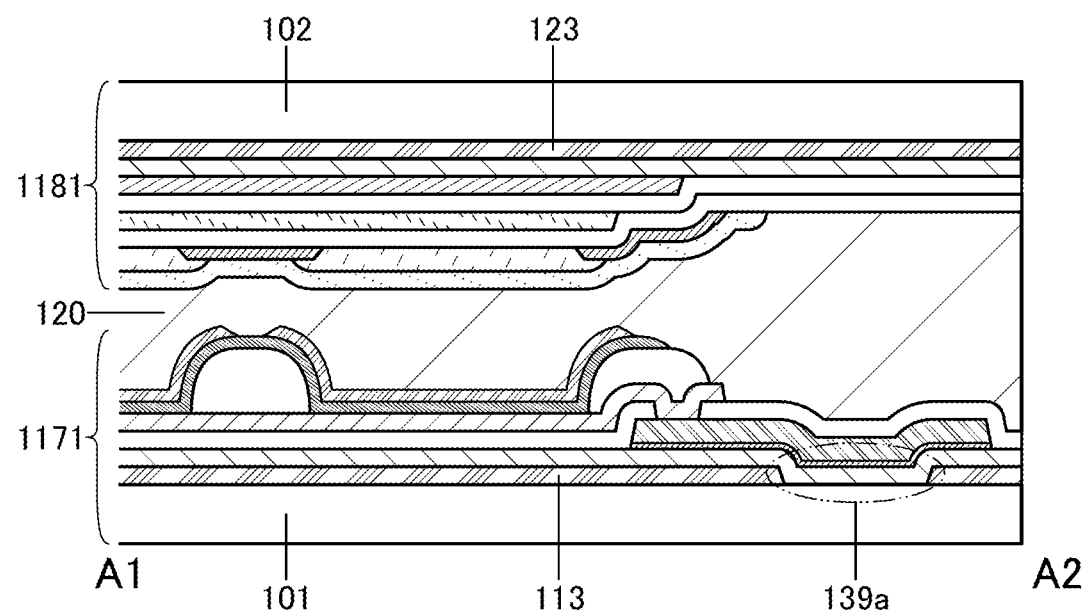
FIGS. 28A and 28B illustrate a manufacturing process of one embodiment of the present invention.
Figure 28B:
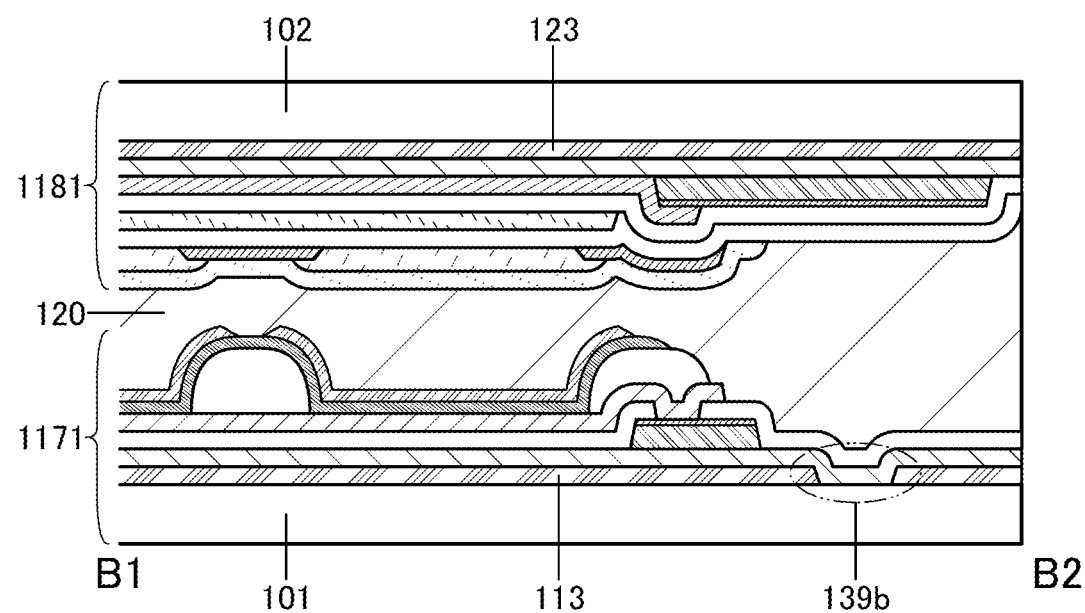

Next, the element substrate 1171 and the counter substrate 1181 are attached to each other with the bonding layer 120 positioned therebetween. At the attachment, the light-emitting element 125 on the element substrate 1171 and the coloring layer 266 on the counter substrate 1181 are disposed to face each other. FIG. 28A is a cross-sectional view taken along the dashed-dotted line A1-A2 in FIG. 20A. FIG. 28B is a cross-sectional view taken along the dashed-dotted line B1-B2 in FIG. 20A.

[Peeling of Substrate 102]

Figure 29A:
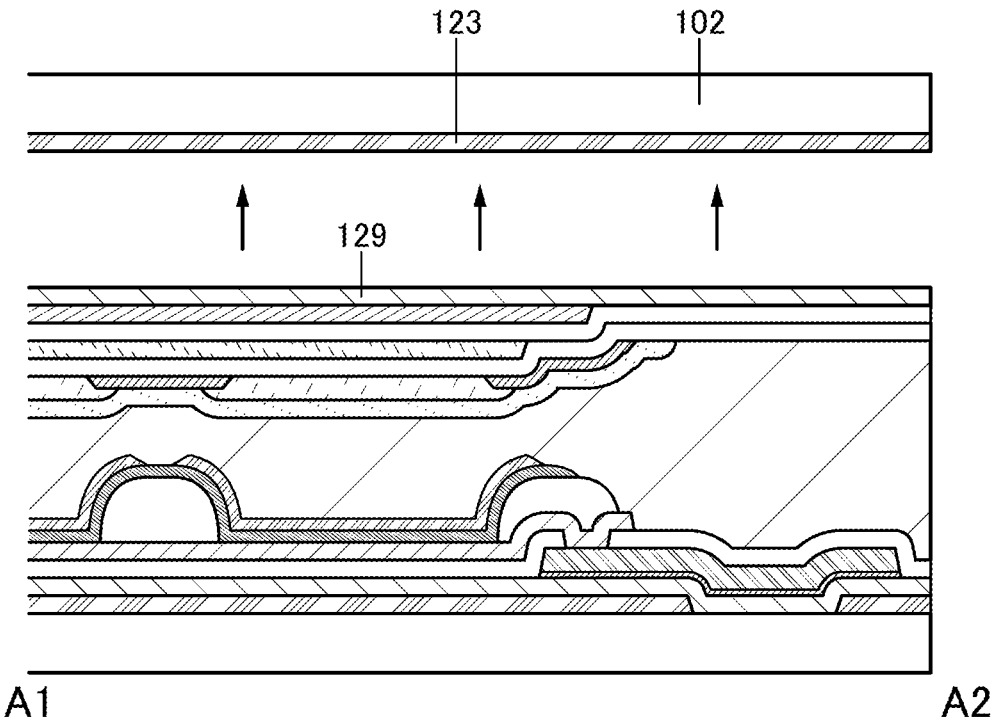
FIGS. 29A and 29B illustrate a manufacturing process of one embodiment of the present invention.
Figure 29B:
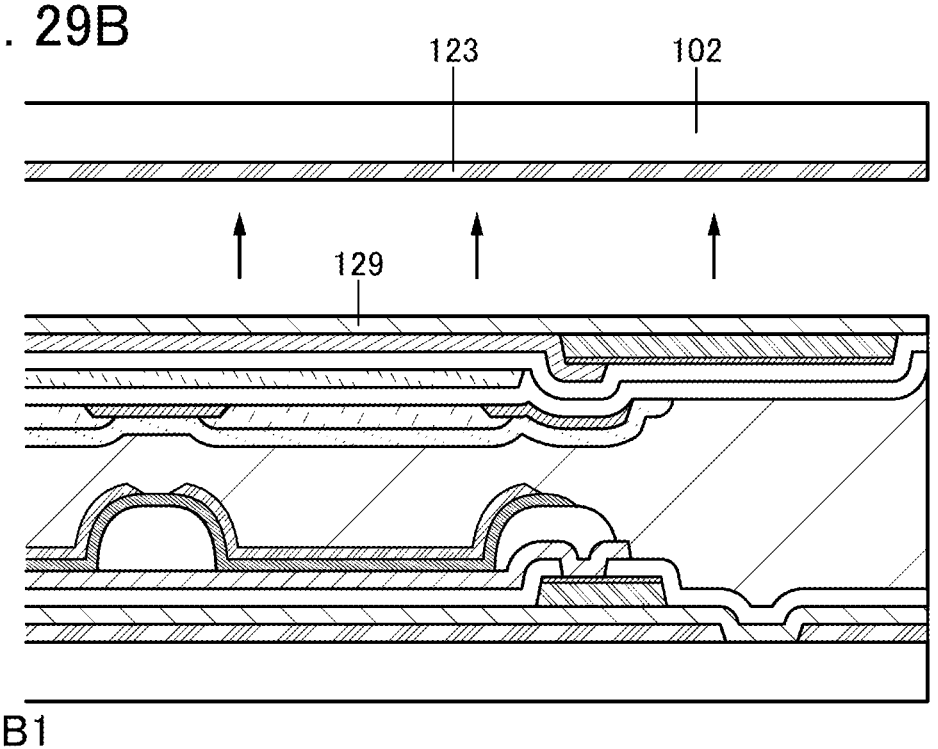

Next, the substrate 102 is peeled off from the insulating layer 129 together with the peeling layer 123 (see FIGS. 29A and 29B). As a peeling method, mechanical force (a peeling process with a human hand or a gripper, a separation process by rotation of a roller, ultrasonic waves, or the like) may be used. For example, a cut is made in the interface between the peeling layer 123 and the insulating layer 129 with a sharp edged tool, by laser beam irradiation, or the like, and water is injected into the cut. The interface between the peeling layer 123 and the insulating layer 129 absorbs water by capillarity action, so that the substrate 102 can be peeled off easily from the insulating layer 129 together with the peeling layer 123.

[Attachment of Substrate 121]

Figure 30A:
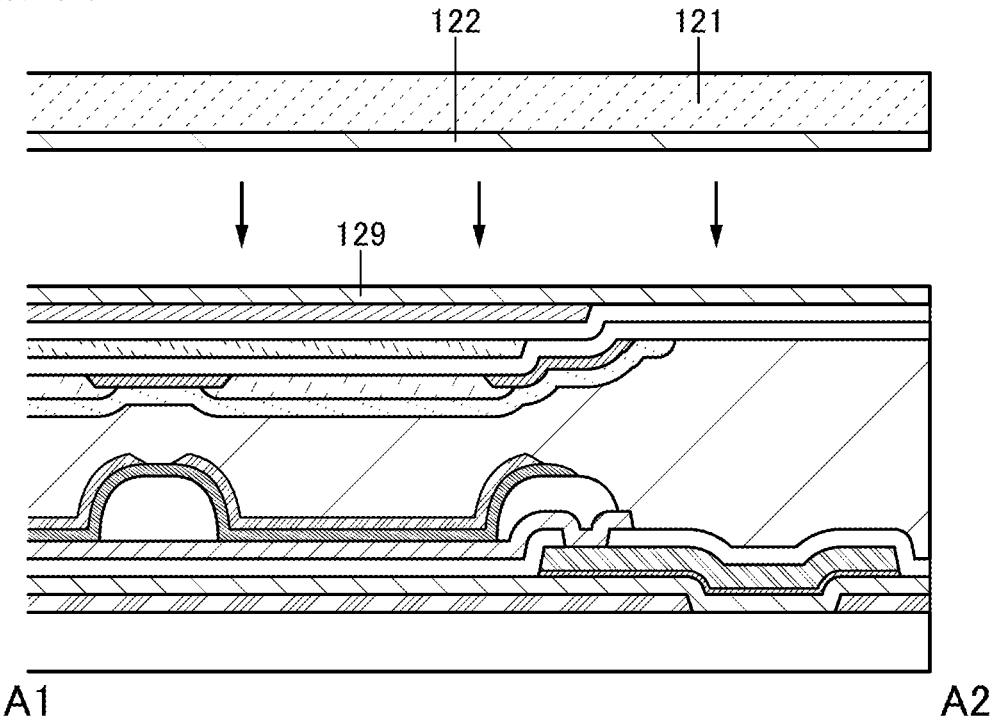
FIGS. 30A and 30B illustrate a manufacturing process of one embodiment of the present invention.
Figure 30B:
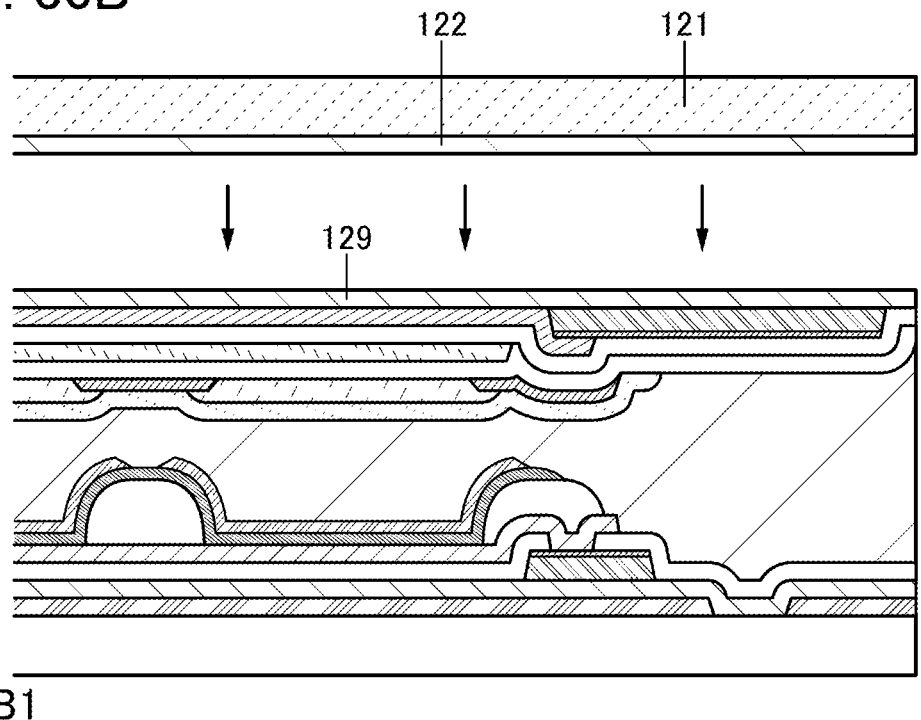

Next, the substrate 121 is attached to the insulating layer 129 with the bonding layer 122 provided therebetween (see FIGS. 30A and 30B).

[Peeling of Substrate 101]

Next, the substrate 101 is peeled off from the insulating layer 119 together with the peeling layer 113.

Figure 31A:
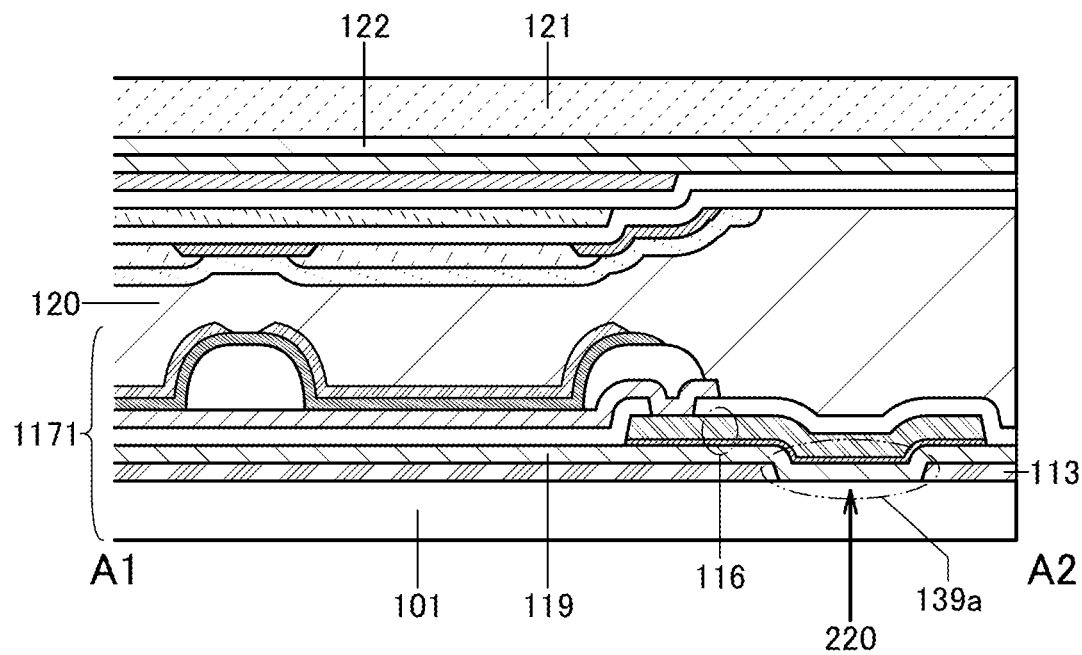
FIGS. 31A and 31B illustrate a manufacturing process of one embodiment of the present invention.
Figure 31B:
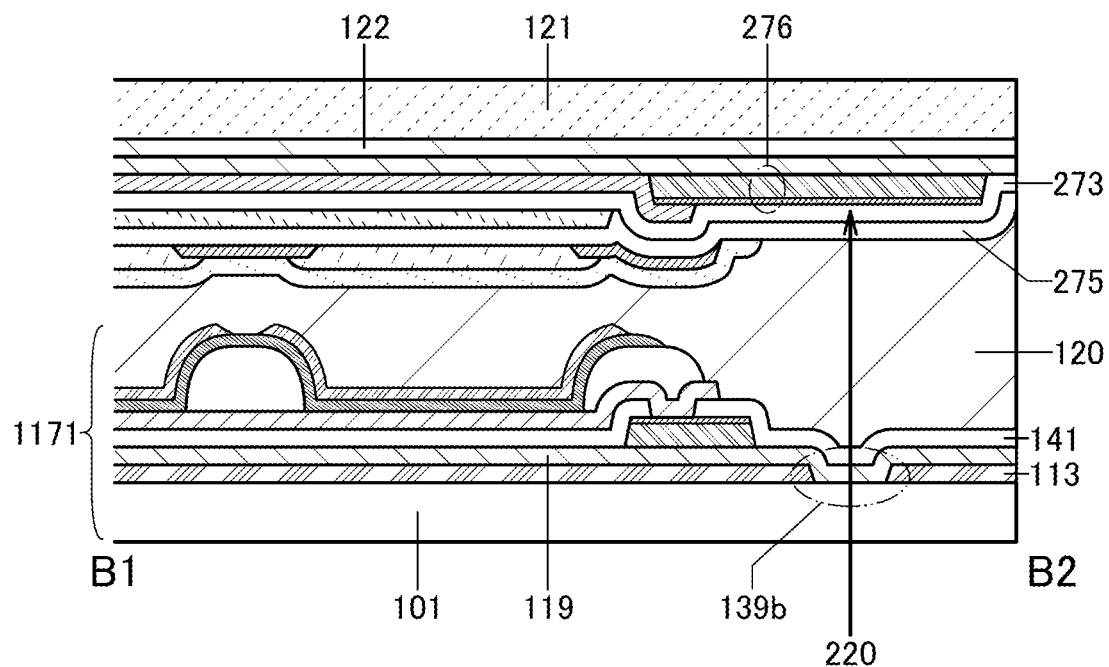

Note that before the substrate 101 is peeled off, at least part of the electrode 116 may be irradiated with light 220 through the opening 139a as illustrated in FIG. 31A. At least part of the electrode 276 may be irradiated with the light 220 through the opening 139b as illustrated in FIG. 31B.

Figure 32A:
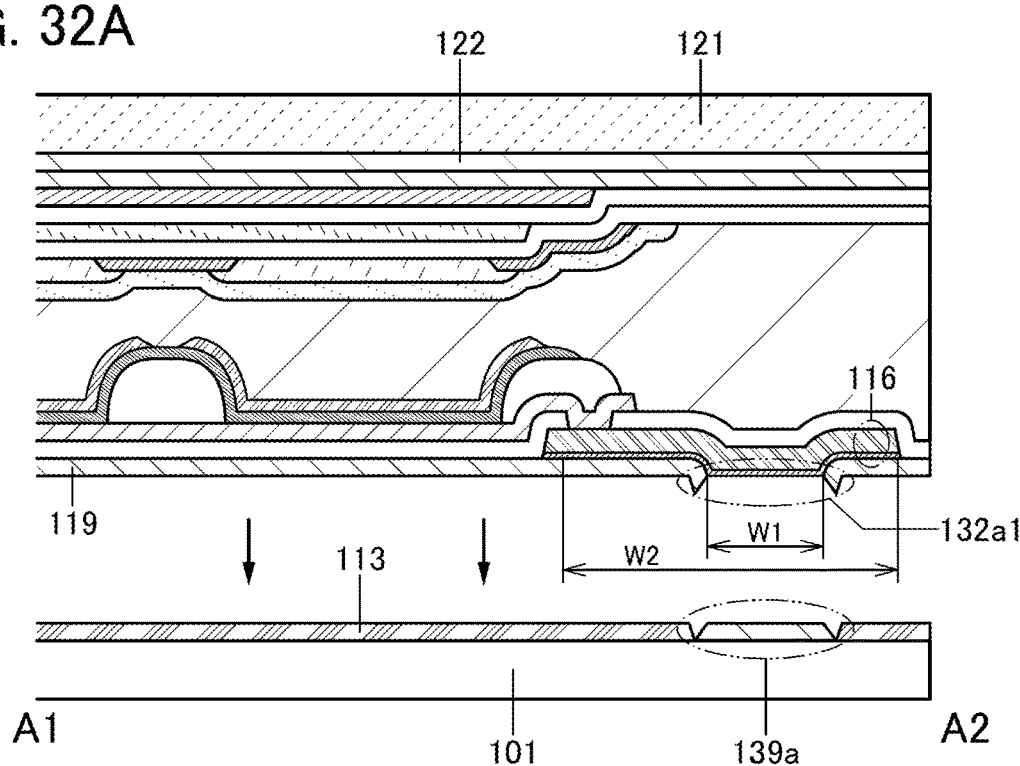
FIGS. 32A and 32B illustrate a manufacturing process of one embodiment of the present invention.
Figure 32B:
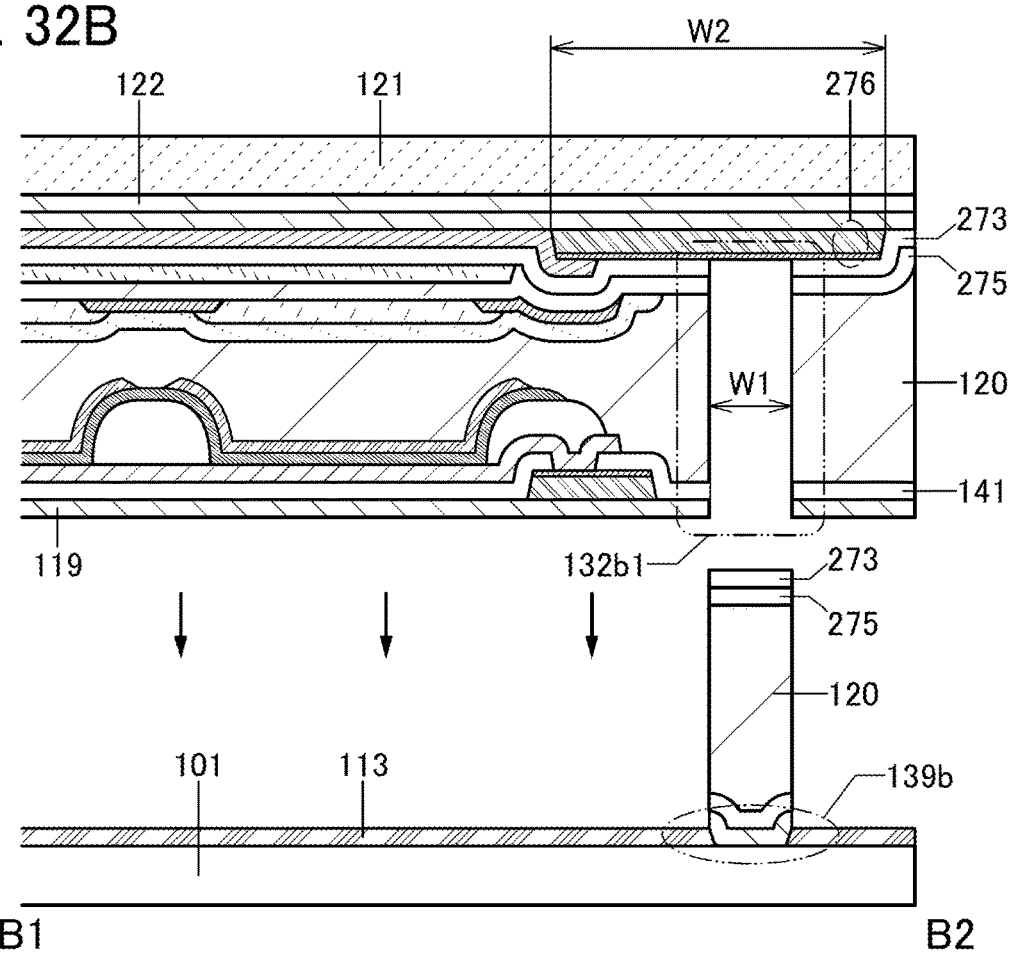

FIGS. 32A and 32B illustrate a state in which the substrate 101, together with the peeling layer 113, is peeled off from the insulating layer 119. At this time, part of the insulating layer 119, which is a region overlapping with the opening 139a, is removed to form the opening 132a1 (see FIG. 32A). The opening 132a1 is preferably formed inside the electrode 116 in the plan view. In other words, opening 132a1 is preferably formed on the inner side than the end portions of the electrode 116 in the cross-sectional view. That is, the width W1 of the opening 132a1 is preferably smaller than the width W2 of the surface of the electrode 116.

Regions overlapping with the opening 139b in the insulating layer 119, the insulating layer 141, the bonding layer 120, the insulating layer 275, and the insulating layer 273 are removed to form the opening 132b1 (see FIG. 32B). The opening 132b1 is preferably formed inside the electrode 276 in the plan view. In other words, opening 132b1 is preferably formed on the inner side than the end portions of the electrode 276 in the cross-sectional view. That is, the width W1 of the opening 132b1 is preferably smaller than the width W2 of the surface of the electrode 276.

At the step of peeling the substrate 101 together with the peeling layer 113, the opening 132a1 and the opening 132b1 can be formed at the same time. In one embodiment of the present invention, the steps of manufacturing the display device can be reduced, which increases the productivity of the display device.

[Attachment of Substrate 111]

Figure 33A:
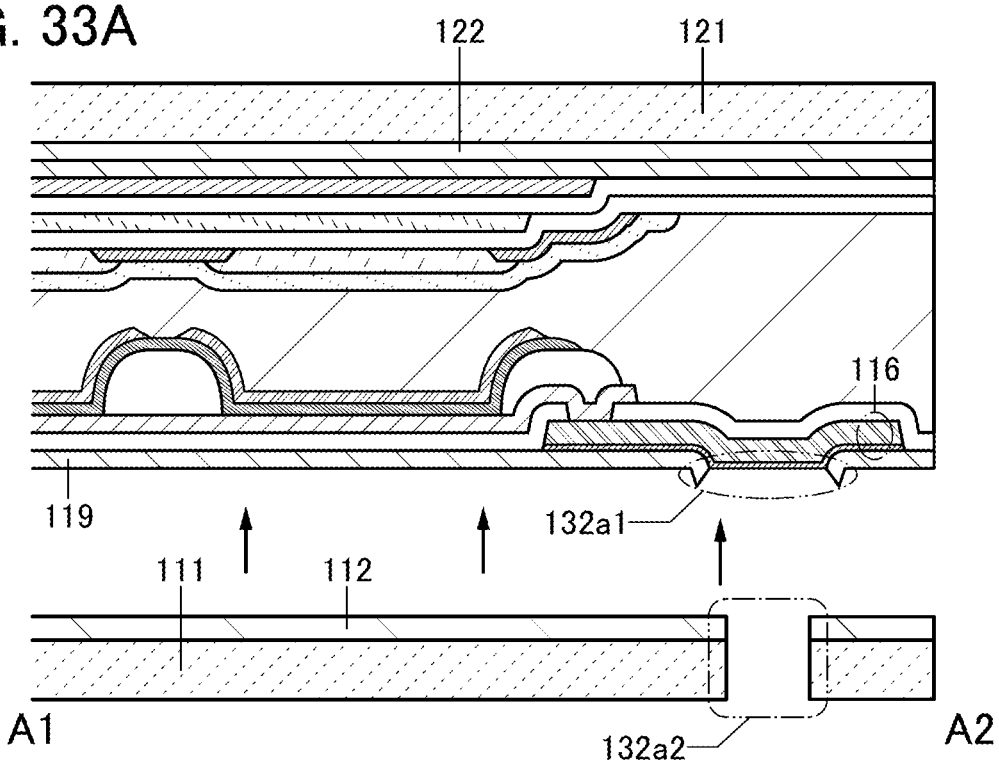
FIGS. 33A and 33B illustrate a manufacturing process of one embodiment of the present invention.
Figure 33B:
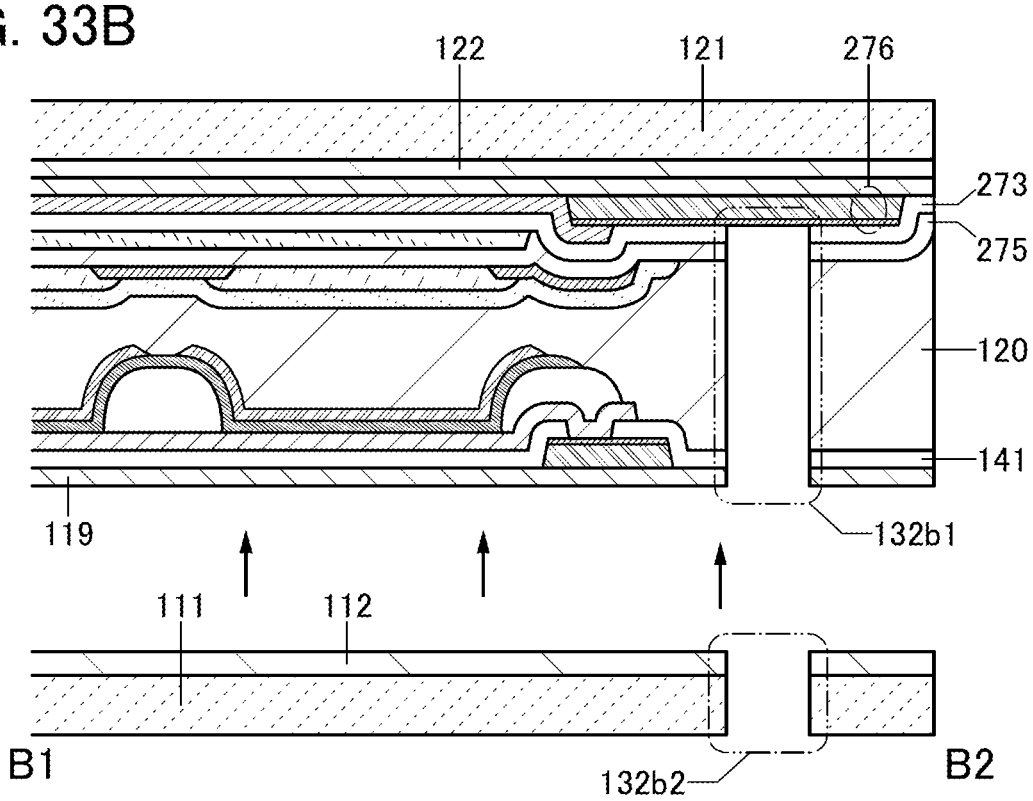
Figure 34A:
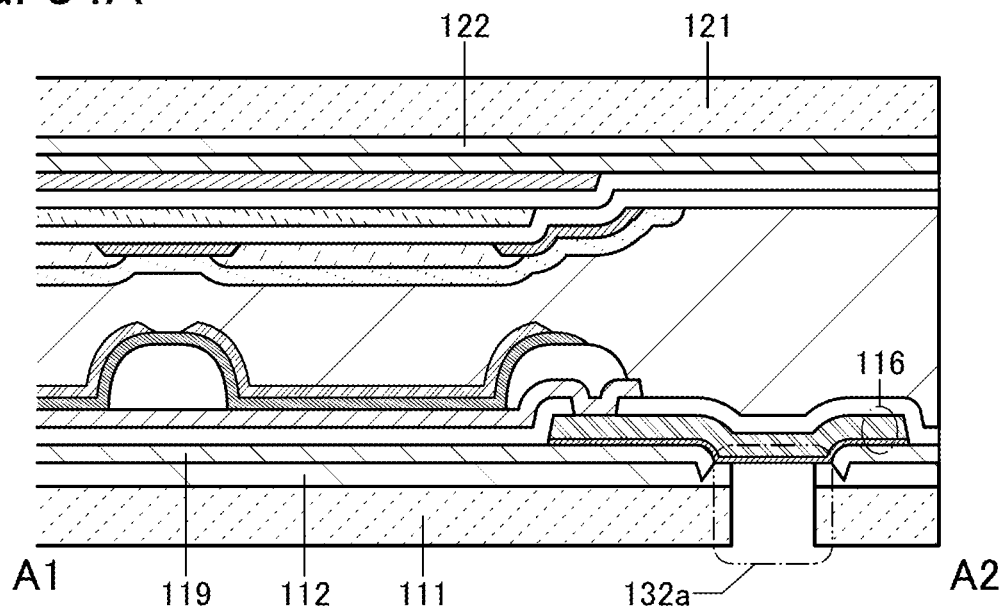
FIGS. 34A and 34B illustrate a manufacturing process of one embodiment of the present invention.
Figure 34B:
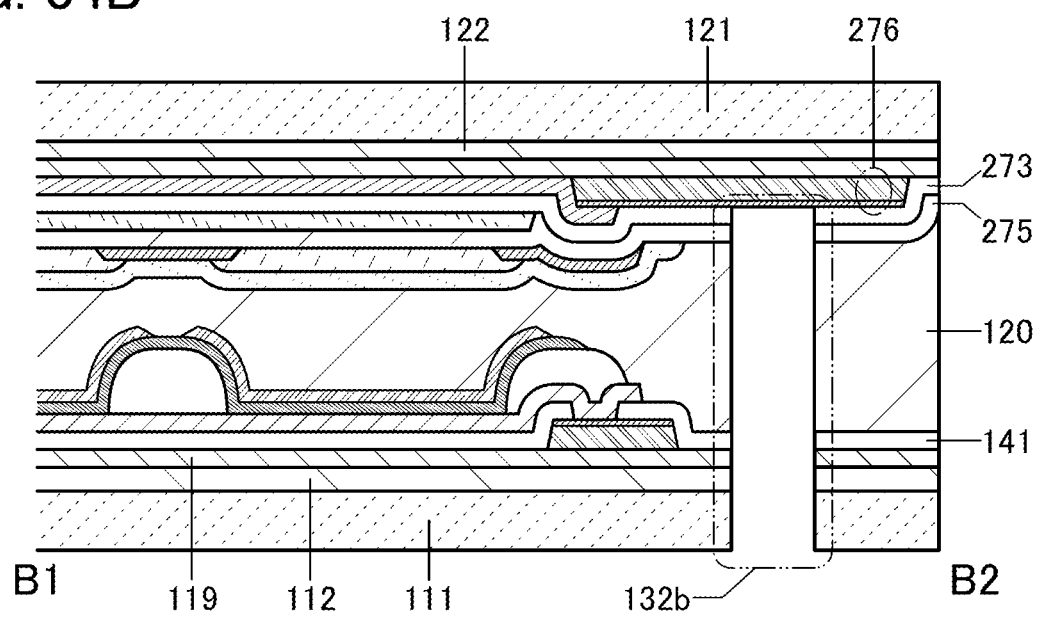

Next, the substrate 111 having an opening 132a2 and an opening 132b2 is attached to the insulating layer 119 with the bonding layer 112 provided therebetween (see FIGS. 33A and 33B). The substrate 111 and the insulating layer 119 are attached to each other so that the opening 132a1 overlaps with the opening 132a2 and the opening 132b1 overlaps with the opening 132b2. In this embodiment, the openings 132a1 and 132a2 are collectively referred to as an opening 132a, and the openings 132b1 and opening 132b2 are collectively referred to as an opening 132b. The surface of the electrode 116 is exposed from the opening 132a. The surface of the electrode 276 is exposed from the opening 132b. Thus, the display device 1100 can be manufactured (see FIGS. 34A and 34B).

In one embodiment of the present invention, part of the flexible substrate does not need to be removed by a laser beam or with an edged tool to expose the surfaces of the electrodes 116 and 276; thus, the electrodes 116 and 276, the display region 131 and the like are not damaged easily.

In addition, the opening 132a and the opening 132b can be formed at the same time, which increases the productivity of the display device.

[Formation of External Electrode]

Next, the anisotropic conductive connection layer 138a is formed in the opening 132a, and the external electrode 124a for inputting electric power or a signal to the display device 1100 is formed over the anisotropic conductive connection layer 138a. Then, the anisotropic conductive connection layer 138b is formed in the opening 132b, and the external electrode 124b for inputting electric power or a signal to the display device 1100 is formed over the anisotropic conductive connection layer 138b (see FIGS. 20A to 20C). By electrical connection between the external electrode 124a and the terminal electrode 116 through the anisotropic conductive connection layer 138a, electric power or a signal can be input to the display device 1100. By electrical connection between the external electrode 124b and the terminal electrode 276 through the anisotropic conductive connection layer 138b, electric power or a signal can be input to the display device 1100.

In one embodiment of the present invention, external electrodes such as the external electrode 124a and the external electrode 124b can be provided on one surface of the display device 1100, whereby the design flexibility of the display device can be increased. Furthermore, the design flexibility of a semiconductor device including the display device 1100 of one embodiment of the present invention can be increased.

This embodiment can be implemented in an appropriate combination with any of the structures described in the other embodiments.

Embodiment 3

Figure 35A:
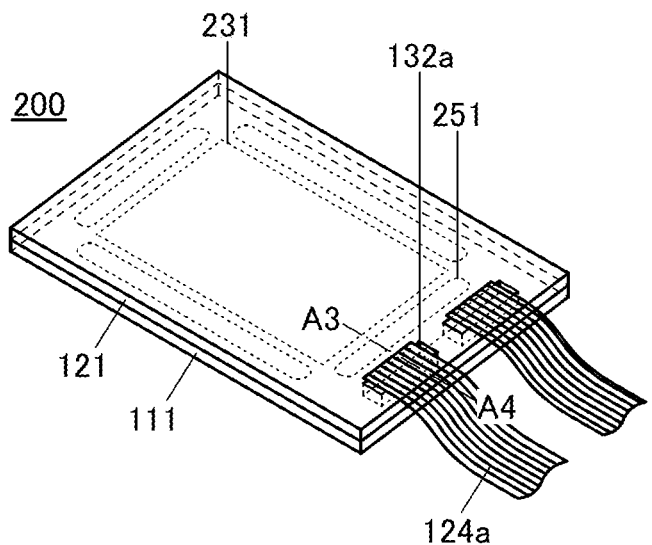
FIGS. 35A and 35B are a perspective view and a cross-sectional view illustrating one embodiment of the present invention.
Figure 35B:
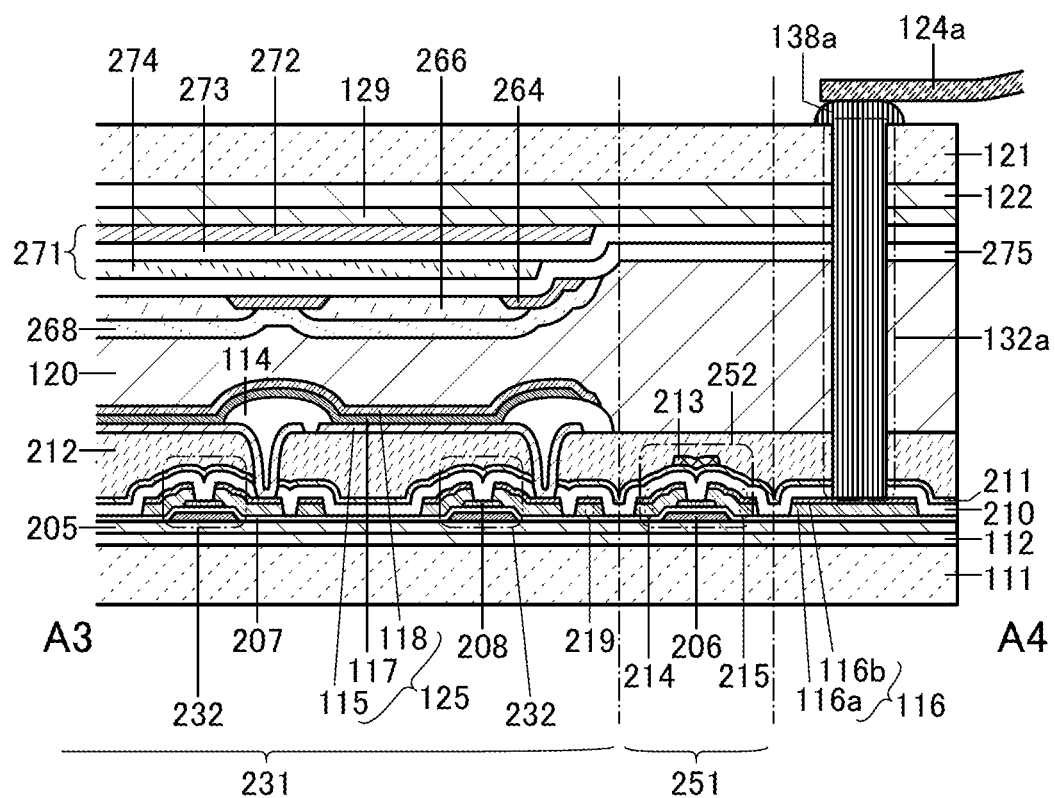
Figure 36A:
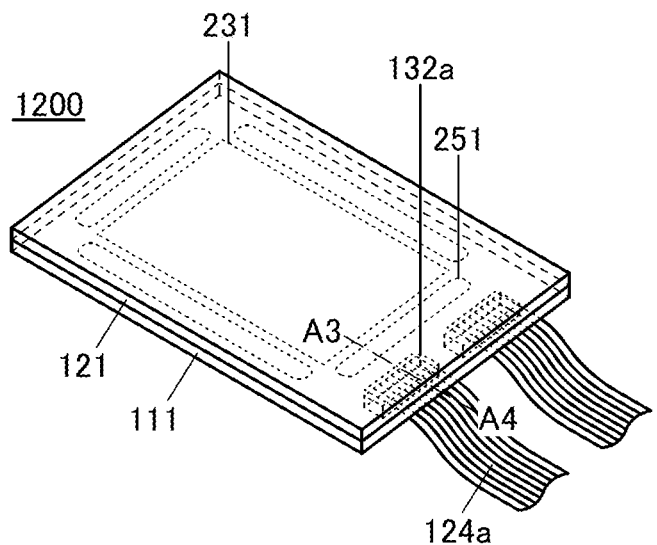
FIGS. 36A and 36B are a perspective view and a cross-sectional view illustrating one embodiment of the present invention.
Figure 36B:
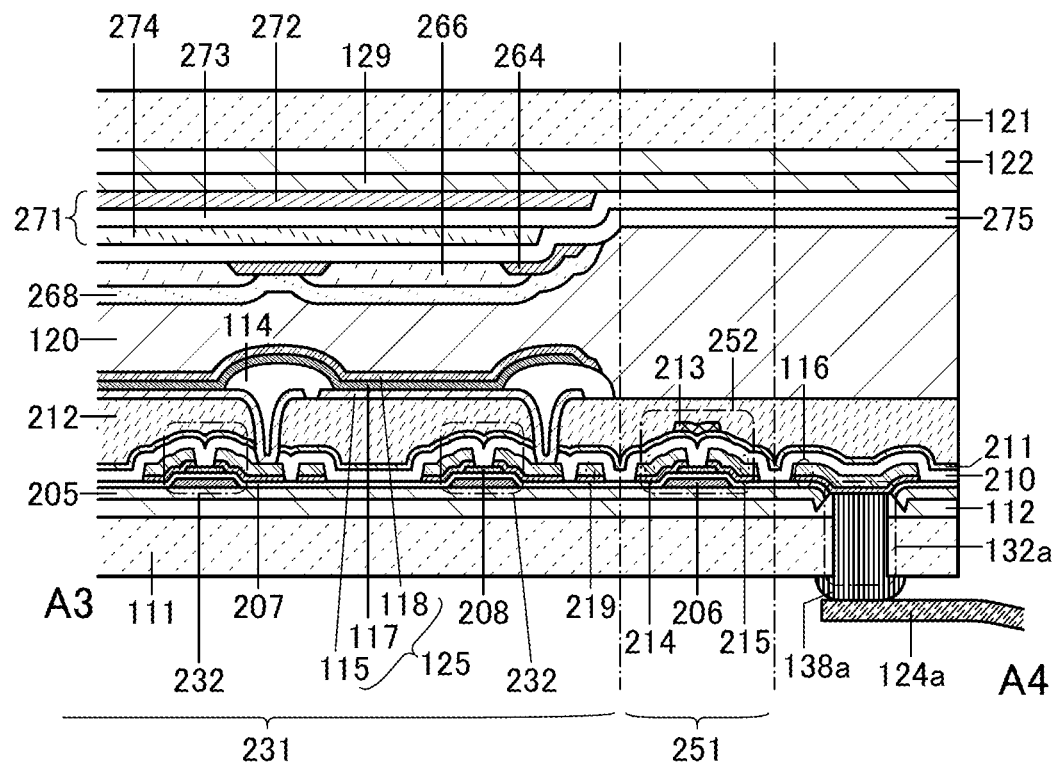

In this embodiment, display devices 200 and 1200 each having a structure different from the structures of the display devices 100 and 1100 described in the above embodiments are described with reference to FIGS. 35A and 35B and FIGS. 36A and 36B. FIG. 35A is a top view of the display device 200, and FIG. 35B is a cross-sectional view taken along the dashed-dotted line A3-A4 in FIG. 35A. FIG. 36A is a top view of the display device 1200, and FIG. 36B is a cross-sectional view taken along the dashed-dotted line A3-A4 in FIG. 36A.

<Structure of Display Device>

The display device 200 and the display device 1200 described in this embodiment each include a display region 231 and a peripheral circuit 251. Each of the display device 200 and the display device 1200 further includes the electrode 116 and the light-emitting element 125 including the electrode 115, the EL layer 117, and the electrode 118. A plurality of light-emitting elements 125 are formed in the display region 231. A transistor 232 for controlling the amount of light emitted from the light-emitting element 125 is connected to each light-emitting element 125. In the display device 200, the external electrode 124a is connected from the substrate 121 side. In the display device 1200, the external electrode 124a is connected from the substrate 111 side.

The electrode 116 is electrically connected to the external electrode 124a through the anisotropic conductive connection layer 138a formed in the opening 132a. In addition, the electrode 116 is electrically connected to the peripheral circuit 251. Although FIGS. 35A and 35B and FIGS. 36A and 36B illustrate the electrode 116 with a stacked-layer structure of the electrodes 116a and 116b, the electrode 116 may have a single-layer structure or a stacked-layer structure of three or more layers. The display device 200 in FIGS. 35A and 35B differs from the display device 1200 in FIGS. 36A and 36B in the stacking order of the electrode 116a and the electrode 116b.

The peripheral circuit 251 includes a plurality of transistors 252. The peripheral circuit 251 has a function of determining which of the light-emitting elements 125 in the display region 231 is supplied with a signal from the external electrode 124.

In each of the display devices 200 and 1200, the substrate 111 and the substrate 121 are attached to each other with the bonding layer 120 provided therebetween. An insulating layer 205 is formed over the substrate 111 with the bonding layer 112 provided therebetween. The insulating layer 205 is preferably formed as a single layer or a multilayer using any of silicon oxide, silicon nitride, silicon oxynitride, silicon nitride oxide, aluminum oxide, aluminum oxynitride, and aluminum nitride oxide. The insulating layer 205 can be formed by a sputtering method, a CVD method, a thermal oxidation method, a coating method, a printing method, or the like.

The insulating layer 205 functions as a base layer and can prevent or reduce diffusion of impurity elements from the substrate 111, the bonding layer 112, or the like to the transistor or the light-emitting element.

The transistor 232, the transistor 252, the electrode 116, and a wiring 219 are formed over the insulating layer 205. Although a channel-etched transistor that is a type of bottom-gate transistor is illustrated as the transistor 232 and/or the transistor 252 in this embodiment, a channel-protective transistor, a top-gate transistor, or the like can also be used. Alternatively, an inverted staggered transistor or a forward staggered transistor can also be used. It is also possible to use a dual-gate transistor, in which a semiconductor layer in which a channel is formed is provided between two gate electrodes. Furthermore, the transistor is not limited to a transistor having a single-gate structure; a multi-gate transistor having a plurality of channel formation regions, such as a double-gate transistor may be used.

As the transistor 232 and the transistor 252, a transistor with any of a variety of structures such as a planar type, a FIN-type, and a Tri-Gate type can be used.

The transistor 232 and the transistor 252 may have the same structure or different structures. However, the size (e.g., channel length and channel width) or the like of each transistor can be adjusted as appropriate.

The transistor 232 and the transistor 252 each include an electrode 206 that can function as a gate electrode, an insulating layer 207 that can function as a gate insulating layer, a semiconductor layer 208, an electrode 214 that can function as one of a source electrode and a drain electrode, and an electrode 215 that can function as the other of the source electrode and the drain electrode.

For a conductive material for forming the electrode 206, a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The electrode 206 can also be formed using a conductive material containing oxygen, such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

The electrode 206 may be formed with a conductive high molecular material (also referred to as conductive polymer). As the conductive high molecular material, a π electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be used.

The electrode 206 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, and a three-layer structure in which a titanium layer, an aluminum layer, and a titanium layer are stacked in this order are given. Alternatively, an alloy containing one or more elements selected from titanium, tantalum, tungsten, molybdenum, chromium, neodymium, and scandium may be used as the electrode 206.

The wiring 219, the electrode 214, and the electrode 215 can be formed at the same time as the electrode 116 using part of the conductive layers for forming the electrode 116. The insulating layer 207 can be formed using a material and a method similar to those of the insulating layer 205. Note that in the case where an organic semiconductor is used for the semiconductor layer 208, an organic material such as polyimide or an acrylic resin may be used for the insulating layer 207.

The semiconductor layer 208 can be formed using a single crystal semiconductor, a polycrystalline semiconductor, a microcrystalline semiconductor, a nanocrystal semiconductor, a semi-amorphous semiconductor, an amorphous semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In the case where an organic semiconductor is used for the semiconductor layer 208, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, it is possible to realize an extremely low off-state current (current flowing between a source and drain in an off state of a transistor). For example, the off-state current per 1 μm of a channel width can be less than or equal to 100 zA ($1 \times 10^{-19}$ A), less than or equal to 10 zA ($1 \times 10^{-20}$ A), and further less than or equal to 1 zA ($1 \times 10^{-21}$ A) when the source-drain voltage is 3.5 V at 25° C. Therefore, a display device with low power consumption can be achieved.

In the case where an oxide semiconductor is used for the semiconductor layer 208, an insulating layer containing oxygen is preferably used as an insulating layer in contact with the semiconductor layer 208. For the insulating layer in contact with the semiconductor layer 208, it is particularly preferable to use an insulating layer from which oxygen is released by heat treatment.

An insulating layer 210 is formed over the transistor 232 and the transistor 252, and an insulating layer 211 is formed over the insulating layer 210. The insulating layer 210 functions as a protective insulating layer and can prevent or reduce diffusion of impurity elements from a layer above the insulating layer 210 to the transistor 232 and the transistor 252. The insulating layer 210 can be formed using a material and a method similar to those of the insulating layer 205.

An interlayer insulating layer 212 is formed over the insulating layer 211. The interlayer insulating layer 212 is able to absorb the unevenness caused by the transistor 232 and the transistor 252. Planarization treatment may be performed on a surface of the interlayer insulating layer 212. The planarization treatment may be, but not particularly limited to, polishing treatment (e.g., chemical mechanical polishing (CMP)) or dry etching treatment.

Forming the interlayer insulating layer 212 using an insulating material having a planarization function can omit polishing treatment. As the insulating material having a planarization function, for example, an organic material such as a polyimide resin or an acrylic resin can be used. Other than the above-described organic materials, it is also possible to use a low-dielectric constant material (low-k material) or the like. Note that the interlayer insulating layer 212 may be formed by stacking a plurality of insulating films formed of these materials.

Over the insulating layer 212, the light-emitting element 125 and the partition 114 for separating the adjacent light-emitting elements 125 are formed.

The substrate 121 is provided with the touch sensor 271 including the electrode 272, the insulating layer 273, and the electrode 274, the light-blocking layer 264, the coloring layer 266, and the overcoat layer 268. The display device 200 is what is called a top-emission light-emitting device, in which light emitted from the light-emitting element 125 is extracted from the substrate 121 side through the coloring layer 266.

The light-emitting element 125 is electrically connected to the transistor 232 through an opening formed in the interlayer insulating layer 212, insulating layer 211 and the insulating layer 210.

With a micro optical resonator (also referred to as microcavity) structure which allows light emitted from the EL layer 117 to resonate, lights with different wavelengths and narrowed spectra can be extracted even when one EL layer 117 is used for different light-emitting elements 125.

Note that the manufacturing methods described in Embodiments 1 and 2 and well-known manufacturing methods can be referred to for manufacturing methods that are not described in this embodiment.

This embodiment can be implemented in an appropriate combination with any of the structures described in the other embodiments.

Embodiment 4

Figure 37A:
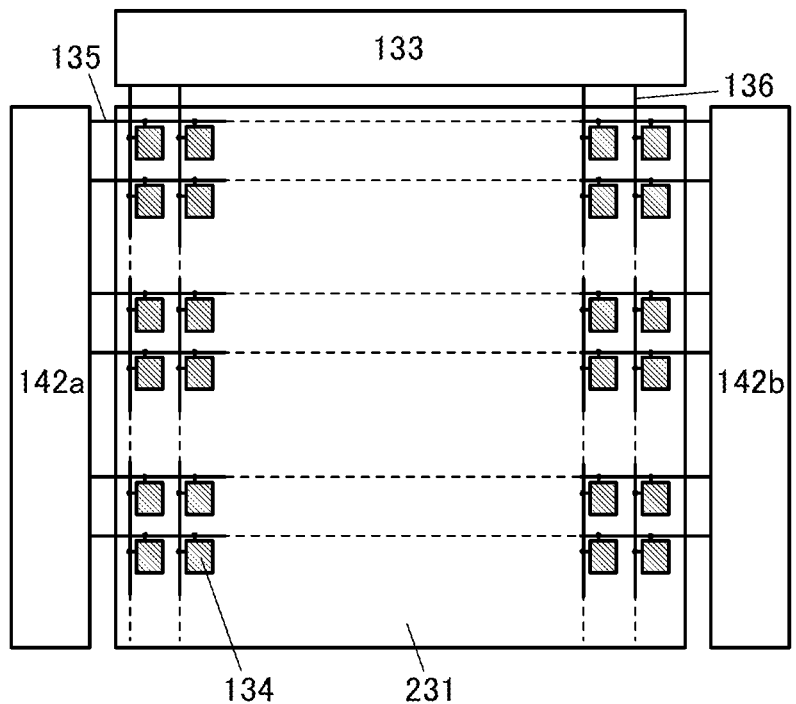
FIGS. 37A to 37C are a block diagram and circuit diagrams illustrating one embodiment of a display device.

In this embodiment, a specific structure example of the display device 200 is described with reference to FIGS. 37A to 37C. FIG. 37A is a block diagram illustrating the structure example of the display device 200.

The display device 200 illustrated in FIG. 37A includes the display region 231, a driver circuit 142a, a driver circuit 142b, and a driver circuit 133. The driver circuits 142a, 142b, and 133 collectively correspond to the peripheral circuit 251 described in the above embodiments. The driver circuits 142a, 142b, and 133 may be collectively referred to as a driver circuit portion.

The driver circuits 142a and 142b function as, for example, scan line driver circuits. The driver circuit 133 functions as, for example, a signal line driver circuit. Note that one of the driver circuits 142a and 142b may be omitted. Alternatively, some sort of circuit facing the driver circuit 133 with the display region 231 provided therebetween may be provided.

The display device 200 includes m wirings 135 that are arranged substantially parallel to each other and whose potentials are controlled by the driver circuit 142a and/or the driver circuit 142b, and n wirings 136 that are arranged substantially parallel to each other and whose potentials are controlled by the driver circuit 133. The display region 231 includes a plurality of pixel circuits 134 arranged in matrix. One pixel circuit 134 is used for driving one subpixel (the pixel 130).

Each of the wirings 135 is electrically connected to the n pixel circuits 134 in a given row among the pixel circuits 134 arranged in m rows and n columns in the display region 231. Each of the wirings 136 is electrically connected to the m pixel circuits 134 in a given column among the pixel circuits 134 arranged in m rows and n columns. Note that m and n are each an integer of 1 or more.

[Example of Pixel Circuit for Light-Emitting Display Device]

Figure 37B:
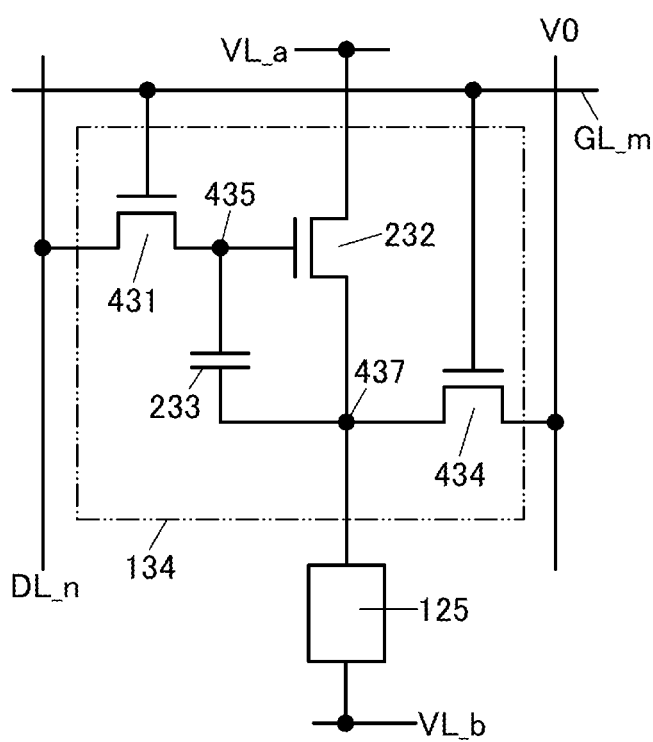
Figure 37C:
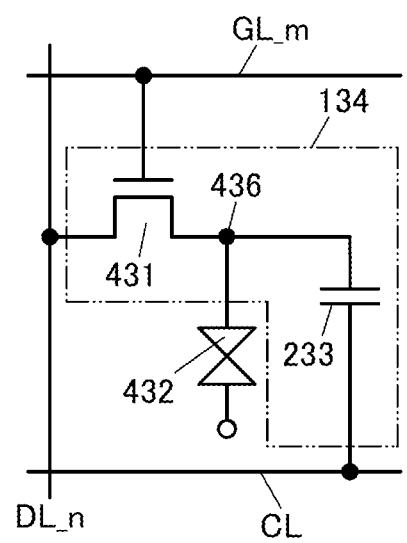

FIGS. 37B and 37C illustrate circuit structures that can be used for the pixel circuits 134 in the display device in FIG. 37A.

The pixel circuit 134 illustrated in FIG. 37B includes a transistor 431, a capacitor 233, the transistor 232, and a transistor 434. The pixel circuit 134 is electrically connected to the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m). The signal line DL_n and the scan line GL_m correspond to the wiring 136 and the wiring 135, respectively.

The transistor 431 has a function of controlling whether to write a data signal to a node 435.

One of a pair of electrodes of the capacitor 233 is electrically connected to the node 435, and the other of the pair of electrodes of the capacitor 233 is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line VO, and the other of the source electrode and the drain electrode of the transistor 434 is electrically connected to the node 437. A gate electrode of the transistor 434 is electrically connected to the scan line GL_m.

One of an anode and a cathode of the light-emitting element 125 is electrically connected to a potential supply line VL_b, and the other of the anode and the cathode of the light-emitting element 125 is electrically connected to the node 437.

As the light-emitting element 125, an organic electroluminescent element (also referred to as an organic EL element) or the like can be used, for example. Note that the light-emitting element 125 is not limited thereto and may be an inorganic EL element containing, for example, an inorganic material.

As a power supply potential, a potential on the comparatively high potential side or a potential on the comparatively low potential side can be used, for example. A power supply potential on the high potential side is referred to as a high power supply potential (also referred to as VDD), and a power supply potential on the low potential side is referred to as a low power supply potential (also referred to as VSS). A ground potential can be used as the high power supply potential or the low power supply potential. For example, in the case where a ground potential is used as the high power supply potential, the low power supply potential is a potential lower than the ground potential, and in the case where a ground potential is used as the low power supply potential, the high power supply potential is a potential higher than the ground potential.

A high power supply potential VDD is supplied to one of the potential supply line VL_a and the potential supply line VL_b, and a low power supply potential VSS is supplied to the other, for example.

In the display device including the pixel circuit 134 in FIG. 37B, the pixel circuits 134 are sequentially selected row by row by the driver circuit 142a and/or the driver circuit 142b, so that the transistors 431 and 434 are turned on and a data signal is written to the nodes 435.

When the transistors 431 and 434 are turned off, the pixel circuits 134 in which the data has been written to the nodes 435 are brought into a holding state. The amount of current flowing between the source electrode and the drain electrode of the transistor 232 is controlled in accordance with the potential of the data written to the node 435. The light-emitting element 125 emits light with luminance corresponding to the amount of the flowing current. This operation is sequentially performed row by row; thus, an image can be displayed.

[Example of Pixel Circuit for Liquid Crystal Display Device]

The pixel circuit 134 in FIG. 37C includes the transistor 431 and the capacitor 233. The pixel circuit 134 is electrically connected to a liquid crystal element 432.

The potential of one of a pair of electrodes of the liquid crystal element 432 is set in accordance with the specifications of the pixel circuit 134 as appropriate. The alignment state of the liquid crystal element 432 depends on data written to a node 436. A common potential may be applied to one of the pair of electrodes of the liquid crystal element 432 included in each of the plurality of pixel circuits 134. The potential supplied to one of a pair of electrodes of the liquid crystal element 432 in the pixel circuit 134 in one row may be different from the potential supplied to one of a pair of electrodes of the liquid crystal element 432 in the pixel circuit 134 in another row.

Examples of a method of driving the display device including the liquid crystal element 432 include a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, and a transverse bend alignment (TBA) mode. Other examples of the method of driving the display device include an electrically controlled birefringence (ECB) mode, a polymer-dispersed liquid crystal (PDLC) mode, a polymer network liquid crystal (PNLC) mode, and a guest-host mode. Note that one embodiment of the present invention is not limited thereto, and various liquid crystal elements and driving methods can be used.

The liquid crystal element 432 may be formed using a liquid crystal composition including a liquid crystal exhibiting a blue phase and a chiral material. The liquid crystal exhibiting a blue phase has a short response time of 1 ms or less and has optical isotropy; thus, an alignment process is not necessary. A liquid crystal display device including a liquid crystal exhibiting a blue phase has small viewing angle dependence because the liquid crystal has optical isotropy.

In the pixel circuit 134 in the m-th row and the n-th column, one of the source electrode and the drain electrode of the transistor 431 is electrically connected to the signal line DL_n, and the other of the source electrode and the drain electrode of the transistor 431 is electrically connected to the node 436. The gate electrode of the transistor 431 is electrically connected to the scan line GL_m. The transistor 431 has a function of controlling whether to write a data signal to the node 436.

One of the pair of electrodes of the capacitor 233 is electrically connected to a wiring to which a specific potential is supplied (hereinafter referred to as a capacitor line CL), and the other of the pair of electrodes of the capacitor 233 is electrically connected to the node 436. The other of the pair of electrodes of the liquid crystal element 432 is electrically connected to the node 436. The potential of the capacitor line CL is set in accordance with the specifications of the pixel circuit 134 as appropriate. The capacitor 233 functions as a storage capacitor for storing data written to the node 436.

For example, in the display device including the pixel circuit 134 in FIG. 37C, the pixel circuits 134 are sequentially selected row by row by the driver circuit 142a and/or the driver circuit 142b, so that the transistors 431 are turned on and a data signal is written to the nodes 436.

When the transistors 431 are turned off, the pixel circuits 134 in which the data signal has been written to the nodes 436 are brought into a holding state. This operation is sequentially performed row by row; thus, an image can be displayed on the display region 231.

[Display Element]

The display device of one embodiment of the present invention can employ various modes and can include various elements. The display element includes at least one of an electroluminescence (EL) element (e.g., an EL element including organic and inorganic materials, an organic EL element, or an inorganic EL element) including an LED (e.g., a white LED, a red LED, a green LED, or a blue LED), a transistor (a transistor that emits light depending on current), an electron emitting element, a plasma display panel (PDP), a liquid crystal element, an electrophoretic element, a display element using micro electro mechanical system (MEMS) such as a grating light valve (GLV), a digital micromirror device (DMD), a digital micro shutter (DMS) element, a MIRASOL (registered trademark) display, an interferometric modulator display (IMOD) element, and a piezoelectric ceramic display, an electrowetting element, and the like. Other than the above, display device may contain a display medium whose contrast, luminance, reflectance, transmittance, or the like is changed by electrical or magnetic action. Alternatively, quantum dots may be used as the display element. Examples of display devices including quantum dots include a quantum dot display. Examples of display devices having EL elements include an EL display. Examples of a display device including an electron emitter include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of display devices having electrophoretic elements include electronic paper. In the case of a transflective liquid crystal display or a reflective liquid crystal display, some or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

This embodiment can be implemented in an appropriate combination with any of the structures described in the other embodiments.

Embodiment 5

In this embodiment, an example of a transistor which can be used instead of the transistor 232 and/or the transistor 252 described in the above embodiments is described with reference to FIGS. 38A1, 38A2, 38B1, and 38B2. A transistor disclosed in this specification and the like can be applied to the transistors 431, 434, and the like.

[Bottom-Gate Transistor]

A transistor 410 shown in FIG. 38A1 as an example is a channel-protective transistor that is a type of bottom-gate transistor. The transistor 410 includes an insulating layer 209 that can function as a channel protective layer over a channel formation region in the semiconductor layer 208. The insulating layer 209 can be formed using a material and a method that are similar to those of the insulating layer 205. Part of the electrode 214 and part of the electrode 215 are formed over the insulating layer 209.

With the insulating layer 209 provided over the channel formation region, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

A transistor 411 illustrated in FIG. 38A2 is different from the transistor 410 in that an electrode 213 that can function as a back gate electrode is provided over the insulating layer 211. The electrode 213 can be formed using a material and a method that are similar to those of the electrode 206. The electrode 213 may be formed between the insulating layer 210 and the insulating layer 211.

In general, the back gate electrode is formed using a conductive layer and positioned so that the channel formation region of the semiconductor layer is provided between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode independently of the potential of the gate electrode, the threshold voltage of the transistor can be changed.

The electrodes 206 and 213 can both function as a gate electrode. Thus, the insulating layers 207, 209, 210, and 211 can all function as a gate insulating layer.

In the case where one of the electrode 206 and the electrode 213 is simply referred to as a "gate electrode", the other can be referred to as a "back gate electrode". For example, in the transistor 411, in the case where the electrode 213 is referred to as a "gate electrode", the electrode 206 is referred to as a "back gate electrode". In the case where the electrode 213 is used as a "gate electrode", the transistor 411 is a kind of bottom-gate transistor. Furthermore, one of the electrode 206 and the electrode 213 may be referred to as a "first gate electrode", and the other may be referred to as a "second gate electrode".

By providing the electrode 206 and the electrode 213 with the semiconductor layer 208 provided therebetween and setting the potentials of the electrode 206 and the electrode 213 to be the same, a region of the semiconductor layer 208 through which carriers flow is enlarged in the film thickness direction; thus, the number of transferred carriers is increased. As a result, the on-state current and the field-effect mobility of the transistor 411 are increased.

Therefore, the transistor 411 has large on-state current for the area occupied thereby. That is, the area occupied by the transistor 411 can be small for required on-state current.

Furthermore, the gate electrode and the back gate electrode are formed using conductive layers and thus each have a function of preventing an electric field generated outside the transistor from influencing the semiconductor layer in which the channel is formed (in particular, a function of blocking static electricity).

Since the electrode 206 and the electrode 213 each have a function of blocking an electric field generated outside, charges of charged particles and the like generated on the substrate 111 side or above the electrode 213 do not influence the channel formation region in the semiconductor layer 208. Therefore, degradation in a stress test (e.g., a negative gate bias temperature (−GBT) stress test in which negative charges are applied to a gate) can be reduced, and changes in the rising voltages of on-state current at different drain voltages can be suppressed. Note that this effect is caused when the electrodes 206 and 213 have the same potential or different potentials.

The BT stress test is one kind of accelerated test and can evaluate, in a short time, a change by long-term use (i.e., a change over time) in characteristics of transistors. In particular, the change in threshold voltage of the transistor between before and after the BT stress test is an important indicator when examining the reliability of the transistor. If the change in the threshold voltage between before and after the BT stress test is small, the transistor has higher reliability.

By providing the electrode 206 and the electrode 213 and setting the potentials of the electrode 206 and the electrode 213 to be the same, the change in threshold voltage is reduced. Accordingly, variation in electrical characteristics among a plurality of transistors is also reduced.

The transistor including the back gate electrode has a smaller change in threshold voltage between before and after a positive GBT stress test in which positive charges are applied to a gate than a transistor including no back gate electrode.

When the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

A transistor 420 shown in FIG. 38B1 as an example is a channel-protective transistor that is a type of bottom-gate transistor. The transistor 420 has substantially the same structure as the transistor 410 but is different from the transistor 410 in that the insulating layer 209 covers the side surfaces of the semiconductor layer 208. The semiconductor layer 208 is electrically connected to the electrode 214 in an opening which is formed by selectively removing part of the insulating layer 209. The semiconductor layer 208 is electrically connected to the electrode 215 in the opening which is formed by selectively removing part of the insulating layer 209. A region of the insulating layer 209 which overlaps with the channel formation region can function as a channel protective layer.

A transistor 421 illustrated in FIG. 38B2 is different from the transistor 420 in that the electrode 213 that can function as a back gate electrode is provided over the insulating layer 211.

With the insulating layer 209, the semiconductor layer 208 can be prevented from being exposed at the time of forming the electrode 214 and the electrode 215. Thus, the semiconductor layer 208 can be prevented from being reduced in thickness at the time of forming the electrode 214 and the electrode 215.

The length between the electrode 214 and the electrode 206 and the length between the electrode 215 and the electrode 206 in the transistors 420 and 421 are longer than those in the transistors 410 and 411. Thus, the parasitic capacitance generated between the electrode 214 and the electrode 206 can be reduced. Moreover, the parasitic capacitance generated between the electrode 215 and the electrode 206 can be reduced.

[Top-Gate Transistor]

A transistor 430 shown in FIG. 39A1 as an example is a type of top-gate transistor. The transistor 430 includes the semiconductor layer 208 over the insulating layer 119; the electrode 214 in contact with part of the semiconductor layer 208 and the electrode 215 in contact with part of the semiconductor layer 208, over the semiconductor layer 208 and the insulating layer 119; the insulating layer 207 over the semiconductor layer 208, the electrode 214 and the electrode 215; and the electrode 206 over the insulating layer 207. The insulating layer 210 and the insulating layer 211 are formed over the electrode 206.

Since, in the transistor 430, the electrode 206 overlaps with neither the electrode 214 nor the electrode 215, the parasitic capacitance generated between the electrode 206 and the electrode 214 and the parasitic capacitance generated between the electrode 206 and the electrode 215 can be reduced. After the formation of the electrode 206, an impurity element 221 is introduced into the semiconductor layer 208 using the electrode 206 as a mask, so that an impurity region can be formed in the semiconductor layer 208 in a self-aligned manner (see FIG. 39A3).

The introduction of the impurity element 221 can be performed with an ion implantation apparatus, an ion doping apparatus, or a plasma treatment apparatus.

As the impurity element 221, for example, at least one element of a Group 13 element and a Group 15 element can be used. In the case where an oxide semiconductor is used for the semiconductor layer 208, it is possible to use at least one kind of element of a rare gas, hydrogen, and nitrogen as the impurity element 221.

A transistor 431 illustrated in FIG. 39A2 is different from the transistor 430 in that the electrode 213 and an insulating layer 217 are included. The transistor 431 includes the electrode 213 formed over the insulating layer 119 and the insulating layer 217 formed over the electrode 213. As described above, the electrode 213 can function as a back gate electrode. Thus, the insulating layer 217 can function as a gate insulating layer. The insulating layer 217 can be formed using a material and a method that are similar to those of the insulating layer 205.

The transistor 431 as well as the transistor 411 has large on-state current for the area occupied thereby. That is, the area occupied by the transistor 431 can be small for required on-state current. According to one embodiment of the present invention, the area occupied by a transistor can be reduced. Therefore, according to one embodiment of the present invention, a semiconductor device having a high degree of integration can be provided.

A transistor 440 shown in FIG. 39B1 as an example is a type of top-gate transistor. The transistor 440 is different from the transistor 430 in that the semiconductor layer 208 is formed after the formation of the electrode 214 and the electrode 215. A transistor 441 shown in FIG. 39B2 as an example is different from the transistor 440 in that it includes the electrode 213 and the insulating layer 217. Thus, in the transistors 440 and 441, part of the semiconductor layer 208 is formed over the electrode 214 and another part of the semiconductor layer 208 is formed over the electrode 215.

The transistor 441 as well as the transistor 411 has large on-state current for the area occupied thereby. That is, the area occupied by the transistor 441 can be small for required on-state current. According to one embodiment of the present invention, the area occupied by a transistor can be reduced. Therefore, according to one embodiment of the present invention, a semiconductor device having a high degree of integration can be provided.

In the transistors 440 and 441, after the formation of the electrode 206, the impurity element 221 is introduced into the semiconductor layer 208 using the electrode 206 as a mask, so that an impurity region can be formed in the semiconductor layer 208 in a self-aligned manner.

[S-Channel Transistor]

FIG. 40A is a top view of a transistor 450. FIG. 40B is a cross-sectional view (in the channel length direction) taken along the dashed-dotted line X1-X2 in FIG. 40A. FIG. 40C is a cross-sectional view (in the channel width direction) taken along the dashed-dotted line Y1-Y2 in FIG. 40A.

A semiconductor layer 242 is provided over a projecting portion of the insulating layer 109, in which case the electrode 243 can cover a side surface of the semiconductor layer 242. That is, the transistor 450 has a structure in which the semiconductor layer 242 is electrically surrounded by an electric field of the electrode 243. Such a structure of a transistor in which a semiconductor is electrically surrounded by an electric field of a conductive film is referred to as a surrounded channel (s-channel) structure. A transistor having an s-channel structure is referred to as an s-channel transistor.

In the s-channel transistor, a channel is formed in the whole (bulk) of the semiconductor layer 242 in some cases. In the s-channel transistor, the drain current of the transistor can be increased, so that a larger amount of on-state current can be obtained. Therefore, the area occupied by the transistor can be reduced, which leads to high definition of a display device and high integration of a semiconductor device.

Furthermore, the entire channel formation region of the semiconductor layer 242 can be depleted by the electric field of the electrode 243. Accordingly, the off-state current of the s-channel transistor can be further reduced. Therefore, power consumption of a display device and a semiconductor device can be reduced.

When the projecting portion of the insulating layer 109 is increased in height, and the channel width is shortened, the effects of the s-channel structure to increase the on-state current and reduce the off-state current can be enhanced.

Figure 41C:
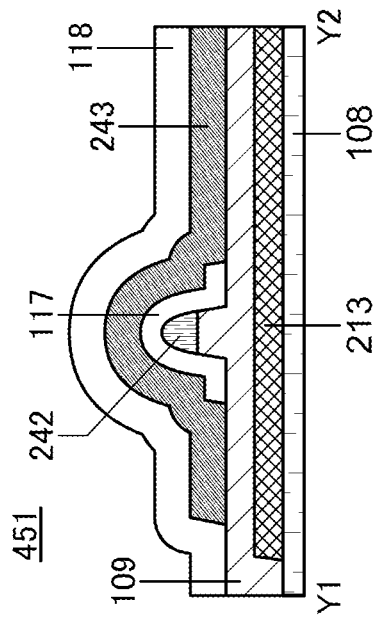
FIGS. 41A to 41C are a top view and cross-sectional views illustrating one embodiment of a transistor.
Figure 41A:
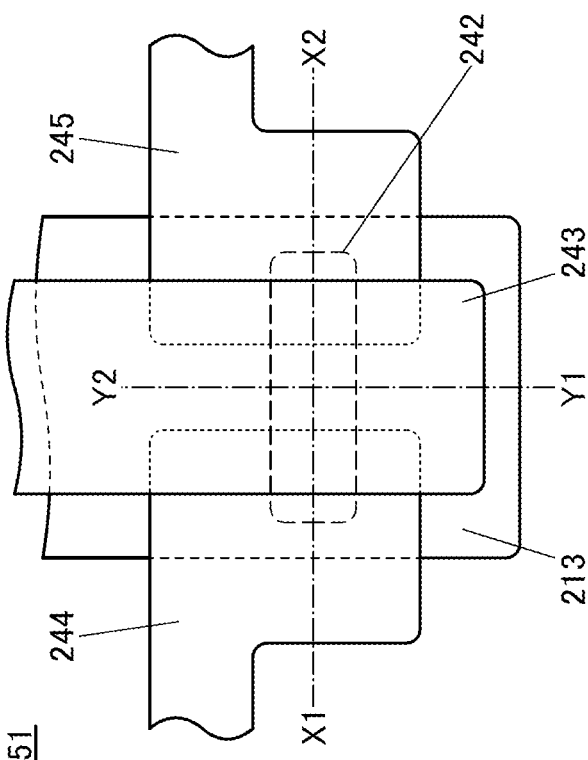
Figure 41B:
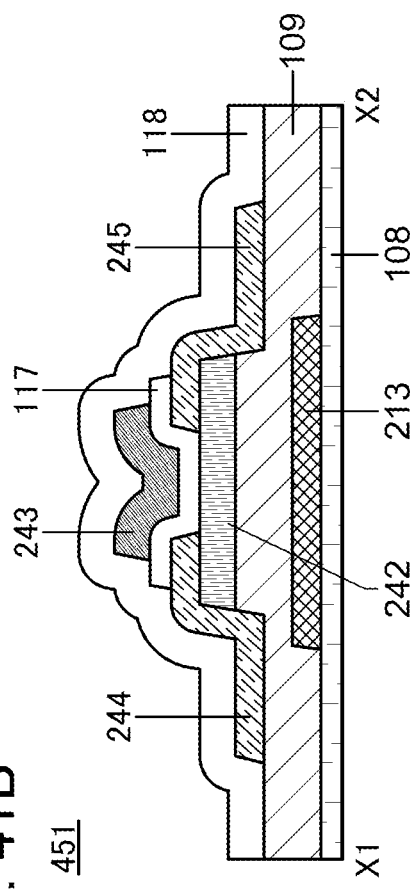

As in a transistor 451 illustrated in FIGS. 41A to 41C, the electrode 213 may be provided under the semiconductor layer 242 with an insulating layer positioned therebetween. FIG. 41A is a top view of a transistor 451. FIG. 41B is a cross-sectional view taken along the dashed-dotted line X1-X2 in FIG. 41A. FIG. 41C is a cross-sectional view taken along the dashed-dotted line Y1-Y2 in FIG. 41A.

This embodiment can be implemented in an appropriate combination with any of the structures described in the other embodiments.

Embodiment 6

Although a capacitive touch sensor is used as an example of the touch sensor 271 in the above embodiments, one embodiment of the present invention is not limited thereto. A resistive touch sensor may be used as the touch sensor 271. Examples of the capacitive touch sensor are of a surface capacitive type and of a projected capacitive type. Alternatively, an active matrix touch sensor using an active element such as a transistor can be used.

In this embodiment, a structure and a driving method of an active matrix touch sensor 500 that can be used as the touch sensor 271 are described with reference to FIGS. 42A to 42D2 and FIGS. 43A to 43D.

FIG. 42A is a block diagram illustrating the structure of the active matrix touch sensor 500. FIG. 42B is a circuit diagram illustrating a structure of a convertor CONV. FIG. 42C is a circuit diagram illustrating a structure of a sensing unit 510. FIGS. 42D1 and 42D2 are timing charts showing a method of driving the sensing unit 510.

Figure 43A:
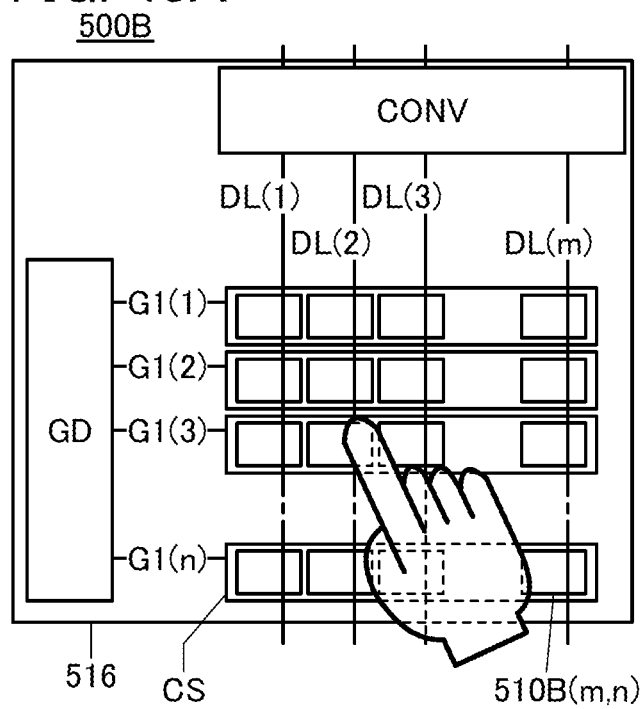
FIGS. 43A to 43D illustrate a structure example and an example of a driving method of a touch sensor.
Figure 43B:
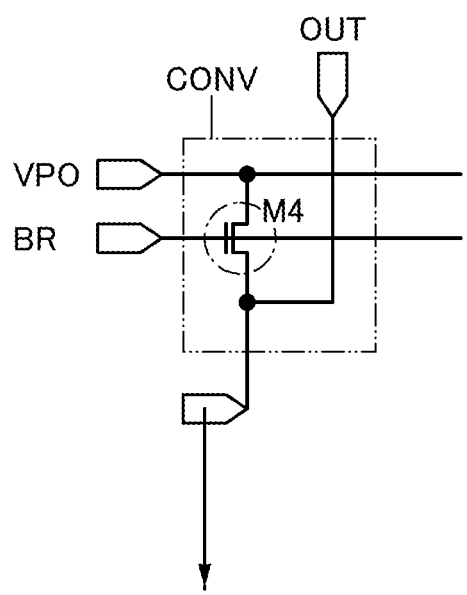
Figure 43C:
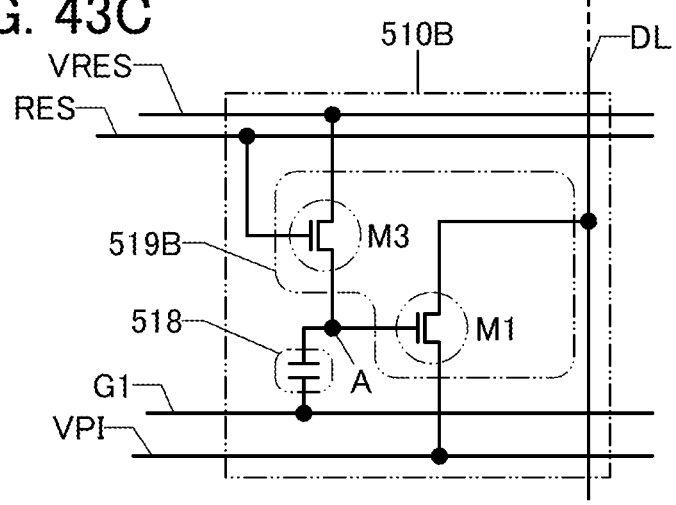
Figure 43D:
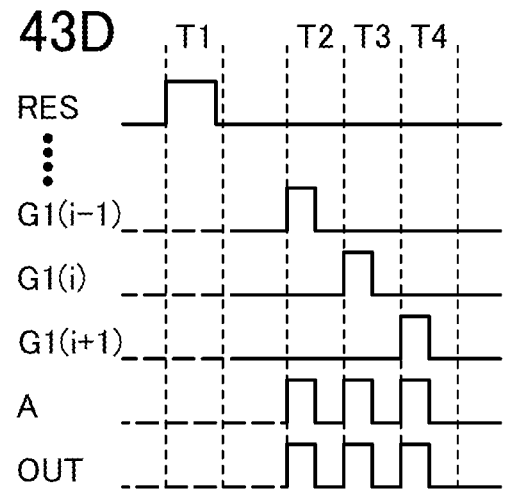

FIG. 43A is a block diagram illustrating the structure of an active matrix touch sensor 500B. FIG. 43B is a circuit diagram illustrating a structure of a convertor CONV. FIG. 43C is a circuit diagram illustrating a structure of a sensing unit 510B. FIG. 43D is a timing chart showing a method of driving the sensing unit 510B.

<Structure Example 1 of Positional Data Input Portion>

The touch sensor 500 illustrated in FIGS. 42A to 42D includes the sensing units 510 arranged in a matrix; scan lines G1 to which the sensing units 510 arranged in the row direction are electrically connected; and signal lines DL to which the sensing units 510 arranged in the column direction are electrically connected (see FIG. 42A).

For example, the sensing units 510 can be arranged in a matrix of n rows and m columns (each of n and m is a natural number greater than or equal to 1).

The sensing unit 510 includes a sensor element 518 that functions as a capacitor and a sensor circuit 519. A first electrode of the sensor element 518 is electrically connected to a wiring CS. A second electrode of the sensor element 518 is electrically connected to a node A. With this structure, a potential of the node A can be controlled by a control signal supplied by the wiring CS.

<<Sensor Circuit 519>>

The sensor circuit 519 illustrated in FIG. 42C includes a transistor M1, a transistor M2, and a transistor M3. A gate of the transistor M1 is electrically connected to the node A. One of a source and a drain of the transistor M1 is electrically connected to a wiring VPI that can supply the ground potential. The other of the source and the drain is electrically connected to one of a source and a drain of the transistor M2.

The other of the source and the drain of the transistor M2 is electrically connected to the signal line DL that can supply a sensing signal DATA. A gate of the transistor M2 is electrically connected to a scan line G1 that can supply a selection signal.

One of a source and a drain of the transistor M3 is electrically connected to the node A. The other of the source and the drain is electrically connected to a wiring VRES that can supply a potential that turns on the transistor M1. A gate of the transistor M3 is electrically connected to a wiring RES that can supply a reset signal.

The capacitance of the sensor element 518 varies, for example, when an object gets closer to the first electrode or the second electrode of the sensor element 518 (the node A) or when a gap between the first and second electrodes is changed. Thus, the sensing unit 510 can supply the sensing signal DATA in accordance with a change in the capacitance of the sensor element 518.

The wiring VRES and the wiring VPI can supply, for example, a ground potential. A wiring VPO and a wiring BR can supply, for example, a high power supply potential.

The wiring RES can supply a reset signal. The scan line G1 can supply a selection signal. The wiring CS can supply a control signal for controlling the potential of the second electrode (the potential of the node A) of the sensor element 518.

The signal line DL can supply the sensing signal DATA. A terminal OUT can supply a signal obtained by conversion based on the sensing signal DATA.

<<Converter CONV>>

The convertor CONV includes a conversion circuit. Any of various circuits that can convert the sensing signal DATA and supply a signal obtained by the conversion to the terminal OUT can be used for the converter CONV. The converter CONV may be electrically connected to the sensing circuit 519 to form a source follower circuit, a current mirror circuit, or the like, for example.

Specifically, a source follower circuit can be formed using the converter CONV including a transistor M4 (see FIG. 42B). Note that the transistor M4 may be formed in the same process as the transistors M1 to M3.

Any of the transistors described in the above embodiments can be used as the transistors M1 to M4. For example, a Group 4 element, a compound semiconductor, or an oxide semiconductor can be used for the semiconductor layer. Specifically, a silicon-containing semiconductor, a gallium arsenide-containing semiconductor, an indium-containing oxide semiconductor, or the like can be used.

The convertor CONV and a driver circuit GD may be provided on another substrate (e.g., a single-crystal semiconductor substrate or a polycrystalline semiconductor substrate) and electrically connected to the sensing unit 510 by a chip on glass (COG) method, a wire bonding method, or the like, or using an FPC or the like.

<Driving Method of Sensing Circuit 519>

The driving method of the sensing circuit 519 is described.

<<First Step>>

In a first step, after the transistor M3 is turned on, a reset signal for turning off the transistor M3 is supplied to the gate of the transistor M3, so that the potential of the node A is set to a predetermined potential (see Period T1 in FIG. 42D1).

Specifically, the reset signal is supplied to the gate of the transistor M3 via the wiring RES. The transistor M3 to which the reset signal is supplied sets the potential of the node A to a potential at which the transistor M1 is turned off, for example (see Period T1 in FIG. 42D1).

<<Second Step>>

In a second step, a selection signal for turning on the transistor M2 is supplied, so that the other of the source and the drain of the transistor M1 is electrically connected to the signal line DL.

Specifically, the selection signal is supplied to the gate of the transistor M2 via the scan line G1. The transistor M2 to which the selection signal is supplied makes the other of the source and the drain of the transistor M1 electrically connected to the signal line DL (see Period T2 in FIG. 42D1).

<<Third Step>>

In a third step, a control signal is supplied to the first electrode of the sensor element 518, and a control signal and the potential that varies depending on the electrostatic capacitance of the sensor element 518 are supplied to the gate of the transistor M1 via the node A.

Specifically, a rectangular control signal is supplied to the wiring CS. The sensor element 518 the first electrode of which is supplied with the rectangular control signal increases the potential of the node A in accordance with the electrostatic capacitance of the sensor element 518 (see the latter part of Period T2 in FIG. 42D1).

For example, when the sensor element 518 is placed in the air and an object having a higher dielectric constant than the air is placed in the proximity of the first electrode of the sensor element 518, the apparent electrostatic capacitance of the sensor element 518 is increased. In this case, a change in the potential of the node A caused by the rectangular control signal is smaller than that when an object having a higher dielectric constant than the air is not placed in the proximity of the first electrode of the sensor element 518 (see a solid line in FIG. 42D2).

<<Fourth Step>>

In a fourth step, a signal caused by a change in the potential of the gate of the transistor M1 is supplied to the signal line DL.

For example, a change in current caused by a change in the potential of the gate of the transistor M1 is supplied to the signal line DL.

The converter CONV converts a change in current flowing through the signal line DL into a voltage change and supplies the voltage change to the terminal OUT.

<<Fifth Step>>

In a fifth step, a selection signal for turning off the transistor M2 is supplied to the gate of the transistor M2.

Each of the scan lines G1(1) to G1(n) performs the first to fifth steps; thus, which region in the touch sensor 500 is selected can be sensed.

<Structure Example 2 of Positional Data Input Portion>

The touch sensor 500B illustrated in FIGS. 43A to 43D is different from the touch sensor 500 in that the touch sensor 500B includes the sensing unit 510B instead of the sensing unit 510.

The sensing unit 510B is different from the sensing unit 510 in the following points: the first electrode of the sensor element 518 in the sensing unit 510B is electrically connected to the scan line G1 while that in the sensing unit 510 is electrically connected to the wiring CS; and the other of the source and the drain of the transistor M1 in the sensing unit 510B is electrically connected to the signal line DL not via the transistor M2 while that in the sensing unit 510 is electrically connected to the signal line DL via the transistor M2. Here, different structures are described in detail, and the above description is referred to for the other similar structures.

The touch sensor 500B includes the sensing units 510B arranged in a matrix; scan lines G1 to which the sensing units 510B arranged in the row direction are electrically connected; and signal lines DL to which the sensing units 510B arranged in the column direction are electrically connected (see FIG. 43A).

For example, the sensing units 510B can be arranged in a matrix of n rows and m columns (each of n and m is a natural number greater than or equal to 1).

The sensing unit 510B includes the sensor element 518, and the first electrode of the sensor element 518 is electrically connected to the scan line G1. With this structure, a selected scan line G1 can control the potentials of the nodes A of the sensing units 510B to which the selected scan line G1 is electrically connected, by supplying the selection signal.

The signal line DL and the scan line G1 may be formed with the same conductive film.

The first electrode of the sensor element 518 and the scan line G1 may be formed with the same conductive film. For example, the first electrodes of the sensor elements 518 included in the sensing units 510B arranged in the row direction may be connected and the connected electrodes may be used as the scan line G1.

<<Sensor Circuit 519B>>

The sensor circuit 519B illustrated in FIG. 43C includes the transistor M1 and the transistor M3. A gate of the transistor M1 is electrically connected to the node A. One of a source and a drain of the transistor M1 is electrically connected to a wiring VPI that can supply the ground potential. The other of the source and the drain is electrically connected to the signal line DL that can supply the sensing signal DATA.

One of the source and the drain of the transistor M3 is electrically connected to the node A. The other of the source and the drain is electrically connected to the wiring VRES that can supply a potential that turns on the transistor M1. The gate of the transistor M3 is electrically connected to the wiring RES that can supply a reset signal.

The capacitance of the sensor element 518 varies, for example, when an object gets closer to the first electrode or the second electrode of the sensor element 518 (the node A) or when a gap between the first and second electrodes is changed. Thus, the sensing unit 510 can supply the sensing signal DATA in accordance with a change in the capacitance of the sensor element 518.

The wiring VRES and the wiring VPI can supply, for example, a ground potential. A wiring VPO and a wiring BR can supply, for example, a high power supply potential.

The wiring RES can supply the reset signal, and the scan line G1 can supply the selection signal.

The signal line DL can supply the sensing signal DATA. The terminal OUT can supply a signal obtained by conversion based on the sensing signal DATA.

<Driving Method of Sensing Circuit 519B>

The driving method of the sensing circuit 519B is described.

<<First Step>>

In a first step, after the transistor M3 is turned on, a reset signal for turning off the transistor M3 is supplied to the gate of the transistor M3, so that the potential of the first electrode of the sensor element 518 is set to a predetermined potential (see Period T1 in FIG. 43D).

Specifically, the reset signal is supplied via the wiring RES. The transistor M3 to which the reset signal is supplied sets the potential of the node A to a potential at which the transistor M1 is turned off, for example (see FIG. 43C).

<<Second Step>>

In a second step, a selection signal is supplied to the first electrode of the sensor element 518, and a selection signal and the potential that varies depending on the electrostatic capacitance of the sensor element 518 are supplied to the gate of the transistor M1 via the node A (see Period T2 in FIG. 43D).

Specifically, a rectangular selection signal is supplied to the scan line G1($i$-1). The sensor element 518 the first electrode of which is supplied with the rectangular selection signal increases the potential of the node A in accordance with the electrostatic capacitance of the sensor element 518.

For example, when the sensor element 518 is placed in the air and an object having a higher dielectric constant than the air is placed in the proximity of the first electrode of the sensor element 518, the apparent electrostatic capacitance of the sensor element 518 is increased. In this case, a change in the potential of the node A caused by the rectangular selection signal is smaller than that when an object having a higher dielectric constant than the air is not placed in the proximity of the first electrode of the sensor element 518.

<<Third Step>>

In a third step, a signal caused by a change in the potential of the gate of the transistor M1 is supplied to the signal line DL.

For example, a change in current caused by a change in the potential of the gate of the transistor M1 is supplied to the signal line DL.

The converter CONV converts a change in current flowing through the signal line DL into a voltage change and supplies the voltage change to the terminal OUT.

Each of the scan lines G1(1) to G1($n$) performs the first to third steps (see Periods T2 to T4 in FIG. 43D). In FIG. 43D, the scan line G1 in the i-th row (i is a natural number of 1 to n) is expressed as the scan line G1 ($i$). According to the above-described structural and operation examples, which region in the touch sensor 500B is selected can be sensed.

In the active matrix touch sensor, signal supply to the sensing unit 510 that is not needed for sensing can be stopped by a transistor. This can reduce interference to a selected sensing unit 510 by a non-selected sensing unit 510. Accordingly, the active matrix touch sensor can have high resistance to noise and high detection sensitivity.

Since the active matrix touch sensor can have high detection sensitivity, even when the sensing unit 510 or the sensor element 518 is reduced in size, a selected region can be detected with high accuracy. Therefore, in the active matrix touch sensor, the number of sensing units 510 per unit area (surface density) can be increased. Thus, the active matrix touch sensor can have high accuracy of detecting the position of a selected region.

The active matrix touch sensor can be a touch sensor of various sizes, for example, a hand-held touch sensor or a touch sensor that can be used in an electronic blackboard. In particular, the entire detection region in the active matrix touch sensor can be increased easily as compared with the other touch sensors. The use of the active matrix touch sensor enables a large-area touch sensor with high resolution.

Embodiment 7

In this embodiment, structure examples of a light-emitting element that can be used as the light-emitting element 125 are described. Note that an EL layer 320 described in this embodiment corresponds to the EL layer 117 described in the other embodiments.

<Structure of Light-Emitting Element>

Figure 44A:
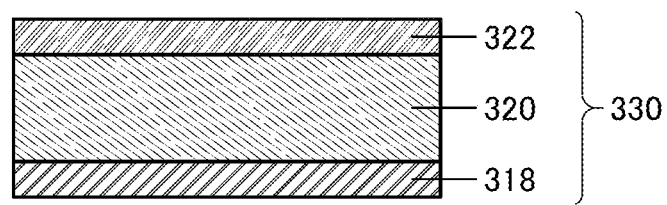
FIGS. 44A and 44B illustrate structure examples of light-emitting elements.

In a light-emitting element 330 illustrated in FIG. 44A, the EL layer 320 is sandwiched between a pair of electrodes (electrodes 318 and 322). The electrode 318, the electrode 322, and the EL layer 320 respectively correspond to the electrode 115, the electrode 118, and the EL layer 117 of the aforementioned Embodiments. Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron and hole transport properties), or the like can be used. Specifically, functional layers such as a hole-injection layer, a hole-transport layer, an electron-transport layer, and an electron-injection layer can be used in appropriate combination.

The light-emitting element 330 illustrated in FIG. 44A emits light when current flows by applying a potential difference between the electrode 318 and the electrode 322 and holes and electrons are recombined in the EL layer 320. In other words, a light-emitting region is formed in the EL layer 320.

In one embodiment of the present invention, light emitted from the light-emitting element 330 is extracted to the outside from the electrode 318 side or the electrode 322 side. Thus, one of the electrodes 318 and 322 is formed using a light-transmitting substance.

Figure 44B:
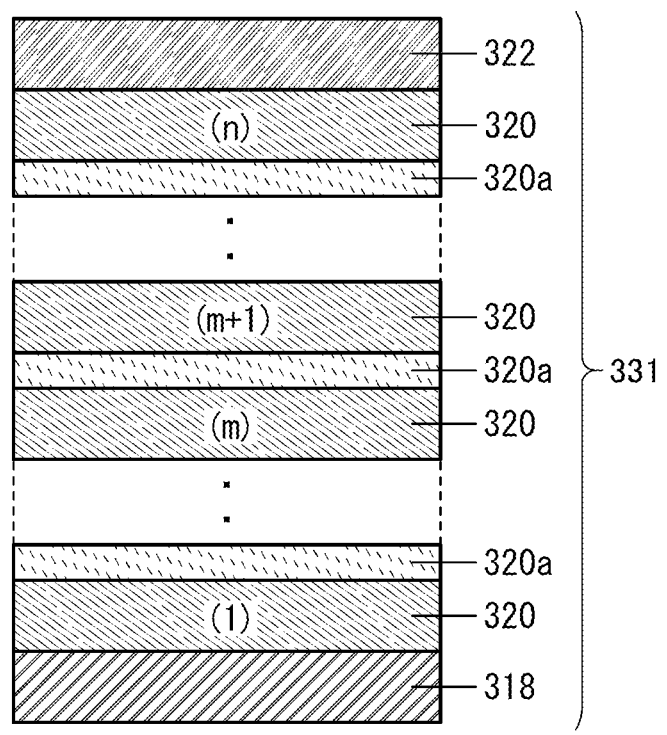

Note that a plurality of EL layers 320 may be stacked between the electrode 318 and the electrode 322 as in a light-emitting element 331 illustrated in FIG. 44B. In the case where n (n is a natural number of 2 or more) layers are stacked, an electric charge generation layer 320a is preferably provided between an m-th EL layer 320 and an (m+1)th EL layer 320. Note that m is a natural number greater than or equal to 1 and less than n. The components other than the electrode 318 and the electrode 322 correspond to the EL layer 117 of the aforementioned Embodiments.

The electric charge generation layer 320a can be formed using a composite material of an organic compound and a metal oxide. Examples of the metal oxide are vanadium oxide, molybdenum oxide, tungsten oxide, or the like. As the organic compound, a variety of compounds can be used; for example, an aromatic amine compound, a carbazole derivative, an aromatic hydrocarbon, and an oligomer, a dendrimer, and a polymer having a basic skeleton of these compounds can be used. Note that as the organic compound, it is preferable to use an organic compound that has a hole-transport property and has a hole mobility of $10^{-6}$ cm$^2$/Vs or higher. However, other substances may be used as long as their hole-transport properties are higher than their electron-transport properties. These materials used for the electric charge generation layer 320a have excellent carrier-injection properties and carrier-transport properties; thus, the light-emitting element 330 can be driven with low current and with low voltage. Other than the composite material, the metal oxide, a composite material of an organic compound and an alkali metal, an alkaline earth metal, or a compound of the alkali metal or the alkaline earth metal can be used in the electric charge generation layer 320a.

Note that the electric charge generation layer 320a may be formed by a combination of a composite material of an organic compound and a metal oxide with another material. For example, the electric charge generation layer 320a may be formed by a combination of a layer containing the composite material of an organic compound and a metal oxide with a layer containing one compound selected from electron-donating substances and a compound having a high electron-transport property. Furthermore, the electric charge generation layer 320a may be formed by a combination of a layer containing the composite material of an organic compound and a metal oxide with a transparent conductive film.

The light-emitting element 331 having such a structure is unlikely to result in energy transfer between the neighboring EL layer 320 and can easily realize high emission efficiency and a long lifetime. Furthermore, it is easy to obtain phosphorescence from one light-emitting layer and fluorescence from the other light-emitting layer.

The electric charge generation layer 320a has a function of injecting holes to one of the EL layers 320 that is in contact with the electric charge generation layer 320a and a function of injecting electrons to the other EL layer 320 that is in contact with the electric charge generation layer 320a, when voltage is applied to the electrodes 318 and 322.

The light-emitting element 331 illustrated in FIG. 44B can provide a variety of emission colors by changing the type of the light-emitting substance used for the EL layers 320. In addition, a plurality of light-emitting substances having different emission colors may be used as the light-emitting substances, so that light emission having a broad spectrum or white light emission can be obtained.

In the case of obtaining white light emission using the light-emitting element 331 in FIG. 44B, as for a combination of a plurality of EL layers, a structure for emitting white light including red light, blue light, and green light may be used. For example, the structure may include an EL layer containing a blue fluorescent substance as a light-emitting substance and an EL layer containing green and red phosphorescent substances as light-emitting substances. Alternatively, the structure may include an EL layer emitting red light, an EL layer emitting green light, and an EL emitting blue light. Further alternatively, with a structure including EL layers emitting light of complementary colors, white light emission can be obtained. In a stacked-layer element including two EL layers which emit lights with complementary colors, the combinations of colors are as follows: blue and yellow, blue-green and red, and the like.

Note that in the structure of the above stacked-layer element, by providing the electric charge generation layer between the stacked light-emitting layers, the element can give a high-luminance region at a low current density, and have a long lifetime.

This embodiment can be implemented in an appropriate combination with any of the structures described in the other embodiments.

Embodiment 8

In this embodiment, examples of an electronic device including the display device of one embodiment of the present invention are described with reference to drawings.

Specific examples of the electronic device that uses the display device of one embodiment of the present invention are as follows: display devices of televisions, monitors, and the like, lighting devices, desktop and laptop personal computers, word processors, image reproduction devices which reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, large game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Other examples are as follows: industrial equipment such as guide lights, traffic lights, conveyor belts, elevators, escalators, industrial robots, power storage systems, and power storage devices for leveling the amount of power supply and smart grid. In addition, moving objects and the like driven by electric motors using power from a power storage unit are also included in the category of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

In particular, as examples of electronic devices including the display device of one embodiment of the present invention, the following can be given: television devices (also referred to as televisions or television receivers), monitors of computers or the like, digital cameras, digital video cameras, digital photo frames, mobile phones (also referred to as cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 45A:
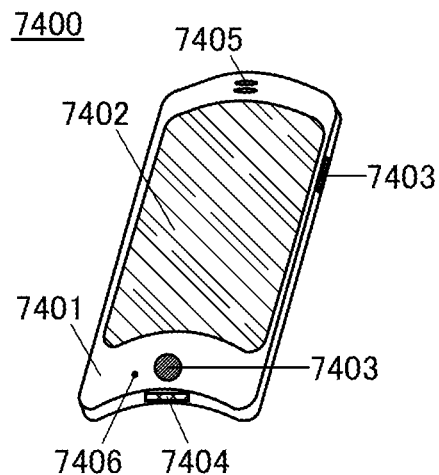
FIGS. 45A to 45F illustrate examples of electronic devices and lighting devices.

FIG. 45A is an example of a mobile phone (e.g., a smartphone). A mobile phone 7400 includes a display portion 7402 that is incorporated in a housing 7401. The mobile phone 7400 further includes operation buttons 7403, an external connection port 7404, a speaker 7405, a microphone 7406, and the like. The mobile phone 7400 is manufactured using the display device of one embodiment of the present invention for the display portion 7402.

The mobile phone 7400 illustrated in FIG. 45A includes a touch sensor in the display portion 7402. When the display portion 7402 is touched with a finger or the like, data can be input into the mobile phone 7400. Furthermore, operations such as making a call and inputting a letter can be performed by touch on the display portion 7402 with a finger or the like.

With the operation buttons 7403, power ON/OFF can be switched. In addition, types of images displayed on the display portion 7402 can be switched; for example, switching images from a mail creation screen to a main menu screen.

Here, the display portion 7402 includes the display device of one embodiment of the present invention. Thus, the mobile phone can have a curved display portion and high reliability.

Figure 45B:
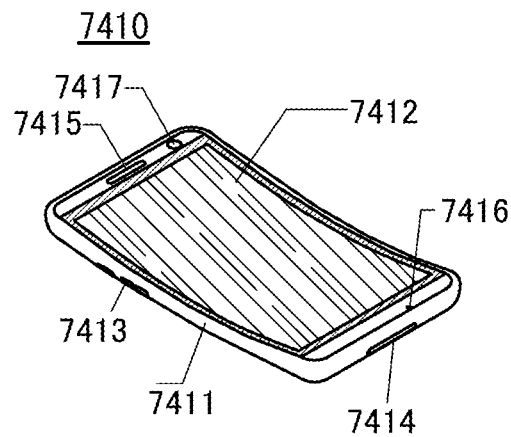

FIG. 45B illustrates an example of a mobile phone (e.g., smartphone). A mobile phone 7410 includes a housing 7411 provided with a display portion 7412, a microphone 7416, a speaker 7415, a camera 7417, an external connection portion 7414, an operation button 7413, and the like. In the case where a display device of one embodiment of the present invention is manufactured using a flexible substrate, the display device can be used for the display portion 7412 with a curved surface.

When the display portion 7412 of the cellular phone 7410 illustrated in FIG. 45B is touched with a finger or the like, data can be input to the cellular phone 7410. Operations such as making a call and creating an e-mail can be performed by touching the display portion 7412 with a finger or the like.

There are mainly three screen modes of the display portion 7412. The first mode is a display mode mainly for displaying an image. The second mode is an input mode mainly for inputting data such as characters. The third mode is a display-and-input mode in which two modes of the display mode and the input mode are combined.

For example, in the case of making a call or creating e-mail, a character input mode mainly for inputting characters is selected for the display portion 7412 so that characters displayed on the screen can be input. In this case, it is preferable to display a keyboard or number buttons on almost the entire screen of the display portion 7412.

The screen modes can be switched depending on the kind of images displayed on the display portion 7412. For example, when a signal of an image displayed on the display portion is a signal of moving image data, the screen mode may be switched to the display mode. When the signal is a signal of text data, the screen mode may be switched to the input mode.

In the input mode, if a touch sensor in the display portion 7412 judges that the input by touch on the display portion 7412 is not performed for a certain period, the screen mode may be switched from the input mode to the display mode.

When a detection device including a sensor (e.g., a gyroscope or an acceleration sensor) is provided inside the mobile phone 7410, the direction of display on the screen of the display portion 7412 can be automatically changed by determining the orientation of the mobile phone 7410 (whether the mobile phone is placed horizontally or vertically). Furthermore, the direction of display on the screen can be changed by touch on the display portion 7412 or operation with the operation button 7413 of the housing 7411.

Figure 45C:
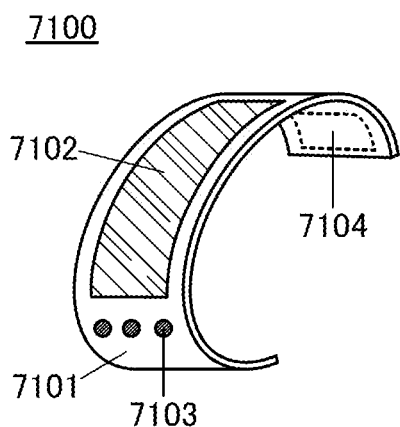

FIG. 45C is an example of a wristband-type display device. A portable display device 7100 includes a housing 7101, a display portion 7102, operation buttons 7103, and a transceiver 7104.

The portable display device 7100 can receive a video signal with the transceiver 7104 and can display the received video on the display portion 7102. In addition, with the transceiver 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

Figure 45D:
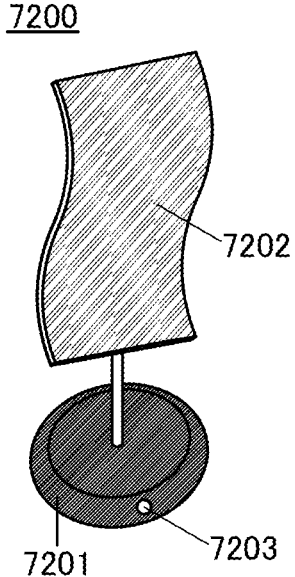
Figure 45E:
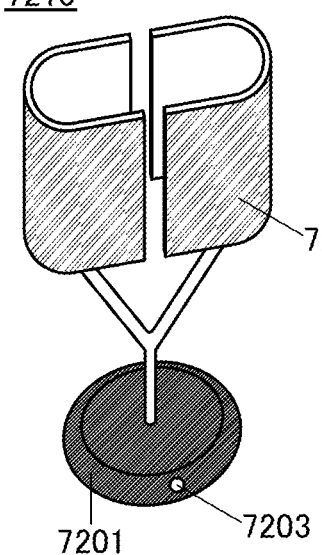
Figure 45F:
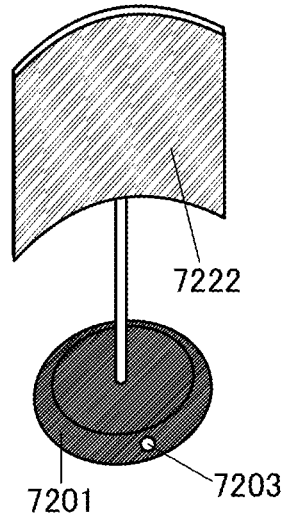

FIGS. 45D to 45F show examples of lighting devices. Lighting devices 7200, 7210, and 7220 each include a stage 7201 provided with an operation switch 7203 and a light-emitting portion supported by the stage 7201.

The lighting device 7200 illustrated in FIG. 45D includes a light-emitting portion 7202 with a wave-shaped light-emitting surface and thus is a good-design lighting device.

A light-emitting portion 7212 included in the lighting device 7210 illustrated in FIG. 45E has two convex-curved light-emitting portions symmetrically placed. Thus, light radiates from the lighting device 7210 in all directions.

The lighting device 7220 illustrated in FIG. 45F includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion can be fixed on a plastic member, a movable frame, or the like so that an emission surface of the light-emitting portion can be curved freely depending on the intended use.

The light-emitting portions included in the lighting devices 7200, 7210, and 7220 each include the display device of one embodiment of the present invention. Thus, the light-emitting portions can be curved or bent into any shape and the lighting devices can have high reliability.

Figure 46A:
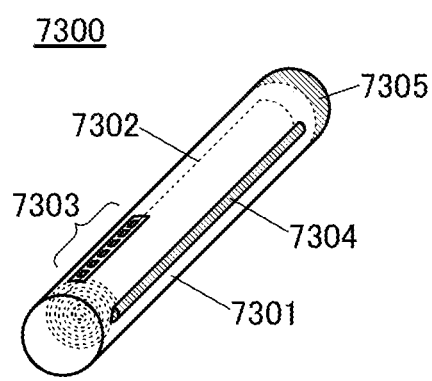
FIGS. 46A and 46B illustrate an example of an electronic device.

FIG. 46A shows an example of a portable display device. A display device 7300 includes a housing 7301, a display portion 7302, operation buttons 7303, a display portion pull 7304, and a control portion 7305.

The display device 7300 includes the rolled flexible display portion 7302 in the cylindrical housing 7301.

The display device 7300 can receive a video signal with the control portion 7305 and can display the received video on the display portion 7302. In addition, a power storage device is included in the control portion 7305. Moreover, a connector may be included in the control portion 7305 so that a video signal or power can be supplied directly.

With the operation buttons 7303, power ON/OFF, switching of displayed videos, and the like can be performed.

Figure 46B:
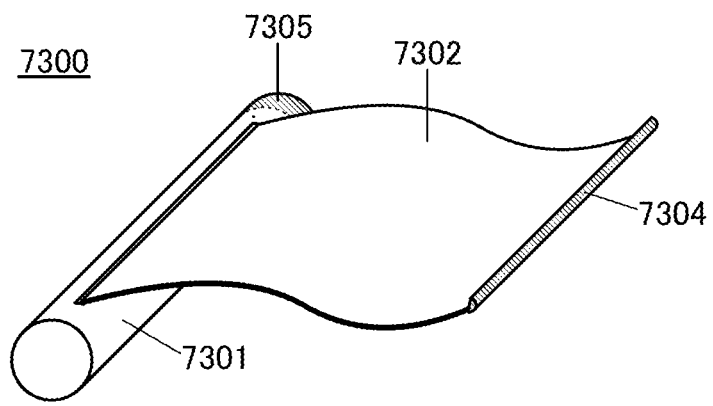

FIG. 46B illustrates a state where the display portion 7302 is pulled out with the display portion pull 7304. Videos can be displayed on the display portion 7302 in this state. Furthermore, the operation buttons 7303 on the surface of the housing 7301 allow one-handed operation.

Note that a reinforcement frame may be provided for an edge of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a display device which is flexible and highly reliable, which makes the display device 7300 lightweight and highly reliable.

Figure 47A:
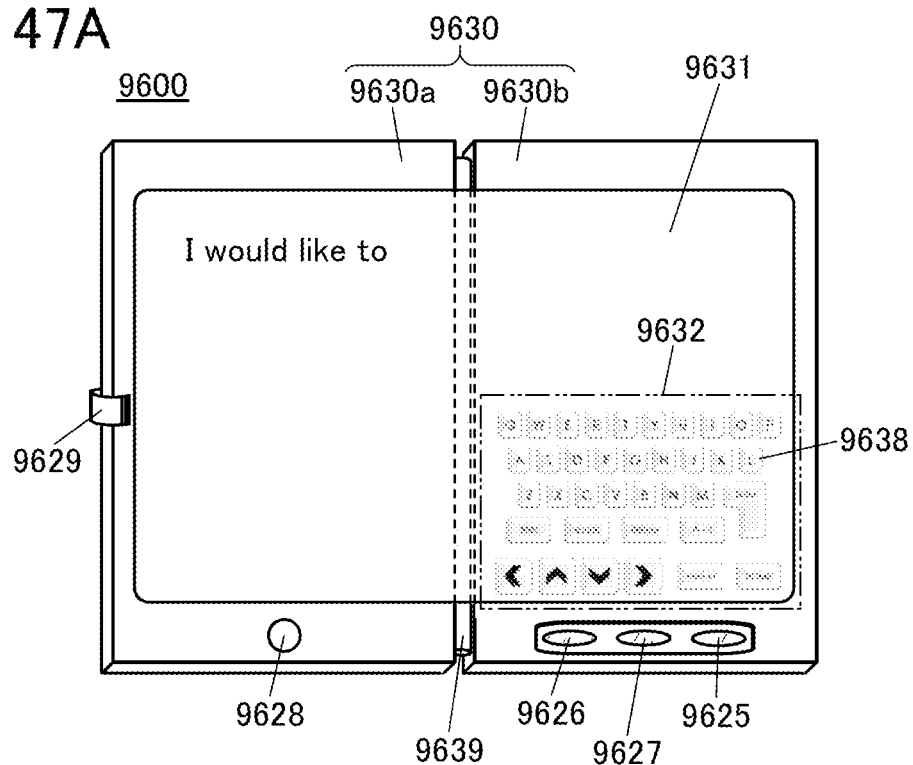
FIGS. 47A to 47C illustrate an example of an electronic device.
Figure 47B:
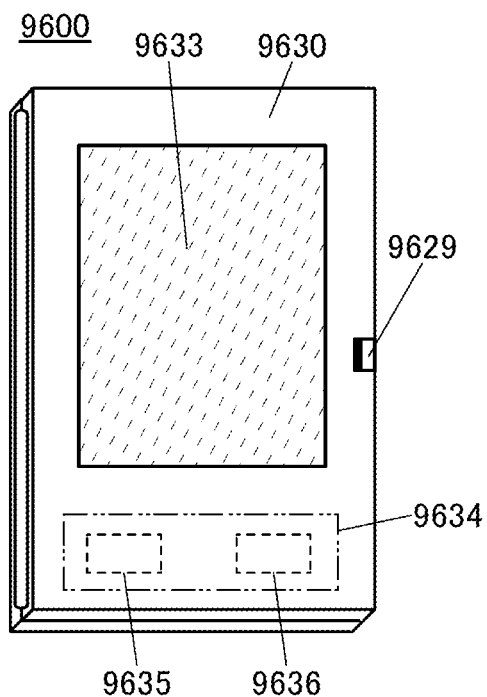

FIGS. 47A and 47B show a double foldable tablet terminal 9600 as an example. FIG. 47A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630a and a housing 9630b, which are connected with a hinge portion 9639. The hinge portion 9639 makes the housing 9630 double foldable.

The display portion 9631 is provided on the housing 9630a, the housing 9630b, and the hinge portion 9639. By the use of the display device disclosed in this specification and the like for the display portion 9631, the tablet terminal in which the display portion 9631 is foldable and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between a portrait mode and a landscape mode, and between monochrome display and color display, for example. The power-saving mode switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 47B illustrates the tablet terminal 9600 which is folded. The tablet terminal 9600 includes the housing 9630, a solar cell 9633, and a charge and discharge control circuit 9634. As an example, FIG. 47B illustrates the charge and discharge control circuit 9634 including a battery 9635 and a DC-to-DC converter 9636.

By including the display device of one embodiment of the present invention, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 47A and 47B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on one or both surfaces of the housing 9630, in which case the battery 9635 can be charged efficiently. When a lithium ion battery is used as the battery 9635, there is an advantage of downsizing or the like.

Figure 47C:
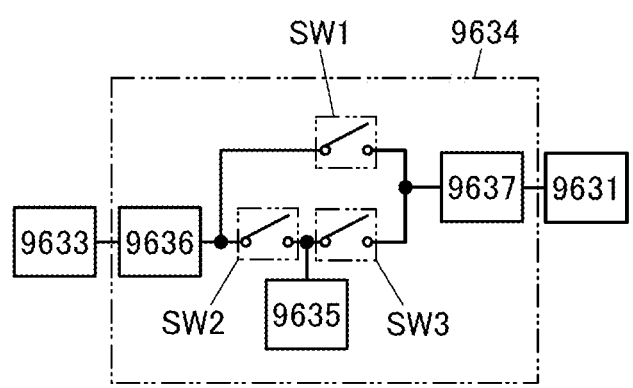

The structure and operation of the charge and discharge control circuit 9634 illustrated in FIG. 47B is described with reference to a block diagram of FIG. 47C. FIG. 47C illustrates the solar cell 9633, the battery 9635, the DC-to-DC converter 9636, a converter 9637, switches SW1 to SW3, and the display portion 9631. The battery 9635, the DC-to-DC converter 9636, the converter 9637, and the switches SW1 to SW3 correspond to the charge and discharge control circuit 9634 illustrated in FIG. 47B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged using a non-contact power transmission module that transmits and receives power wirelessly (without contact) or using another charge unit in combination.

It is needless to say that one embodiment of the present invention is not limited to the above-described electronic devices and lighting devices as long as the display device of one embodiment of the present invention is included.

Figure 48A:
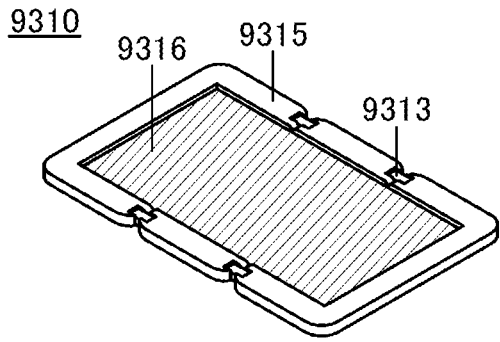
FIGS. 48A to 48I illustrate examples of electronic devices.
Figure 48B:
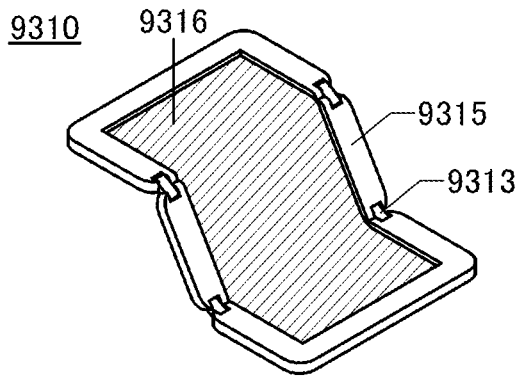
Figure 48C:
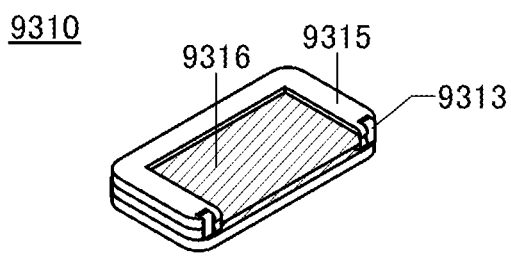

FIGS. 48A to 48C illustrate a foldable portable information terminal 9310 as an example of an electronic device. FIG. 48A illustrates the portable information terminal 9310 that is opened. FIG. 48B illustrates the portable information terminal 9310 that is being opened or being folded. FIG. 48C illustrates the portable information terminal 9310 that is folded. The portable information terminal 9310 includes a display panel 9316, housings 9315, and hinges 9313. The portable information terminal 9310 is highly portable when folded. When the portable information terminal 9310 is opened, a seamless large display region is obtained; thus, the display image is highly browsable.

The display panel 9316 included in the portable information terminal 9310 is supported by the three housings 9315 joined together by the hinges 9313. The display panel 9316 can be folded at the hinges 9313. The portable information terminal 9310 can be reversibly changed in shape from an opened state to a folded state. The display device of one embodiment of the present invention can be used for the display panel 9316. For example, a display device that can be bent with a radius of curvature of greater than or equal to 1 mm and less than or equal to 150 mm can be used. The display panel 9316 may include a touch sensor.

Note that in one embodiment of the present invention, a sensor that senses whether the display panel 9316 is in a folded state or an unfolded state may be used. The operation of a folded portion (or a portion that becomes invisible by a user by folding) of the display panel 9316 may be stopped by a control device through the acquisition of data indicating the folded state of the touch panel. Specifically, display of the portion may be stopped. In the case where a touch sensor is included, detection by the touch sensor may be stopped.

Similarly, the control device of the display panel 9316 may acquire data indicating the unfolded state of the display panel 9316 to resume displaying and sensing by the touch sensor.

Figure 48D:
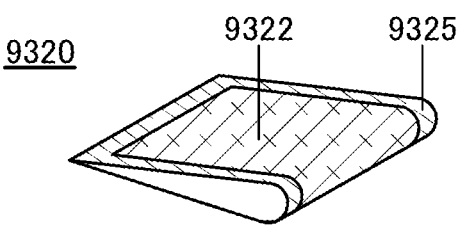
Figure 48E:
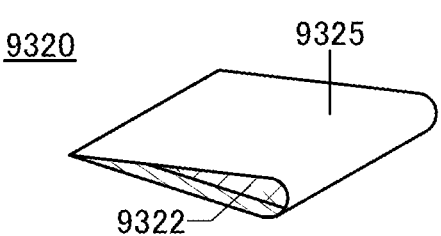

FIGS. 48D and 48E each illustrate a foldable portable information terminal 9320. FIG. 48D illustrates the portable information terminal 9320 that is folded so that a display portion 9322 is on the outside. FIG. 48E illustrates the portable information terminal 9320 that is folded so that the display portion 9322 is on the inside. When the portable information terminal 9320 is not used, the portable information terminal 9320 is folded so that a non-display portion 9325 faces the outside, whereby the display portion 9322 can be prevented from being contaminated or damaged. The display device of one embodiment of the present invention can be used for the display portion 9322.

Figure 48F:
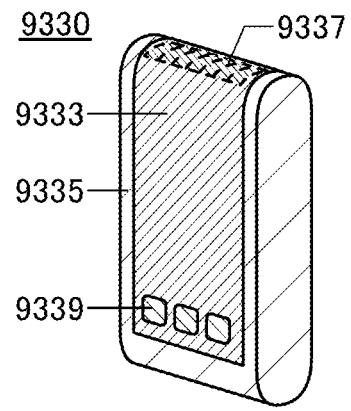
Figure 48G:
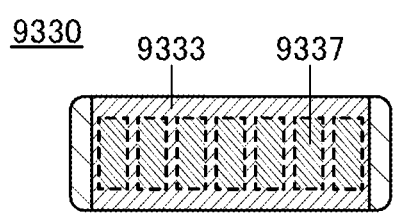
Figure 48H:
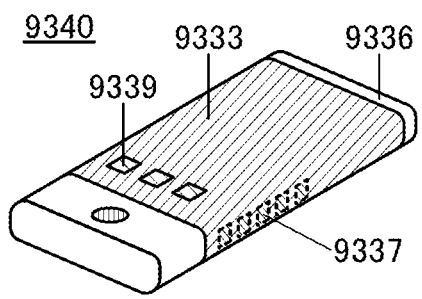

FIG. 48F is a perspective view illustrating an external shape of a portable information terminal 9330. FIG. 48G is a top view of the portable information terminal 9330. FIG. 48H is a perspective view illustrating an external shape of a portable information terminal 9340.

The portable information terminals 9330 and 9340 each function as, for example, one or more of a telephone set, a notebook, and an information browsing system. Specifically, the portable information terminals 9330 and 9340 each can be used as a smartphone.

The portable information terminals 9330 and 9340 can display characters and image information on their plurality of surfaces. For example, one or more operation buttons 9339 can be displayed on the front surface (FIG. 48F). In addition, information 9337 indicated by dashed rectangles can be displayed on the top surface (FIG. 48G) or on the side surface (FIG. 48H). Examples of the information 9337 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 9339, an icon, or the like may be displayed in place of the information 9337. Although FIGS. 48F and 48G illustrate an example in which the information 9337 is displayed at the top and side surfaces, one embodiment of the present invention is not limited thereto. The information 9337 may be displayed, for example, on the bottom or rear surface.

For example, a user of the portable information terminal 9330 can see the display (here, the information 9337) with the portable information terminal 9330 put in a breast pocket of his/her clothes.

Specifically, a caller's phone number, name, or the like of an incoming call is displayed on the front surface of the portable information terminal 9330. Thus, the user can see the display without taking out the portable information terminal 9330 from the pocket and decide whether to answer the call.

The display device of one embodiment of the present invention can be used for a display portion 9333 mounted in each of a housing 9335 of the portable information terminal 9330 and a housing 9336 of the portable information terminal 9340. One embodiment of the present invention can provide a highly reliable display device having a curved display portion with a high yield.

Figure 48I:
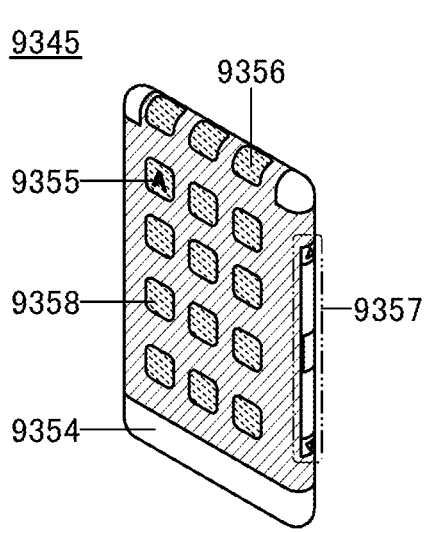

As in a portable information terminal 9345 illustrated in FIG. 48I, data may be displayed on three or more surfaces. Here, data 9355, data 9356, and data 9357 are displayed on different surfaces.

The display device of one embodiment of the present invention can be used for a display portion 9358 included in a housing 9354 of the portable information terminal 9345.

One embodiment of the present invention can provide a highly reliable display device having a curved display portion with a high yield.

Figure 49A:
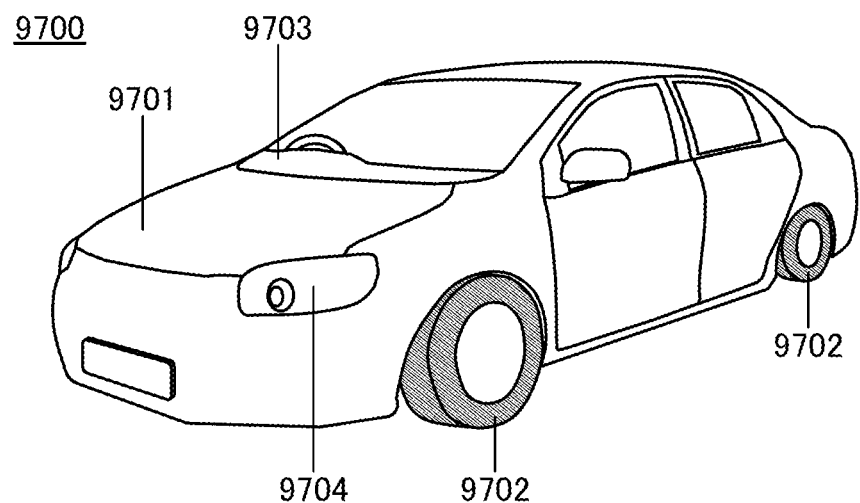
FIGS. 49A and 49B illustrate an example of an electronic device.
Figure 49B:
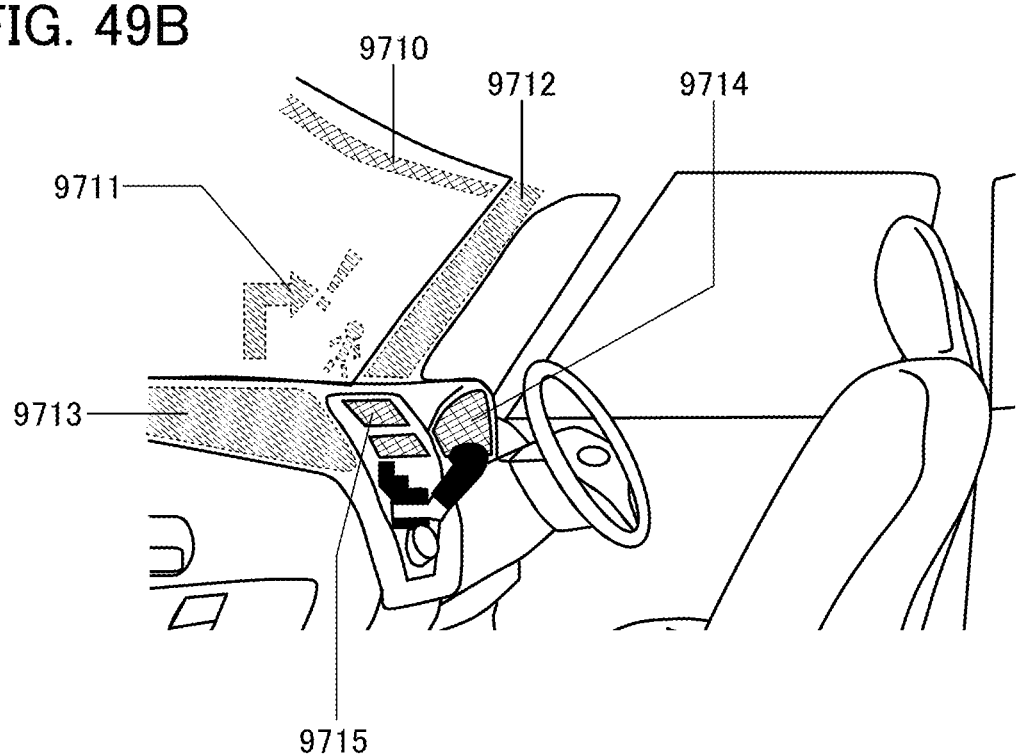

FIG. 49A illustrates an automobile 9700. FIG. 49B illustrates a driver's seat of the automobile 9700. The automobile 9700 includes a car body 9701, wheels 9702, a dashboard 9703, lights 9704, and the like. The display device of one embodiment of the present invention can be used in a display portion or the like of the automobile 9700. For example, the display device of one embodiment of the present invention can be used in display portions 9710 to 9715 illustrated in FIG. 49B.

The display portion 9710 and the display portion 9711 are provided in an automobile windshield. The display device of one embodiment of the present invention can be a see-through display device, through which the opposite side can be seen, by using a light-transmitting conductive material for its electrodes. Such a see-through display device does not hinder driver's vision during driving the automobile 9700. Therefore, the display device of one embodiment of the present invention can be provided in the windshield of the automobile 9700. Note that in the case where a transistor or the like for driving the display device is provided in the display device, a transistor having light-transmitting properties, such as an organic transistor using an organic semiconductor material or a transistor using an oxide semiconductor, is preferably used.

The display portion 9712 is provided on a pillar portion. For example, an image taken by an imaging unit provided in the car body is displayed on the display portion 9712, whereby the view hindered by the pillar portion can be compensated. The display portion 9713 is provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

The display portion 9714 and the display portion 9715 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713. The display portions 9710 to 9715 can also be used as lighting devices.

This embodiment can be implemented in an appropriate combination with any of the structures described in the other embodiments.

This application is based on Japanese Patent Application serial no. 2014-091849 filed with Japan Patent Office on Apr. 25, 2014 and Japanese Patent Application serial no. 2014-095018 filed with Japan Patent Office on May 2, 2014, the entire contents of which are hereby incorporated by reference.

What is claimed is:

1. A display device comprising:
   a first substrate;
   a first insulating layer over the first substrate;
   a transistor over the first insulating layer;
   a first electrode configured to supply a first signal to the transistor;
   a display element electrically connected to the transistor;
   a second insulating layer over the display element;
   a touch sensor over the second insulating layer;
   a second electrode configured to supply a second signal to the touch sensor;
   a second substrate overlapping with the first substrate; and
   an external electrode under the first substrate,
   wherein the first electrode is electrically connected to the external electrode through an opening,
   wherein the second electrode is electrically connected to the external electrode through the opening,
   wherein the opening is provided in the first substrate, the first insulating layer, and the second insulating layer, and
   wherein the transistor comprises an oxide semiconductor material in a channel formation region.

2. The display device according to claim 1, wherein the display element is an organic electroluminescent element.

3. The display device according to claim 1, wherein at least one of the first substrate and the second substrate is a flexible substrate.

4. The display device according to claim 1, further comprising an anisotropic conductive layer between the first electrode and the external electrode.

5. The display device according to claim 1, wherein the touch sensor is a capacitive touch sensor.

6. The display device according to claim 1, wherein the touch sensor is an active matrix touch sensor.

7. An electronic device comprising:
   the display device according to claim 1; and
   a hinge.

8. A display device comprising:
   a first substrate;
   a first insulating layer over the first substrate;
   a transistor over the first insulating layer;
   a first electrode configured to supply a first signal to the transistor;
   a display element electrically connected to the transistor;
   a second insulating layer over the display element;
   a touch sensor over the second insulating layer;
   a second electrode configured to supply a second signal to the touch sensor;
   a second substrate over the touch sensor and the second electrode;
   a first external electrode under the first substrate; and
   a second external electrode under the first substrate,
   wherein the first electrode is electrically connected to the first external electrode through a first opening in the first substrate and the first insulating layer,
   wherein the second electrode is electrically connected to the second external electrode through a second opening in the first substrate, the first insulating layer, and the second insulating layer, and
   wherein the transistor comprises an oxide semiconductor material in a channel formation region.

9. The display device according to claim 8, wherein the display element is an organic electroluminescent element.

10. The display device according to claim 8, wherein at least one of the first substrate and the second substrate is a flexible substrate.

11. The display device according to claim 8, further comprising an anisotropic conductive layer between the first electrode and the first external electrode.

12. The display device according to claim 8, wherein the touch sensor is a capacitive touch sensor.

13. The display device according to claim 8, wherein the touch sensor is an active matrix touch sensor.

14. An electronic device comprising:
the display device according to claim 8; and
a hinge.

\* \* \* \* \*